(12) United States Patent
Weyers et al.

(10) Patent No.: US 8,742,539 B2
(45) Date of Patent: Jun. 3, 2014

(54) SEMICONDUCTOR COMPONENT AND METHOD FOR PRODUCING A SEMICONDUCTOR COMPONENT

(75) Inventors: Joachim Weyers, Hoehenkirchen (DE); Kevni Bueyuektas, Muønchen (DE); Franz Hirler, Isen (DE); Anton Mauder, Kolbermoor (DE)

(73) Assignee: Infineon Technologies Austria AG, Villach (AU)

( * ) Notice: Subject to any disclaimer, the term of this patent is extended or adjusted under 35 U.S.C. 154(b) by 0 days.

(21) Appl. No.: 13/560,626

(22) Filed: Jul. 27, 2012

(65) Prior Publication Data
US 2014/0027879 A1   Jan. 30, 2014

(51) Int. Cl.
*H01L 29/86* (2006.01)

(52) U.S. Cl.
USPC .................... 257/531; 257/E21.022; 438/381

(58) Field of Classification Search
USPC .......... 257/379, 516, 531, E21.022; 438/381, 438/FOR. 220
See application file for complete search history.

(56) References Cited

U.S. PATENT DOCUMENTS

| | | | | |
|---|---|---|---|---|
| 5,372,967 A * | 12/1994 | Sundaram et al. | ............ | 438/381 |
| 6,008,102 A * | 12/1999 | Alford et al. | .................. | 438/381 |
| 6,031,445 A * | 2/2000 | Marty et al. | .................. | 336/200 |
| 6,194,750 B1 * | 2/2001 | Carroll et al. | ................. | 257/275 |
| 6,281,778 B1 * | 8/2001 | El-Sharawy et al. | ......... | 336/200 |
| 6,291,872 B1 * | 9/2001 | Wang et al. | .................... | 257/531 |
| 6,614,093 B2 * | 9/2003 | Ott et al. | ....................... | 257/531 |
| 6,800,533 B1 * | 10/2004 | Tan et al. | ...................... | 438/381 |
| 6,803,848 B2 * | 10/2004 | Yeo et al. | ...................... | 336/200 |
| 6,930,584 B2 * | 8/2005 | Edo et al. | ....................... | 336/200 |
| 7,384,801 B2 * | 6/2008 | Bhatt et al. | ......................... | 438/3 |
| 7,417,525 B2 * | 8/2008 | Lee et al. | ...................... | 336/200 |
| 8,072,042 B1 | 12/2011 | Kroener | | |
| 8,344,478 B2 * | 1/2013 | Ellul et al. | ..................... | 257/531 |
| 2003/0013264 A1* | 1/2003 | Yeo et al. | ...................... | 438/381 |
| 2007/0069397 A1* | 3/2007 | Van Lerberghe et al. | ..... | 257/784 |
| 2013/0071983 A1* | 3/2013 | Ellul et al. | .................... | 438/381 |

* cited by examiner

*Primary Examiner* — George Fourson, III
(74) *Attorney, Agent, or Firm* — Murphy, Bilak & Homiller, PLLC

(57) ABSTRACT

One aspect of the invention relates to a semiconductor component with a semiconductor body with a top side and with a bottom side. A first coil that is monolithically integrated with the semiconductor body is arranged distant from the bottom side and comprises N first windings, wherein N≥1. The first coil has a first coil axis that extends in a direction different from a surface normal of the bottom side.

27 Claims, 42 Drawing Sheets

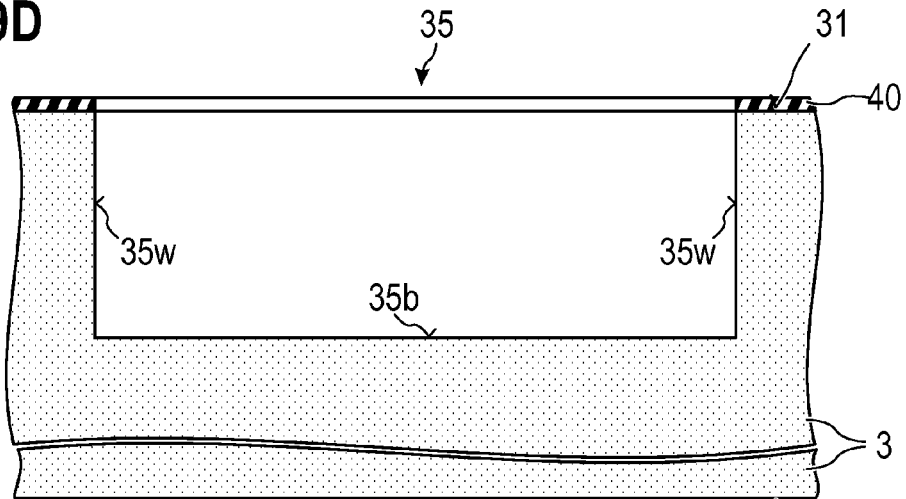
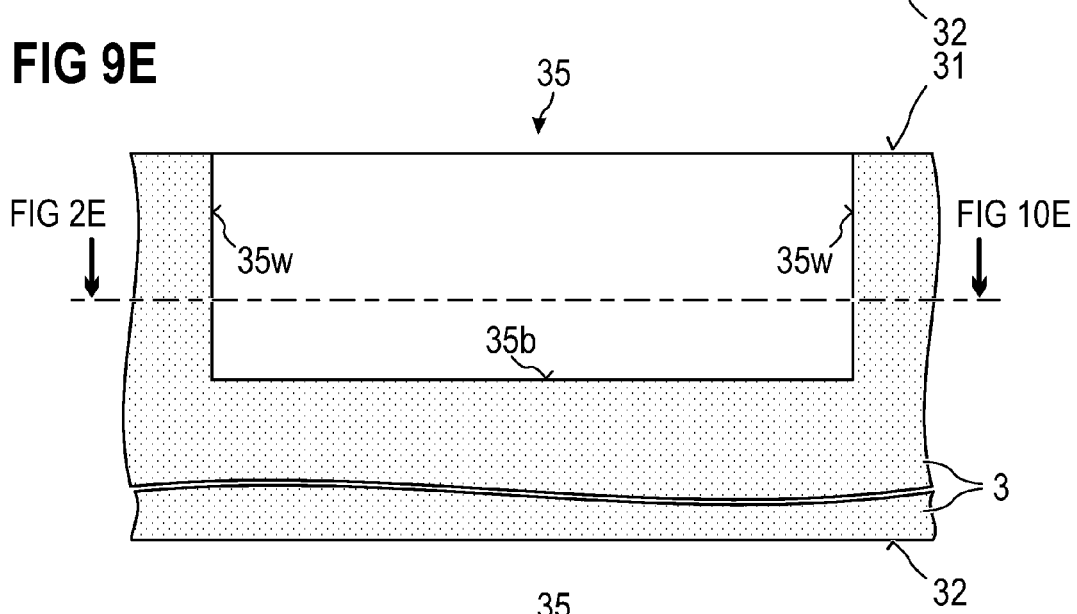
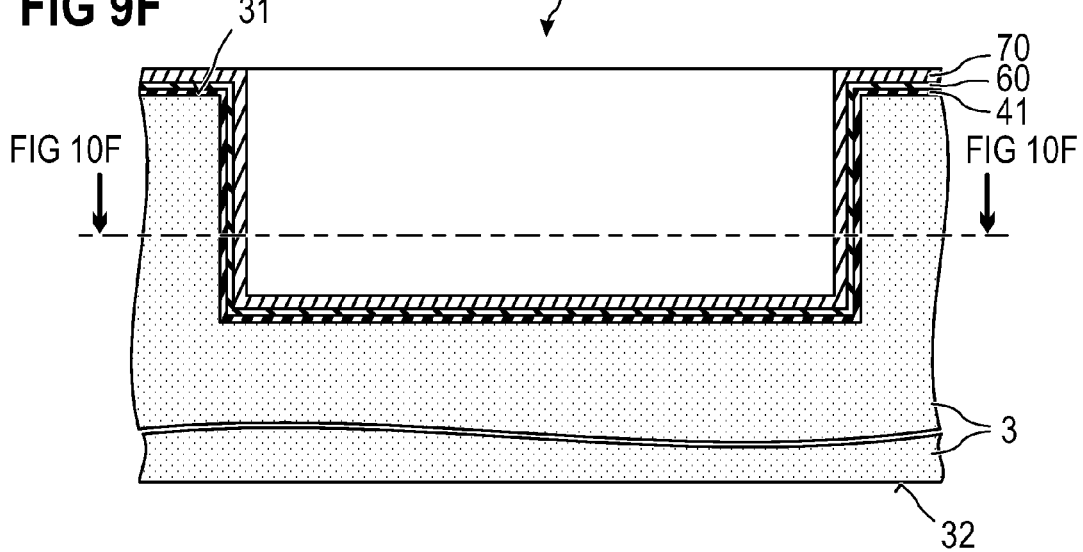

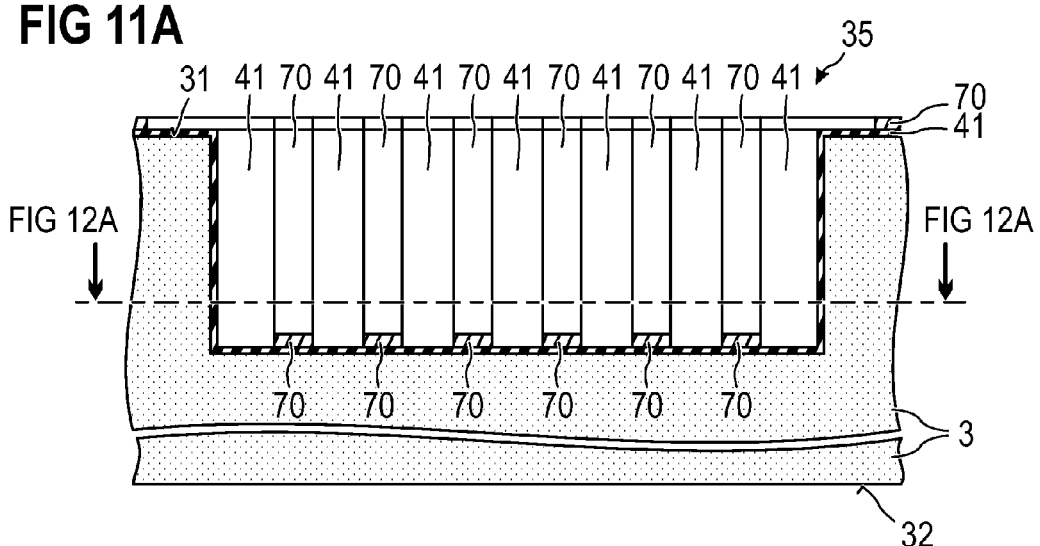
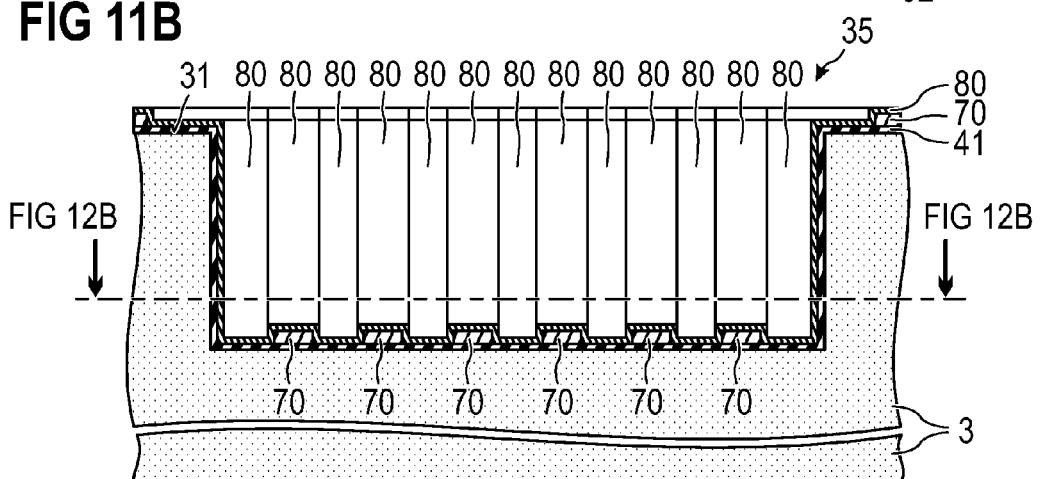
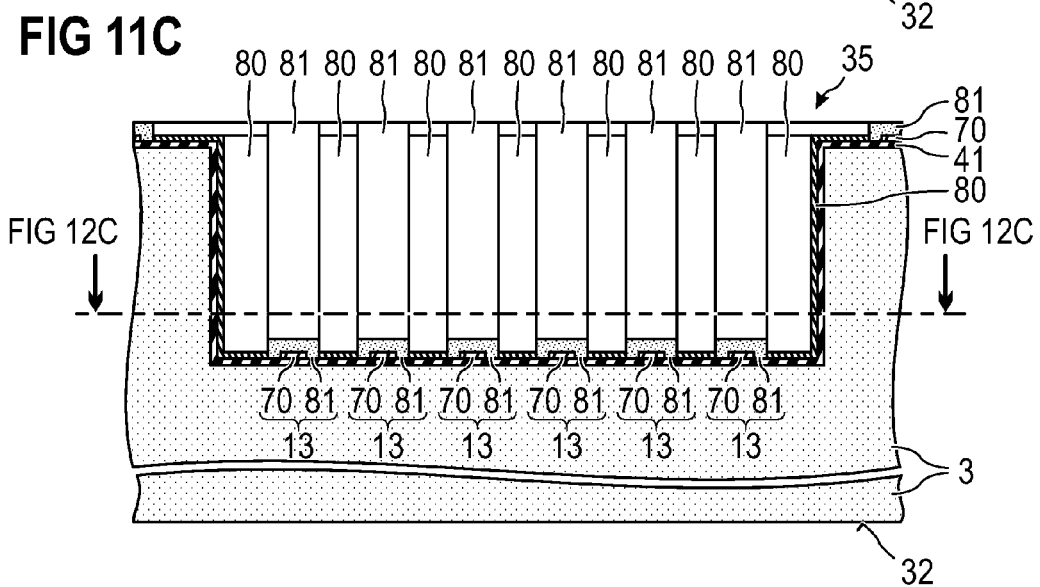

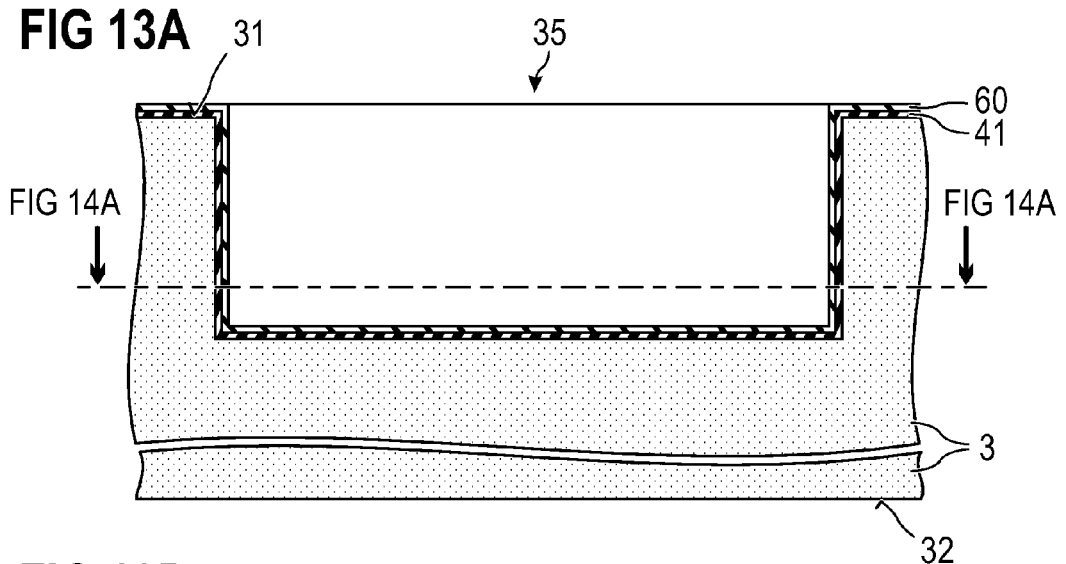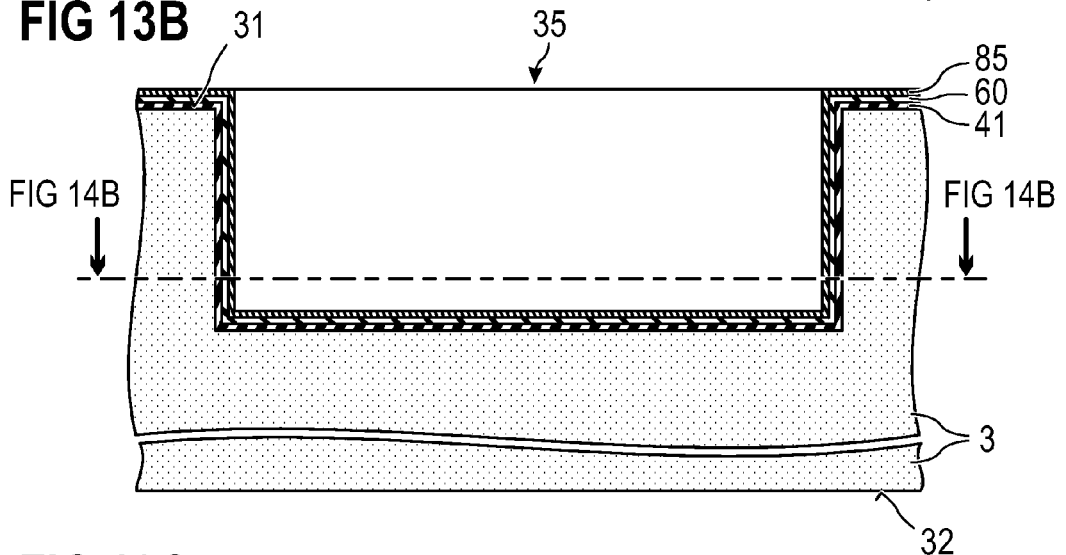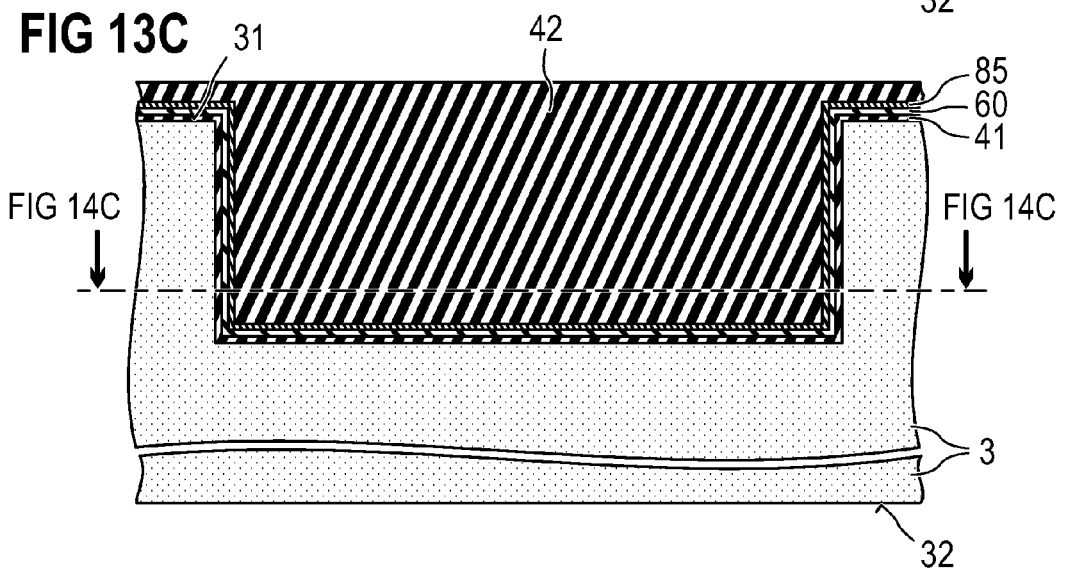

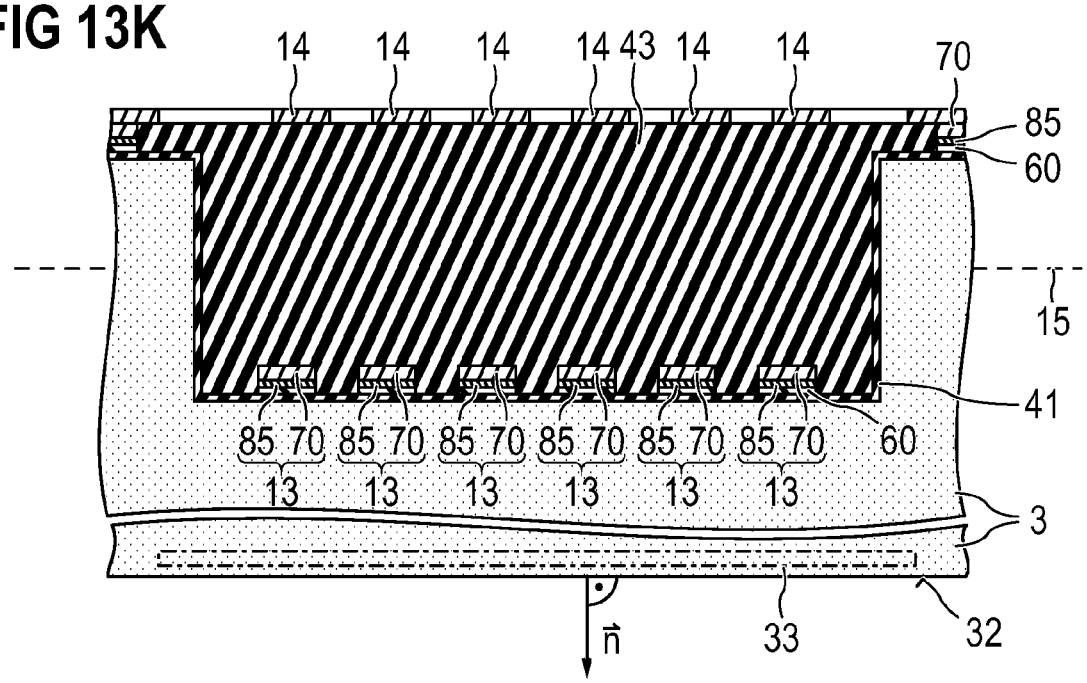

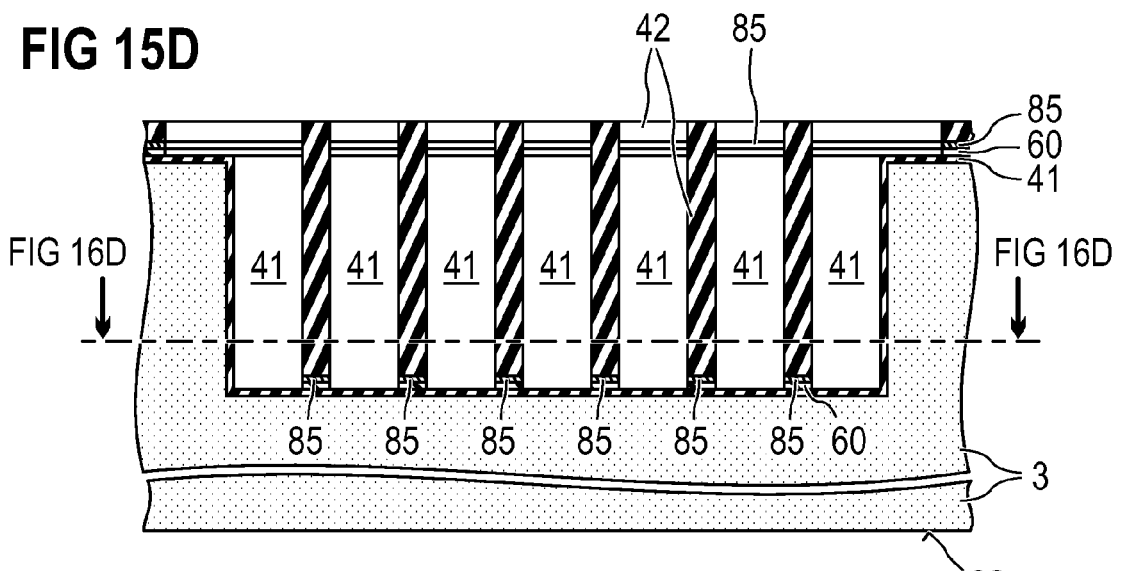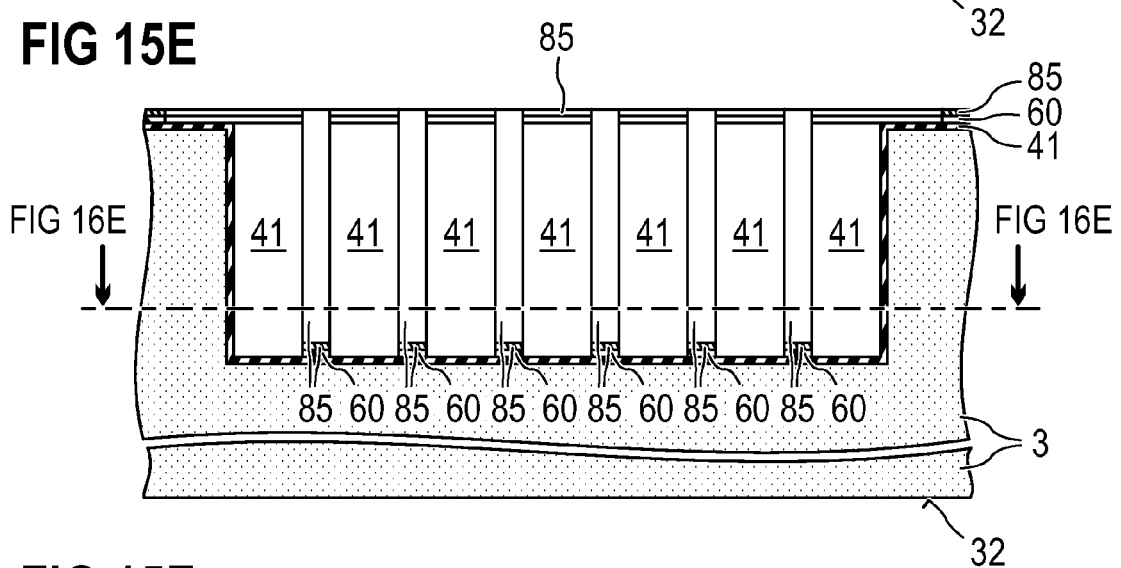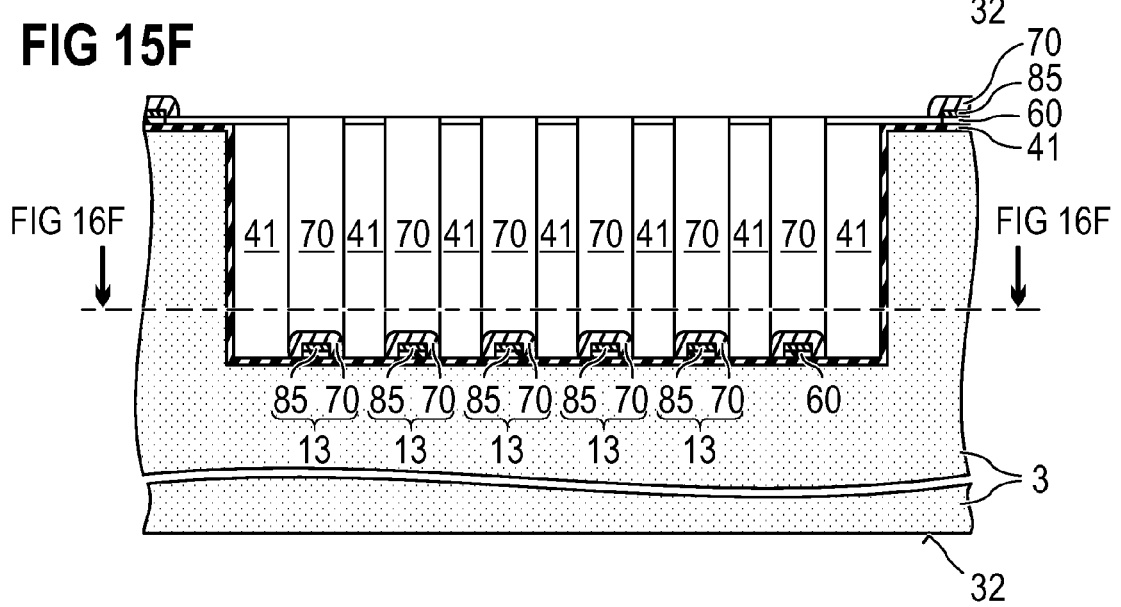

SEMICONDUCTOR COMPONENT AND METHOD FOR PRODUCING A SEMICONDUCTOR COMPONENT

TECHNICAL FIELD

Embodiments of the invention relate to semiconductor components and the production thereof.

BACKGROUND

Semiconductor components are often operated together with coils. However, extra handling like mounting the coil on a carrier is required. If the coil is to be electrically connected to the semiconductor component, the respective connection lines may cause electromagnetic interference. Hence, there is a need for an improved solution.

SUMMARY

One aspect of the invention relates to a semiconductor component with a semiconductor body with a top side and with a bottom side. In all embodiments of the present invention, the top side and the bottom side may be selected to be the sides of the semiconductor body that have the largest areas. A first coil that is monolithically integrated with the semiconductor body is arranged distant from the bottom side and comprises N first windings, wherein N≥1. For instance, N may be at least 2, or at least 5. The first coil has a first coil axis that extends in a direction different from a surface normal of the bottom side. In the sense of the present invention, a coil is regarded as monolithically integrated with a semiconductor body if the coil is mechanically joined to the semiconductor body and at least partly arranged in a trench formed in the semiconductor body.

Two, more than two, or all windings of the first coil may have the same size and/or shape. Further, the first coil may have a first coil axis that does not run perpendicularly to the bottom side. Optionally, such a first coil axis may run parallel to the bottom side.

A further aspect of the invention relates to a method for producing a semiconductor component with a coil that is monolithically integrated with a semiconductor body. To this, a semiconductor body with a top side and with a bottom side is provided and a first trench that extends from the top side into the semiconductor body is produced. Then, an electrically conductive first partial winding arranged on a surface of the first trench and an electrically conductive second partial winding arranged on the surface of the first trench are produced simultaneously. Thereby, the first partial winding is electrically insulated from the second partial winding. Each of the first and second partial windings includes two top ends. Also produced is a connection section that is arranged on the top side and that electrically conductively connects one of the first ends of the first partial winding and one of the first ends of the second partial winding.

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings:

FIGS. 9A to 9H, 9J to 9N, and 9P are cross-sectional views of different steps of a first method for producing a semiconductor component with a monolithically integrated coil.

FIGS. 11A to 11E are cross-sectional views of different steps of a second method for producing a semiconductor component with a monolithically integrated coil.

FIGS. 13A to 13H and 13J to 13K are cross-sectional views of different steps of a third method for producing a semiconductor component with a monolithically integrated coil.

FIGS. 15A to 15H and 15J are cross-sectional views of different steps of a fourth method for producing a semiconductor component with a monolithically integrated coil.

DETAILED DESCRIPTION

In the following Detailed Description, reference is made to the accompanying drawings, which form a part thereof, and in which is shown by way of illustration specific embodiments in which the invention may be practiced. In this regard, directional terminology, such as "top", "bottom", "front", "back", "leading", "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 1:
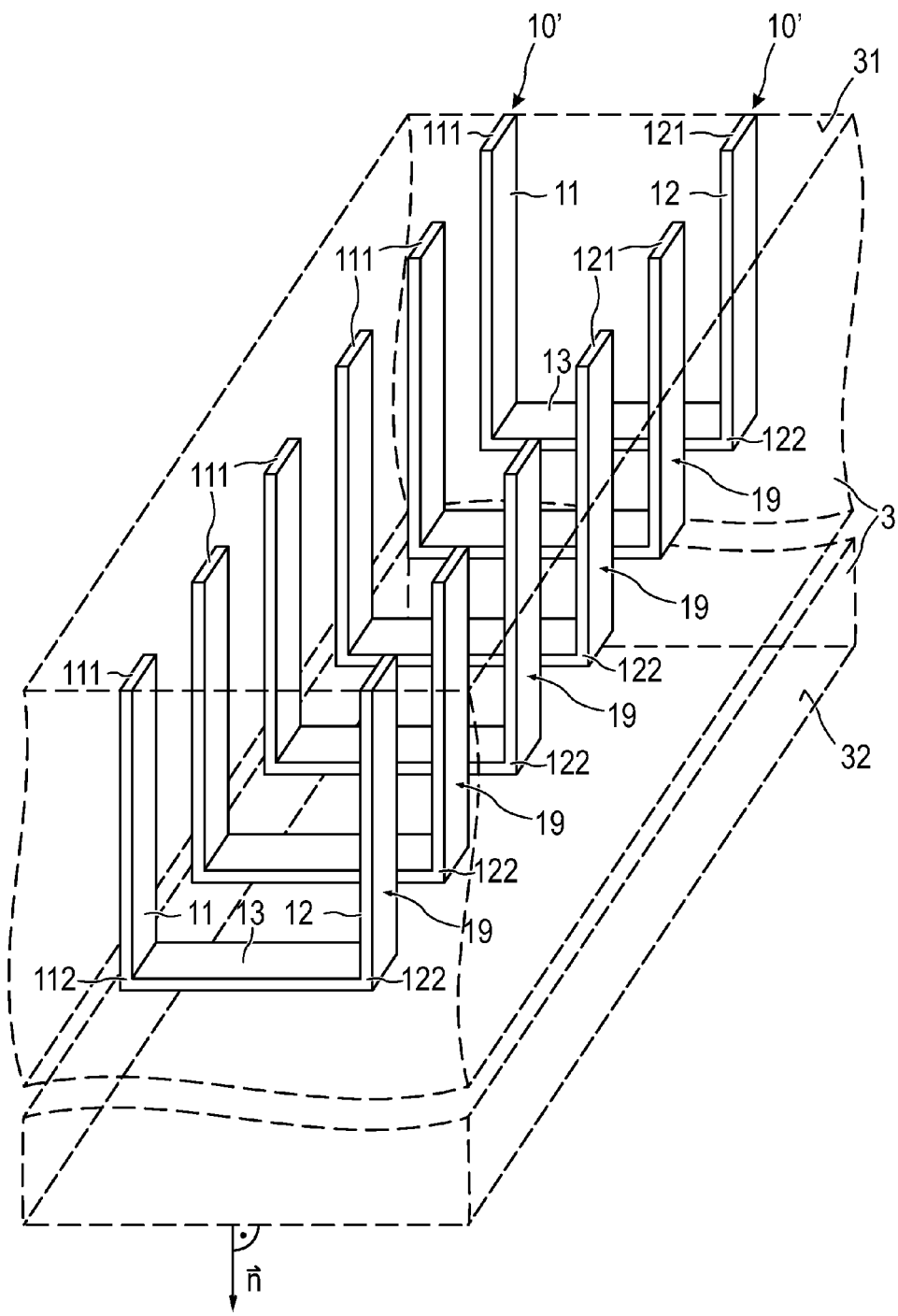
FIG. 1 is a perspective view of a partly completed first coil monolithically integrated with a semiconductor body.

Referring now to FIG. 1 there is illustrated a partly completed first coil monolithically integrated with a semiconductor body 3. The semiconductor body 3 includes a top side 31 and a bottom side 32, wherein the top side 31 and the bottom side are the sides of the semiconductor body 3 with the largest areas. The semiconductor body 3 may be made of any bulk semiconductor material as it is conventionally used for producing semiconductor chips. For instance, suitable semiconductor bulk materials are silicon (Si), silicon germanium (SiGe), silicon carbide (SiC), gallium (Ga), gallium arsenide (GaAs), gallium phosphide (GaP), gallium nitride (GaN), indium phosphide (InP) or indium arsenide (InAs).

The partly completed coil has electrically conductive first U-shaped sections 19 each having two first vertical sections 11, 12, and a first connection section 13. In the embodiment illustrated in FIG. 1, each of the above-mentioned first and second partial windings is represented by one of the U-shaped sections 19. Each first vertical section 11 includes a top end 111 and a bottom end 112. Accordingly, each first vertical section 12 includes a top end 121, and a bottom end 122 facing the bottom side 32. Accordingly, each of the U-shaped sections 19, that is, each of the partial windings 19, has two top ends 111 and 121. The two first vertical sections 11, 12 extend from the first connection section 13 toward the top side 31. In the sense of the present invention, a section 11, 12 is regarded as a "vertical section" if the distance between its top end 111 and the bottom side 32 is greater than the distance between its bottom end 112 and the bottom side 32. According to the illustrated embodiment, each of the vertical sections 11, 12 may optionally be straight and include an angle of less than or equal to the normal direction n of the bottom side 32. In each first U-shaped electrically conductive section, the respective first connection section 13 electrically conductively connects the respective first vertical sections 11, 12 at their bottom ends 112 and 122.

Optionally, all first vertical sections 11, 12 and all connection sections 13 may be produced simultaneously, for instance by depositing one or more electrically conductive materials like metal or polycrystalline semiconductor material or combinations thereof. For instance, suitable metals are titanium (Ti), tungsten (W), aluminum (Al), copper (Cu). An example for a suitable polycrystalline semiconductor material is polycrystalline silicon.

Figure 2:
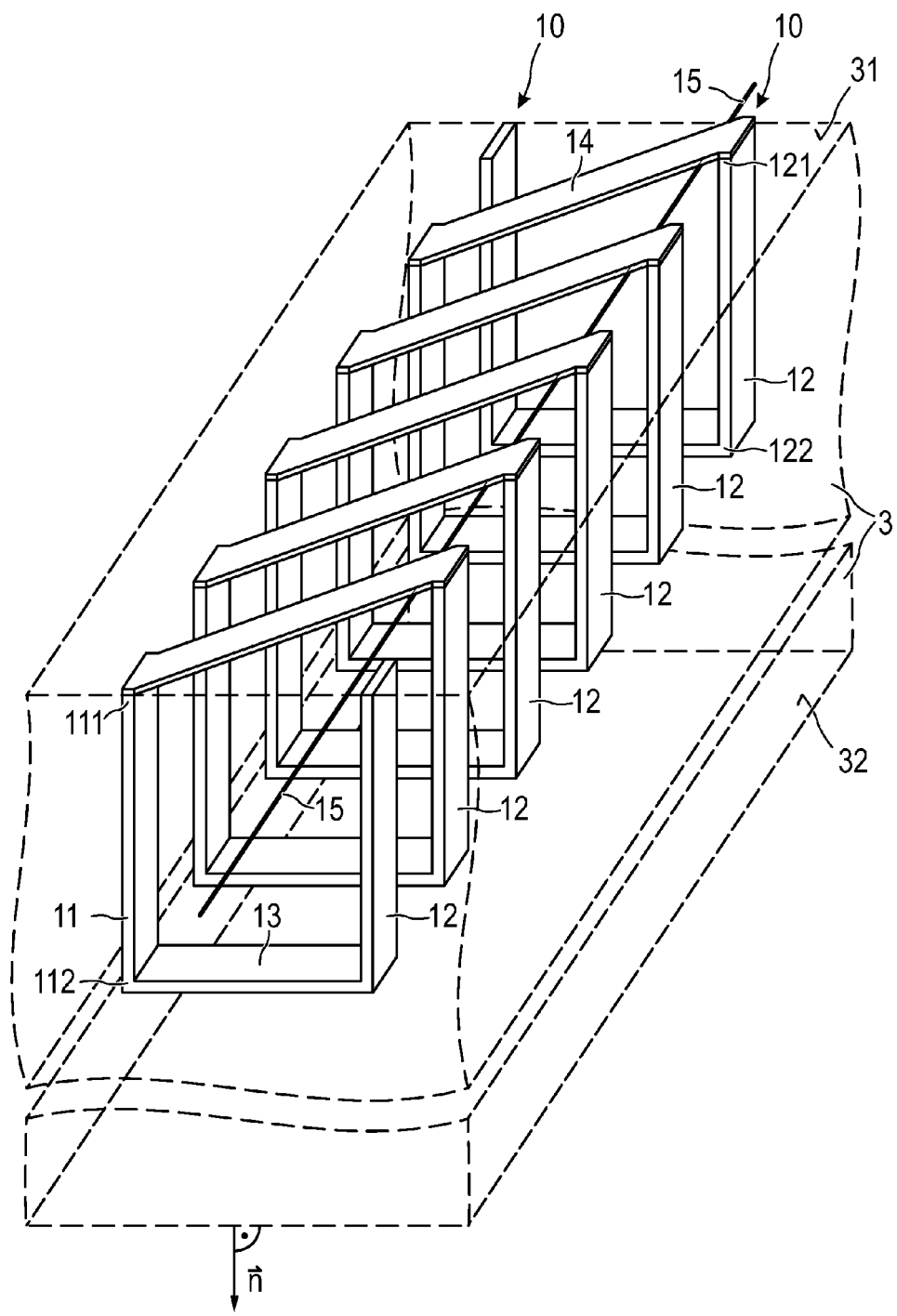
FIG. 2 is a perspective view of a the completed first coil of FIG. 1.

As illustrated in FIG. 2, a coil can be produced by electrically connecting two or more first U-shaped sections in series. Such a series connection may be realized using one or more first conductor paths 14, each first conductor path 14 electrically conductively connecting a top end 111 of a first vertical section 11 of a first U-shaped section to a top end 121 of a first vertical section 12 of a further U-shaped section. Such a conductor path 14 may be formed by one or more electrically conductive materials like metal or polycrystalline semiconductor material, for instance polycrystalline silicon. By electrically connecting a desired number of first U-shaped sections with a respective number of first connection sections 14, a first coil 10 can be created.

As also illustrated in FIG. 2, a coil axis 15 of the first coil 10 may run in a direction which is different from the direction of a surface normal n of the bottom side 32. For instance, the coil axis 15 may run parallel to the bottom side 32, i.e., perpendicular to the surface normal n of the bottom side 32.

Figure 3:
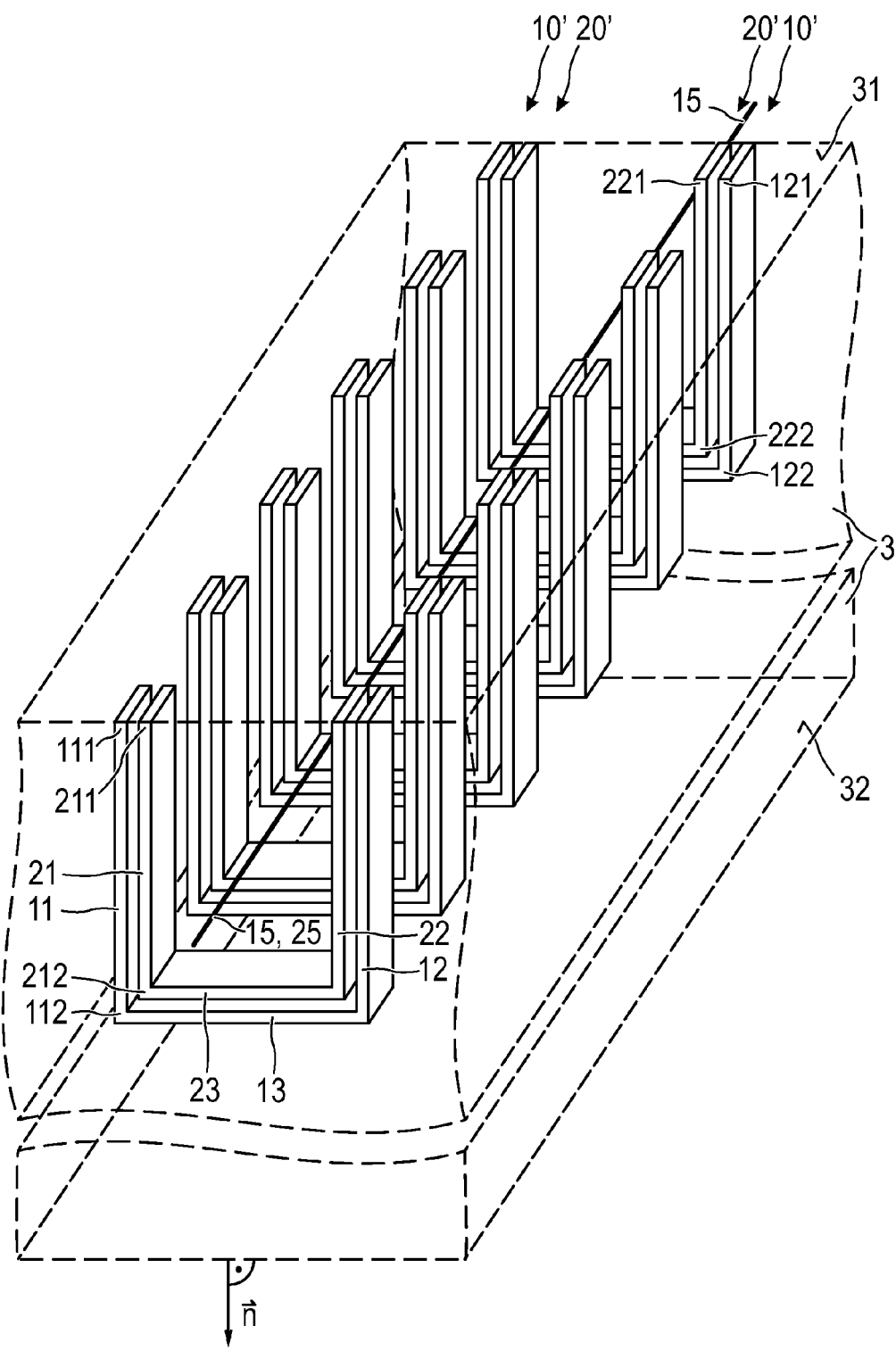
FIG. 3 is a perspective view of partly completed first and second coils monolithically integrated with a semiconductor body.
Figure 4:
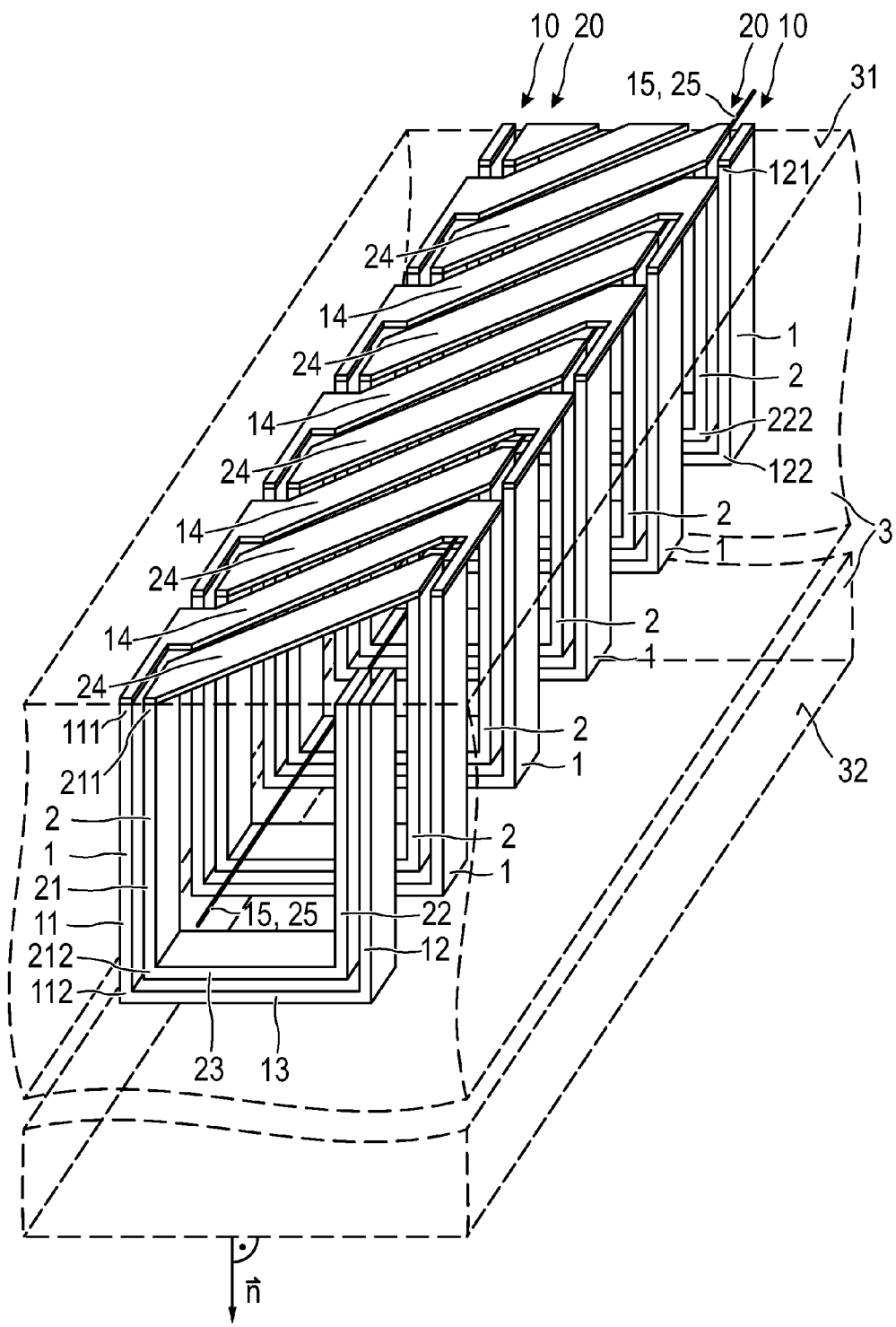
FIG. 4 is a perspective view of the completed first and second coils of FIG. 3.

In the same manner, two or more coils 10, 20 may be monolithically integrated with a common semiconductor body 3. In the embodiment illustrated in FIGS. 3 and 4, a first coil 10 and a second coil 20 are monolithically integrated with the semiconductor body 3. FIG. 3 shows the partly completed first and second coils 10', 20', FIG. 4 the completed first and second coils 10, 20. The first and second coils 10, 20 of FIG. 3 may have the same construction as the first coil 10 described with reference to FIGS. 1 and 2. Accordingly, the first coil 10 and the second coil 20 each have a first U-shaped electrically conductive section, each respective U-shaped section having two first vertical sections 21, 22, and a first connection section 23. Each first vertical section 21 includes a top end 211 and a bottom end 212. Accordingly, each first vertical section 12 includes a top end 121, and a bottom end 122 facing the bottom side 32. The two first vertical sections 21, 22 run non-parallel to the bottom side 32 and extend from the first connection section 23 toward the top side 31. In each first U-shaped electrically conductive section 21, 22, 23, the respective first connection section 23 electrically conductively connects the respective first vertical sections 21 and 22 at their bottom ends 212 and 222.

The two coils 10, 20 may share a common volume. That is, the first coil 10 surrounds a first interior zone and the second coil 20 surrounds a second interior zone that overlaps the first interior zone.

As illustrated, the coil axes 15 and 25 of the first and second coils 10 and 20, respectively, may optionally coincide.

The second coil 20 is formed by electrically connecting two or more second U-shaped sections in series. Similar to the first U-shaped sections, each second U-shaped section includes two second vertical sections 21, 22, and a second connection section 23. Each second vertical section 21 includes a top end 211 and a bottom end 212. Accordingly, each second vertical section 22 includes a top end 221, and a bottom end 222 facing the bottom side 32. The two second vertical sections 21, 22 run substantially perpendicular to the bottom side 32 and extend from the second connection section 23 toward the top side 31. In each second U-shaped electrically conductive section, the respective second connection section 23 electrically conductively connects the respective second vertical sections 21, 22 at their bottom ends 212 and 222.

Optionally, any coil of the present invention may be coreless, or, alternatively, include a magnetic core that is surrounded by at least one or even all windings of the coil. In this connection, a "magnetic core" is intended to mean a core that includes or consists of magnetic material.

Figure 5:
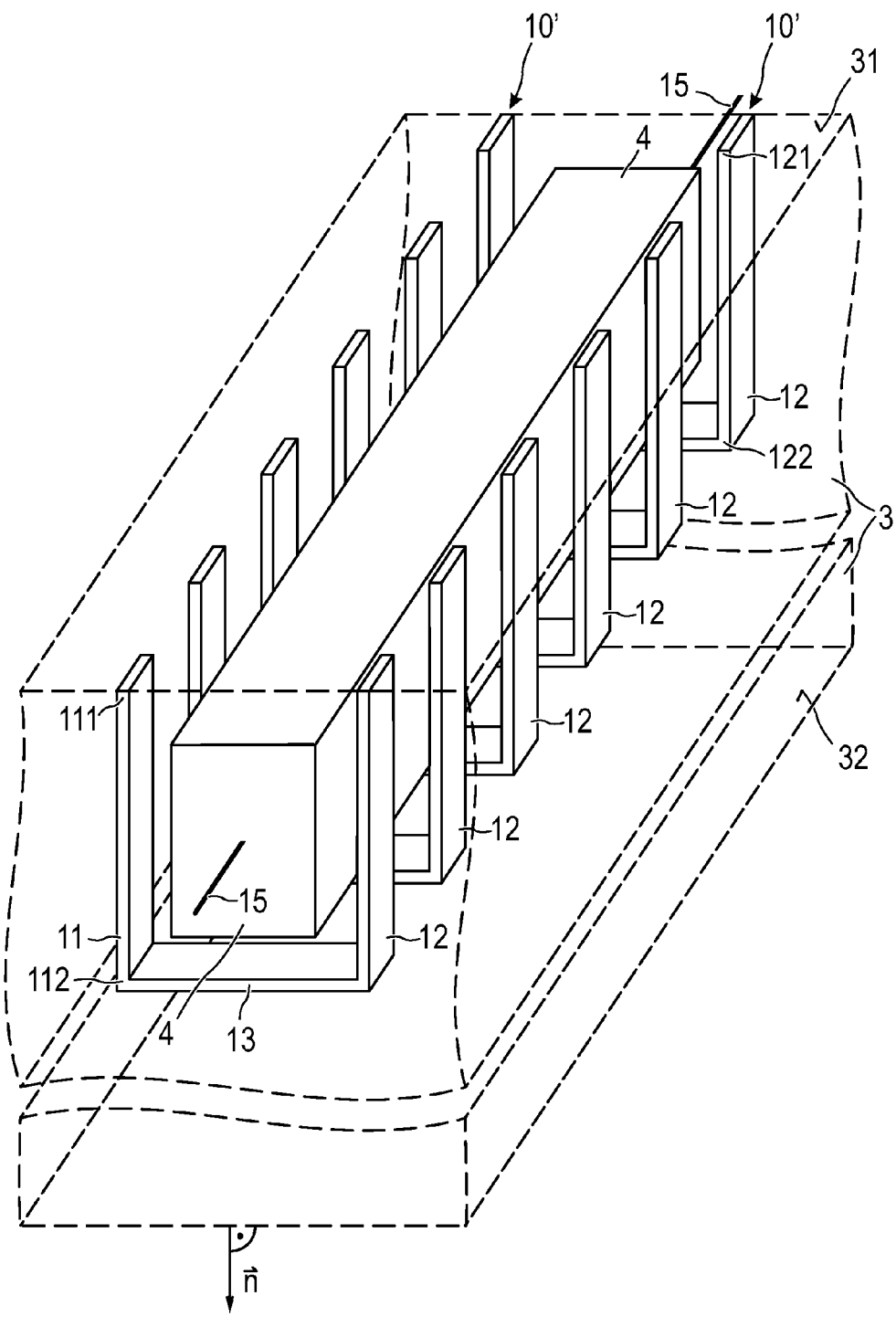
FIG. 5 is a perspective view of the partly completed first coil of FIG. 1 with a magnetic core.
Figure 6:
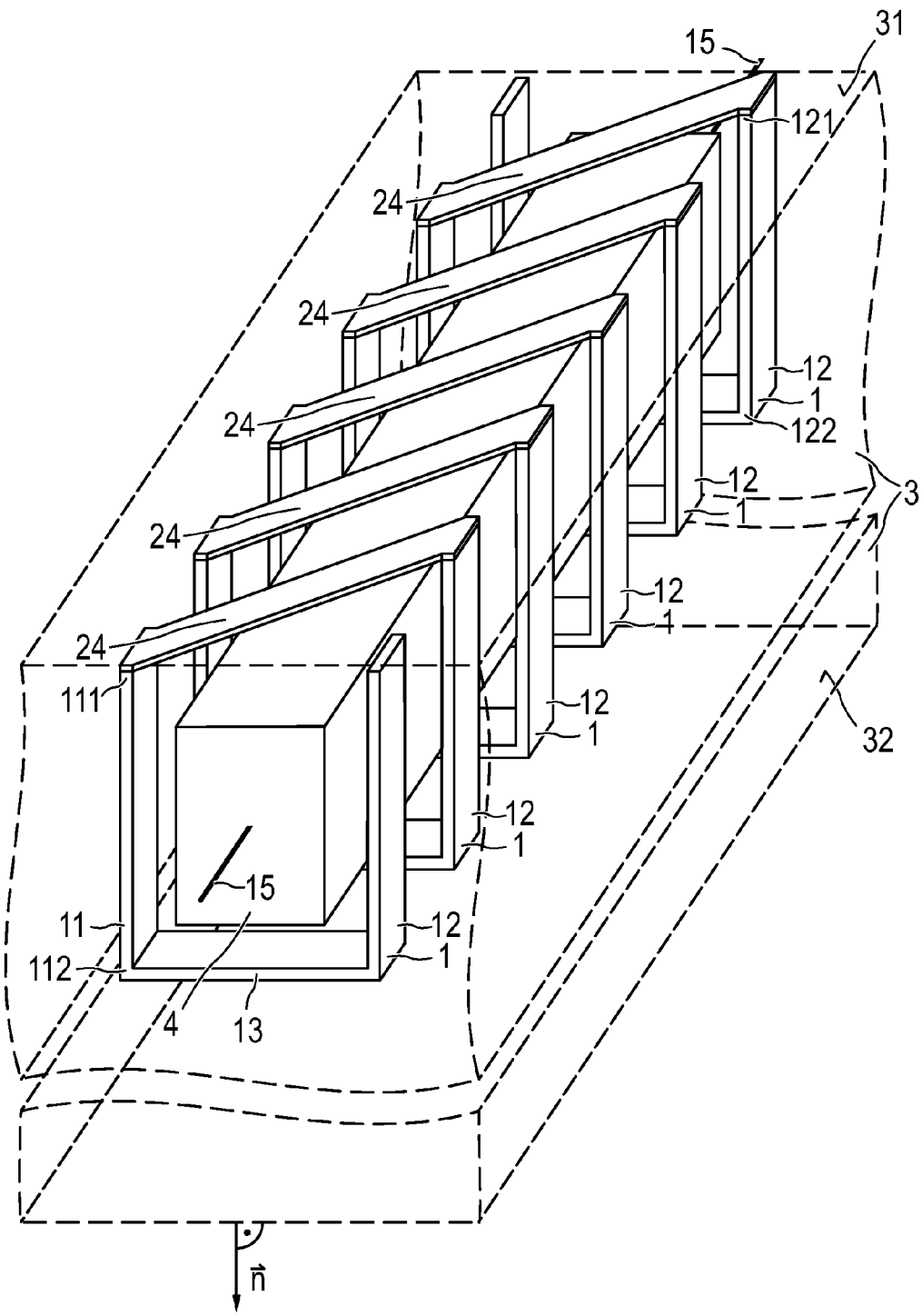
FIG. 6 is a perspective view of the arrangement of FIG. 5 with the completed first coil.

An example of a partly completed coil 10 that includes a magnetic core 4 is illustrated in FIG. 5. FIG. 6 shows the completed coil 10 with all windings surrounding the core 4. In order to produce a coil 4 as shown in FIG. 6, a partly completed coil 10' as described with reference to FIG. 1 is provided. Then, a magnetic core 4 is formed in the first U-shaped sections so as to achieve the arrangement of FIG. 5. Subsequently, the coil 10 is completed by electrically conductively connecting two, more than two or all first U-shaped sections in series in the same manner as described with reference to FIG. 2 by providing the required number of first conductor paths 14 on that side of the magnetic core 4 facing away from the bottom side 32.

The magnetic core 4 may be ferromagnetic or ferrimagnetic and therefore comprise or consist of ferromagnetic or ferrimagnetic material. For instance, the magnetic core may comprise magnetic material that has a relative magnetic permability $\mu_r$ of at least 10 or of at least 200, and may range to 140,000. Suitable magnetic or ferromagnetic materials are, for instance, nickel (Ni), iron (Fe) or cobalt (Co). Optionally, a magnetic core 4 used in the present invention may consist of a magnetic or ferromagnetic material which is homogeneously distributed over the magnetic core 4. Alternatively, the magnetic core 4 may have a layered structure with a number of magnetic or ferromagnetic layers which are electrically insulated from one another in order to avoid or reduce eddy currents. Furthermore, a ferro/ferrimagnetic metal powder which is embedded in dielectric isolation components, may be used as ferromagnetic or ferrimagnetic material.

Figure 8:
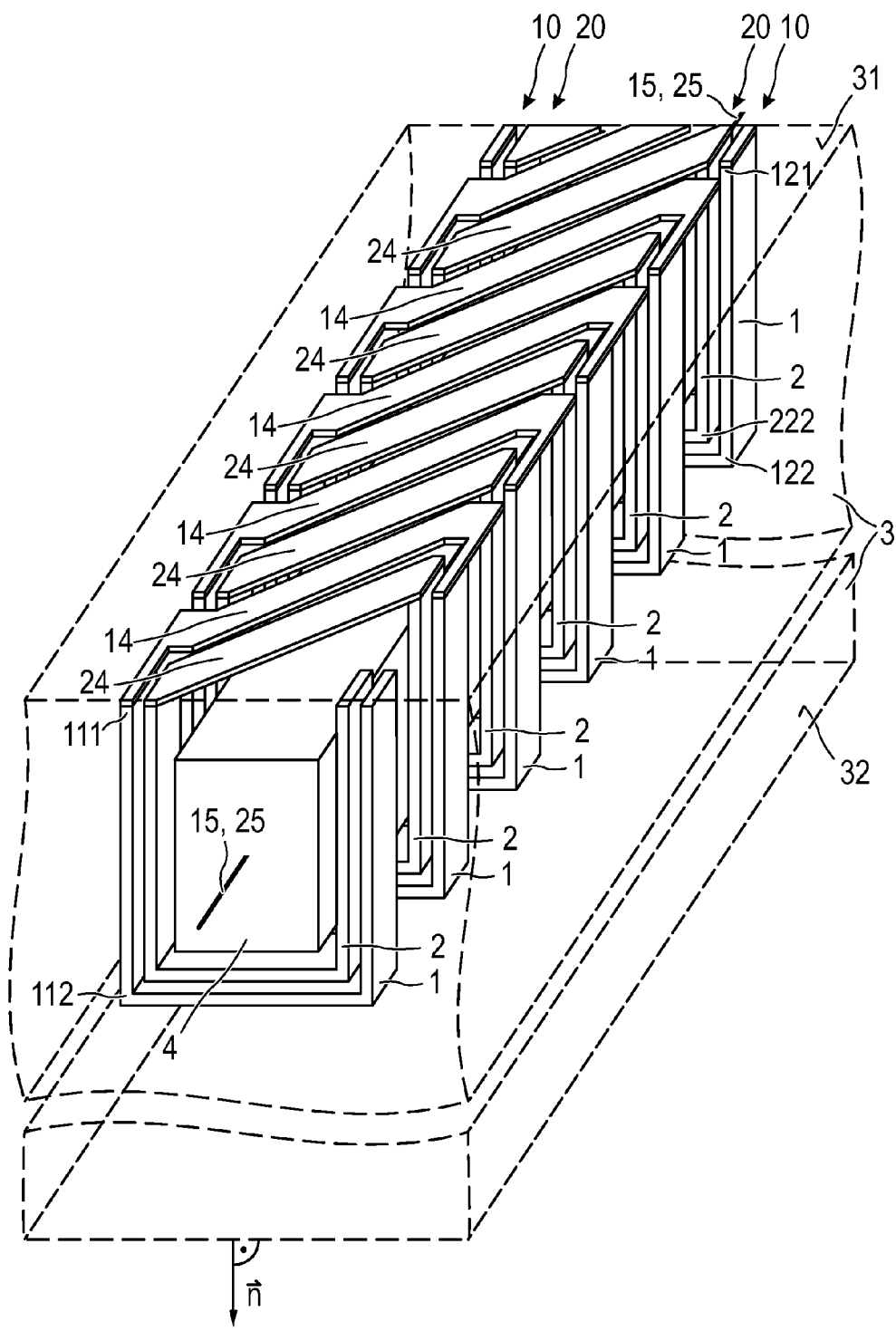
FIG. 8 is a perspective view of the arrangement of FIG. 7 with the completed first and second coils.

In a corresponding manner illustrated in FIG. 8, a first coil 10 and a second coil 20 may share a common magnetic core 4. That is, the magnetic core 4 is surrounded by at least one winding of the first coil 10 and at least one winding of the second coil 20. Of course, a common magnetic core 4 may also be surrounded by all windings of the first and second coils 10, 20.

Figure 7:
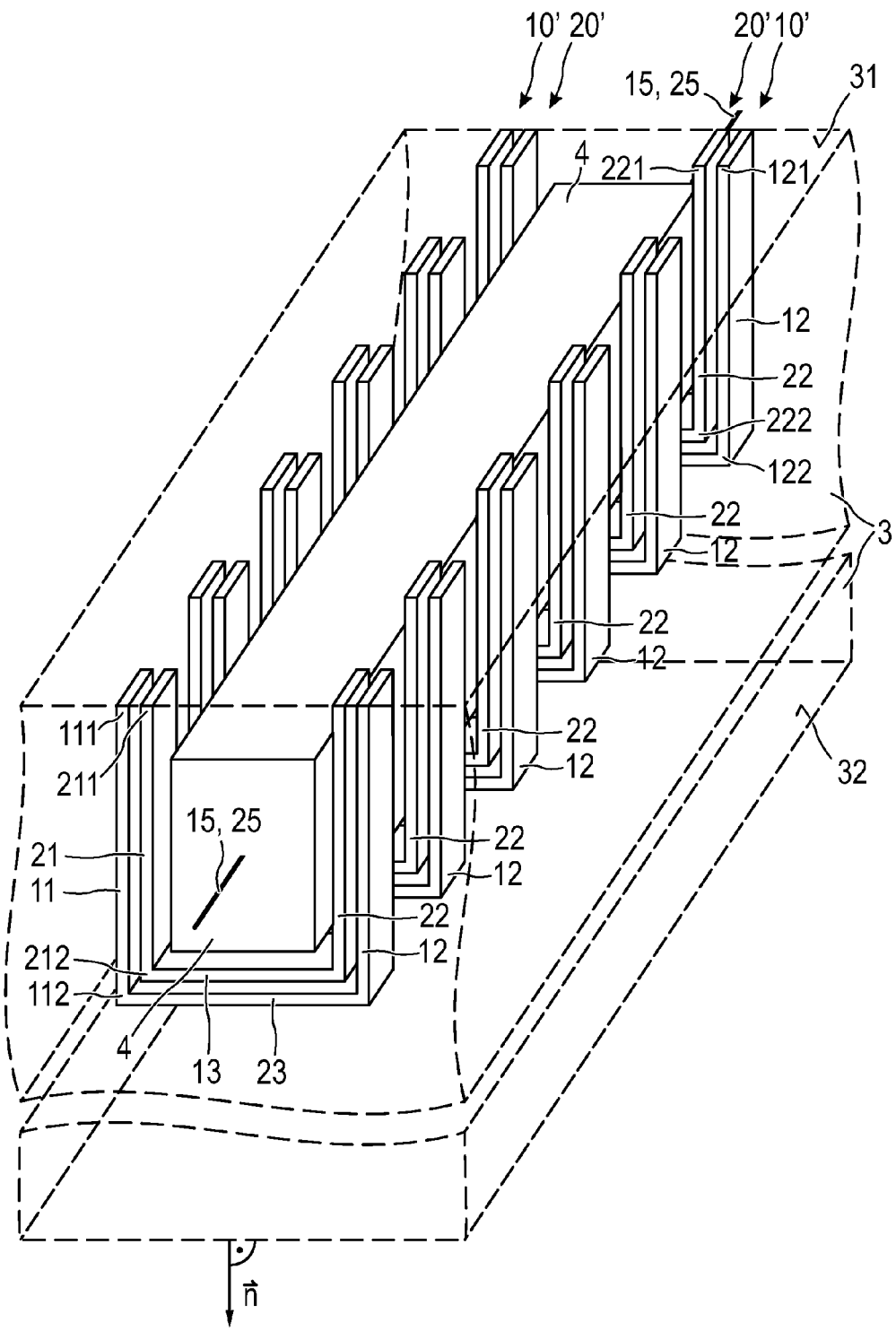
FIG. 7 is a perspective view of the partly completed first and second coils of FIG. 3 with a magnetic core.

The first and second coils 10 and 20 may have the same structure as the first and second coils 10 and 20 described above with reference to FIGS. 3 and 4. In order to form a series connection with two or more U-shaped sections 21, 22, 23 electrically connected in series, one or more first conductor paths 24 each electrically conductively connect a top end 211 of a first vertical section 21 of a first U-shaped section to a top end 221 of a first vertical section 22 of a further U-shaped section. Such a conductor path 24 may be formed by one or more electrically conductive materials like metal or polycrystalline semiconductor material, for instance polycrystalline silicon. By electrically connecting a desired number of first U-shaped sections with a respective number of first connection sections 24, a second coil 20 can be created. FIG. 7 shows the arrangement of FIG. 8 prior to forming the first conductor paths 14 and 24. Optionally, the first conductor paths 14 and 24 may be deposited simultaneously in the same deposition step.

Referring now to FIGS. 9A to 9P and 10A to 10P, a first method for producing a semiconductor component with a monolithically integrated coil will be explained. FIG. 10x (x=A . . . P) corresponds to FIG. 9x and is a cross-sectional view for a respective cross-sectional plane marked in FIG. 9x, and a top view otherwise.

Figure 9A:
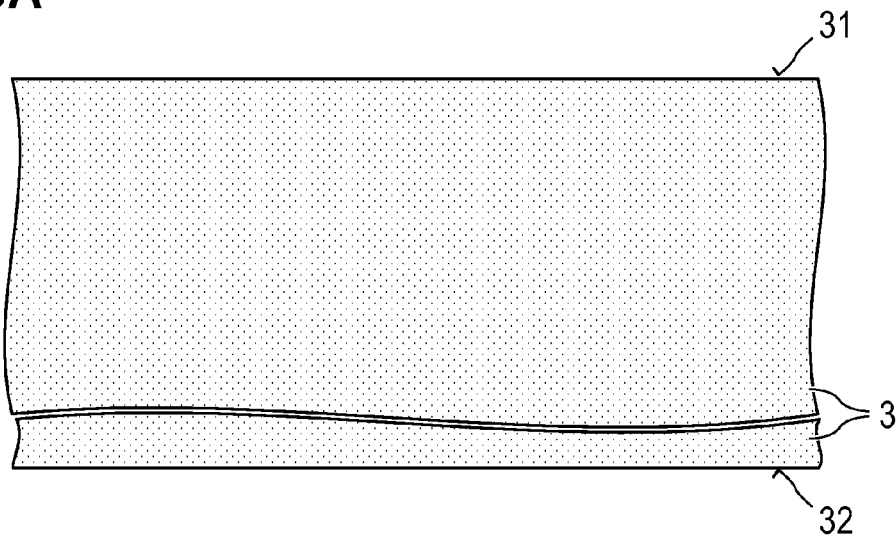
Figure 10A:
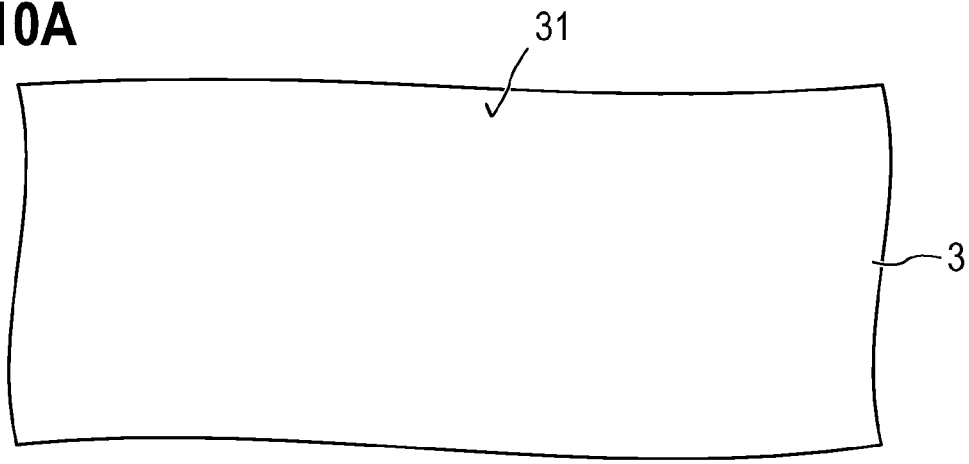
FIGS. 10A to 10H, 10J to 10N, and 10P are top views or horizontal cross-sections of the device illustrated in FIGS. 9A to 9H, 9J to 9N, and 9P.

FIGS. 9A and 10A show a section of a semiconductor body 3. For instance, the semiconductor body 3 may be a semiconductor wafer or any other flat semiconductor die. In order to produce a trench that extends from a top side 31 of the semiconductor body 3 into the semiconductor body 3, a continuous hard mask layer 40 is deposited on the top side 31. For instance, the hard mask layer 40 may include or consist of one or a combination with at least two of the following materials: an oxide, a polycrystalline semiconductor material like polycrystalline silicon etc., USG (undoped silicate glass), a nitride, and any combination of the mentioned materials.

Figure 9B:
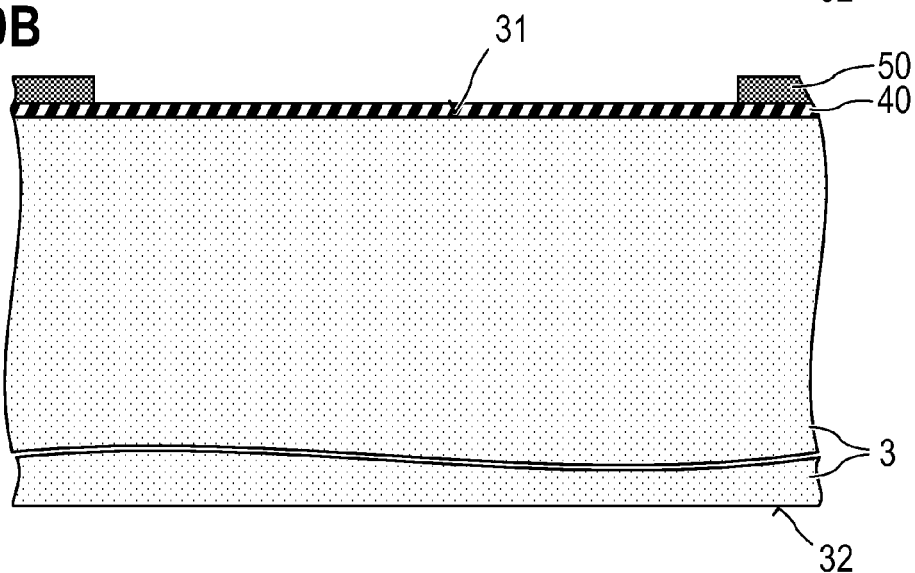
Figure 9C:
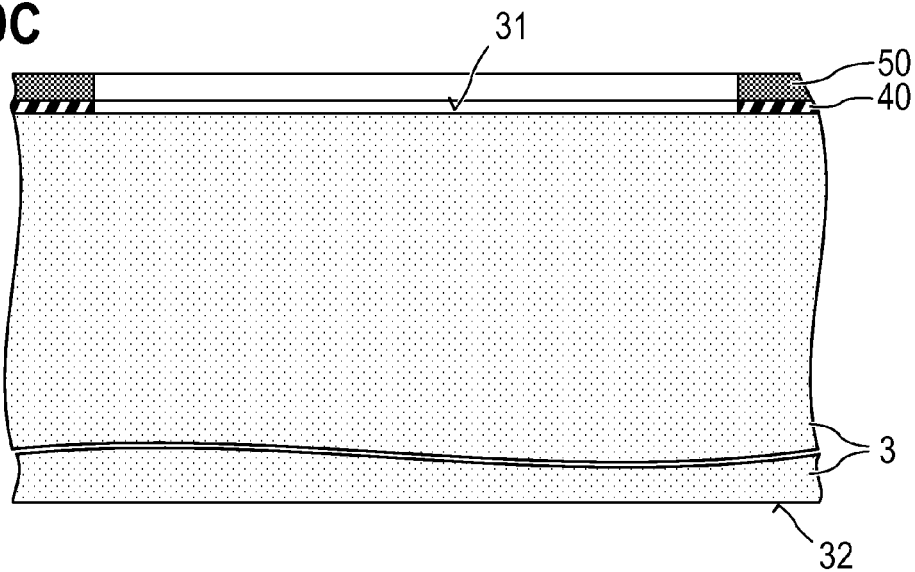
Figure 10B:
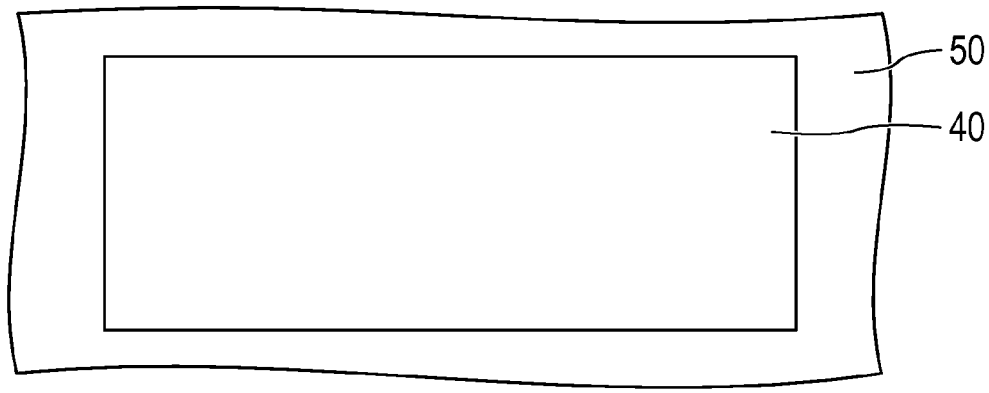
Figure 10C:
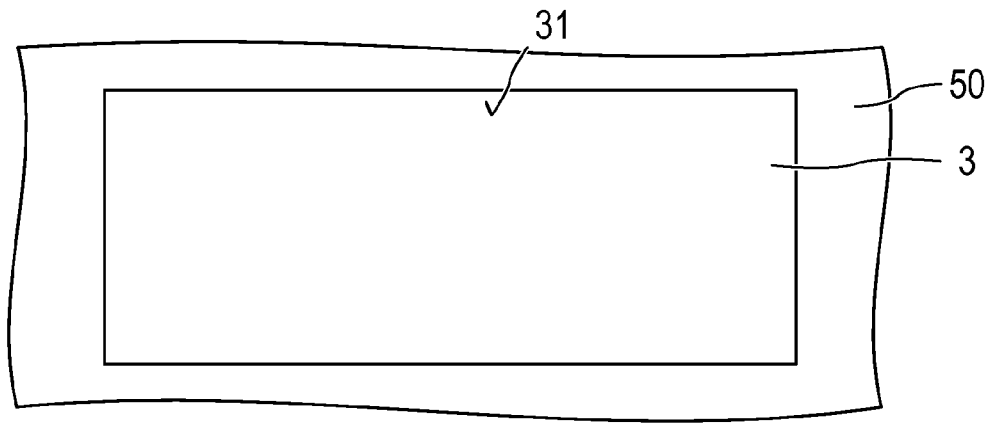

Subsequently, a photoresist layer 50 is deposited on the hard mask layer 40 and photolithographically structured. The result is illustrated in FIGS. 9B and 10B. Then, as illustrated in FIGS. 9C and 10C, the hard mask layer 40 is structured by etching using the structured photoresist layer 50 as a mask. The photoresist mask can be removed by chemical ashing processes.

Figure 10D:
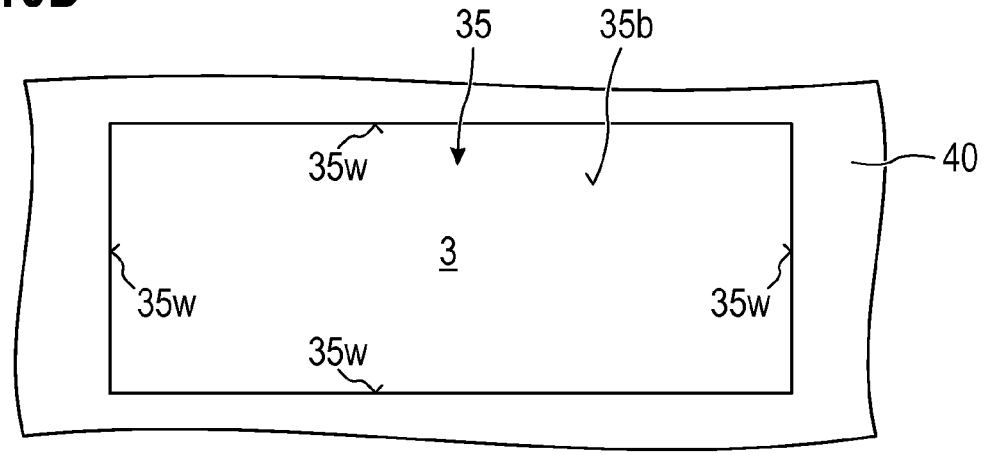
Figure 10E:
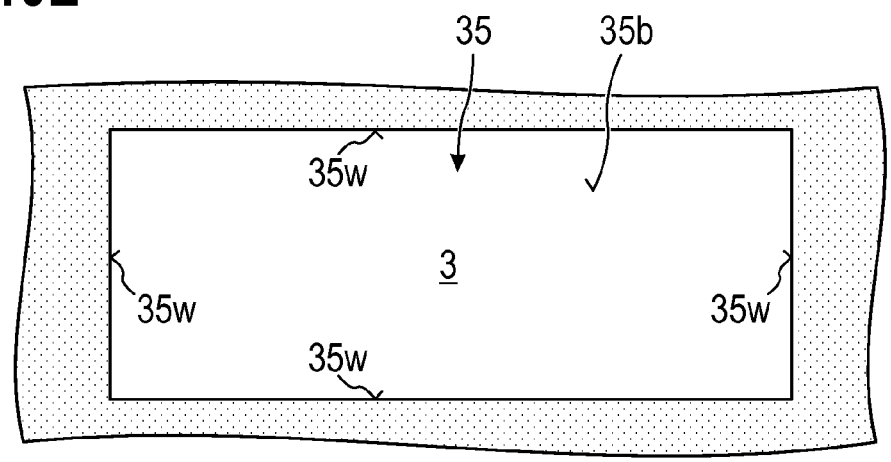

In a further, anisotropic etching step using the structured hard mask layer 40 as a mask, a trench 35 is etched into the semiconductor body 3, see FIGS. 9D and 10D. The trench 35 extends from the top side 31 into the semiconductor body 3. Generally, the trench 35 may have any shape. For instance, in a view from the top side the trench 35 may be straight, u-shaped or ring-shaped. Optionally, as illustrated in FIGS. 9E and 10E, the hard mask layer 40 may be removed after the completion of the trench 35. The trench 35 is defined by a ring-shaped side wall 35w, and, on its side facing toward the bottom side 32, by a bottom wall 35b, wherein the side wall 35w and the bottom wall 35b form a simply connected, continuous surface that only consists of doped or undoped semiconductor material. Generally, however, in other embodiments a side wall 35w may also have shapes different from that of a ring.

Figure 10F:
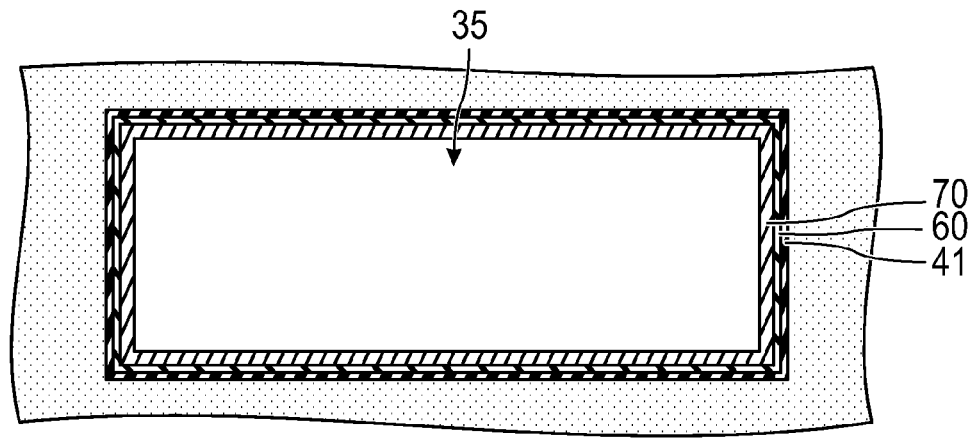

Then, as illustrated in FIGS. 9F and 10F, a dielectric layer 41, an optional barrier layer 60, and an electrically conductive layer 70 are, in the mentioned order one after the other, subsequently and conformally deposited on the side wall 35w and the bottom wall 35b. All those layers 41, 60, 70 may be formed as continuous layers. The dielectric layer 41 serves to electrically insulate the coil to be produced against the semiconductor body 3. For instance, the dielectric layer 41 may consist of or include on of the following materials: an oxide of a constituent of the semiconductor material from which the semiconductor body 3 is formed, e.g. silicon dioxide (SiO2), SiN, Si3N4, nitride, ONO. According to one embodiment, the dielectric layer 41 may include a silicon nitride layer, and an oxide layer arranged between the silicon nitride layer and the semiconductor body 3. The optional barrier layer 60 serves to avoid that material from the electrically conductive layer 70 diffuses into the semiconductor body 3. This is of particular relevance if the electrically conductive layer 70 consists of or comprises metal as metal can adversely affect the electric properties of an active semiconductor region which can optionally be integrated with the semiconductor body 3 adjacent to the trench 35. If the electrically conductive layer 70 consists of doped or undoped polycrystalline semiconductor material, a barrier layer 60 is dispensable but may also be used. For instance, a barrier layer 60 may consist of or include TiW (Titanium/Tungsten).

Figure 9G:
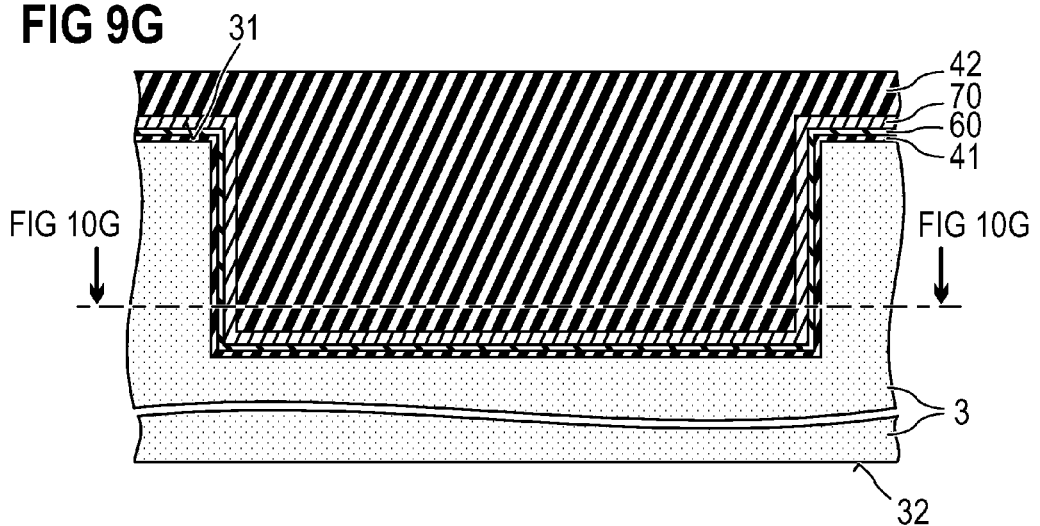
Figure 9H:
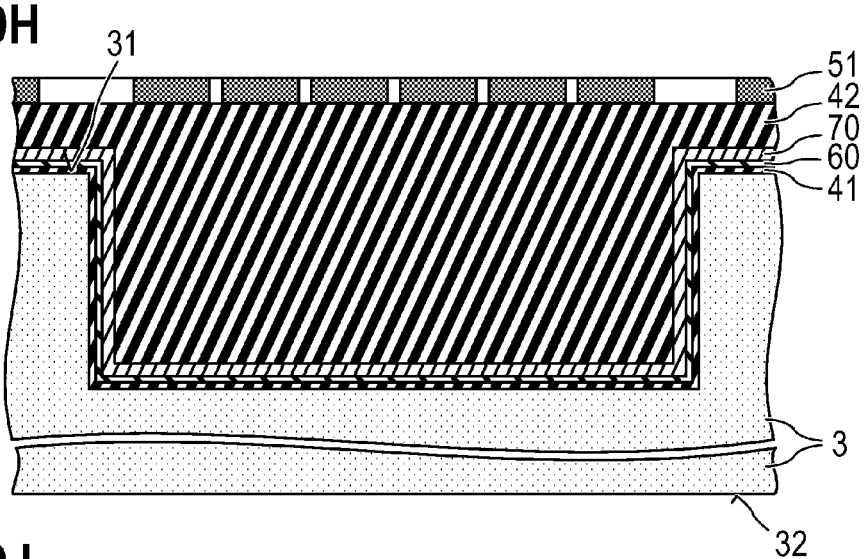
Figure 9J:
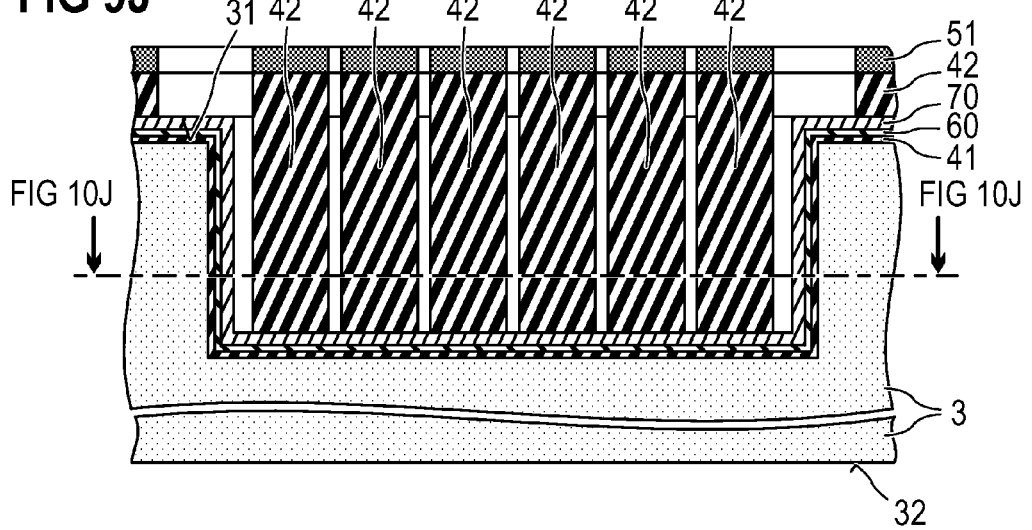
Figure 10G:
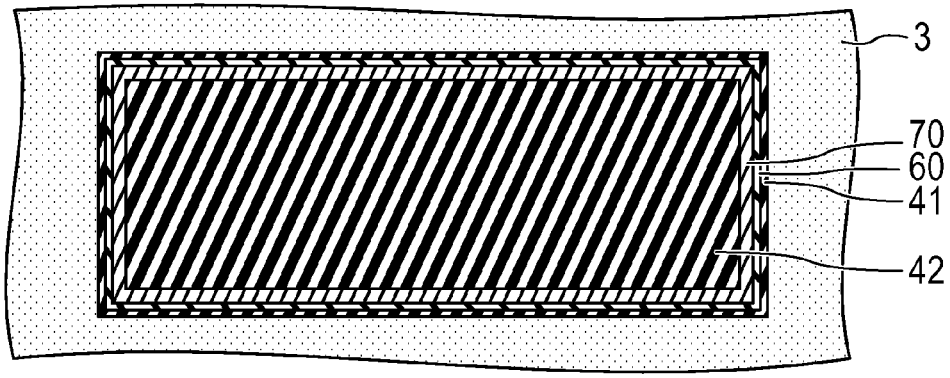
Figure 10H:
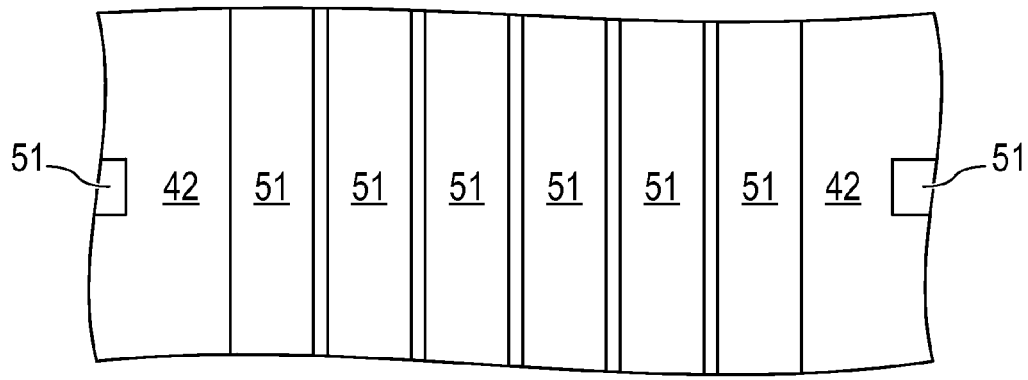
Figure 10J:
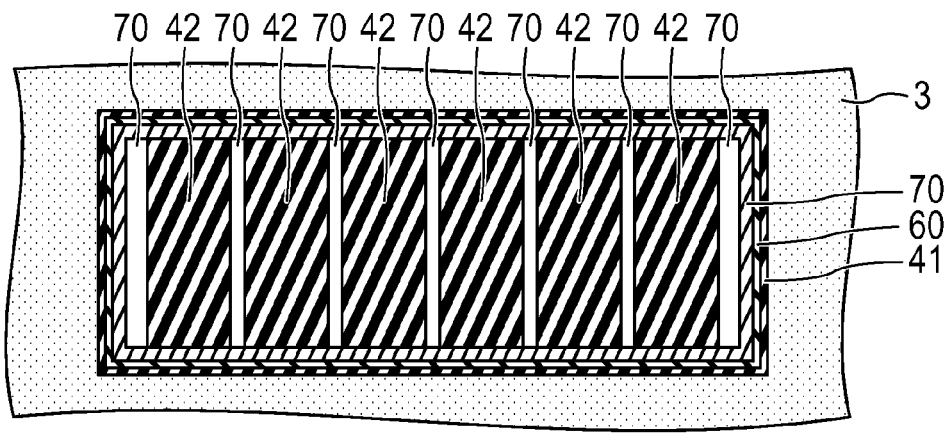

In a subsequent step illustrated in FIGS. 9G and 10G, the remaining trench 35 is completely filled or overfilled with a mask material 42, for instance a varnish, carbon (C), or an imide or an oxide. A suitable oxide is, e.g., a silicon oxide. Then, the top side of the mask material 42 is planarized and, as illustrated in FIGS. 9H and 10H, a photoresist layer 51 is formed on the planarized mask material 42 and photolithographically structured. The structured photoresist layer 51 is then used as a mask for anisotropically etching the mask material 42, see FIGS. 9J and 10J. Anisotropically etching the mask material 42 is performed selectively with regard to the electrically conductive layer 70. That is, no or substantially no material of the electrically conductive layer 70 is removed.

Figure 9K:
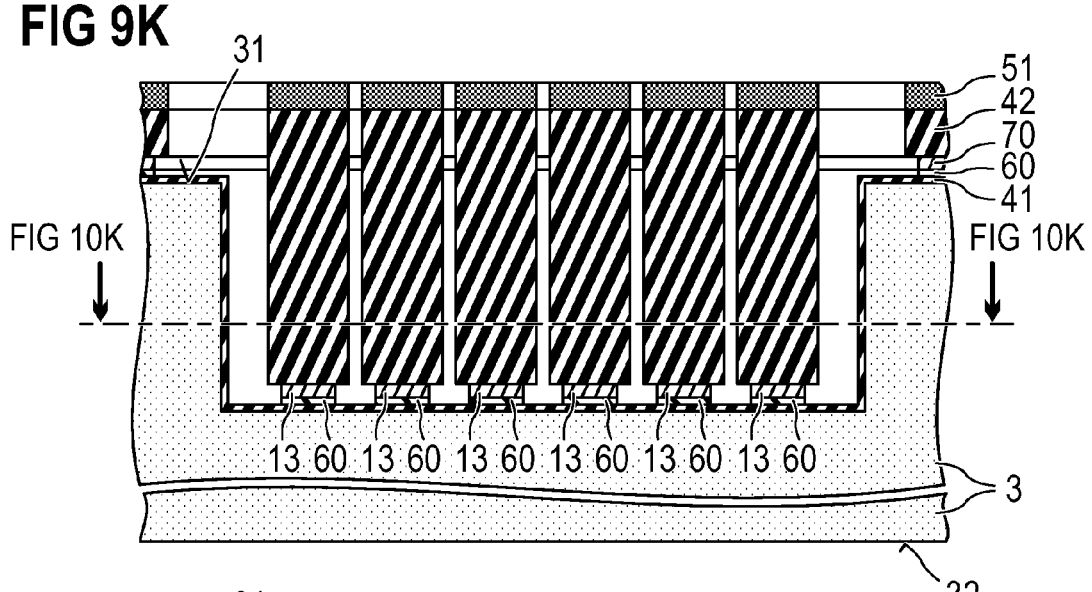
Figure 10K:
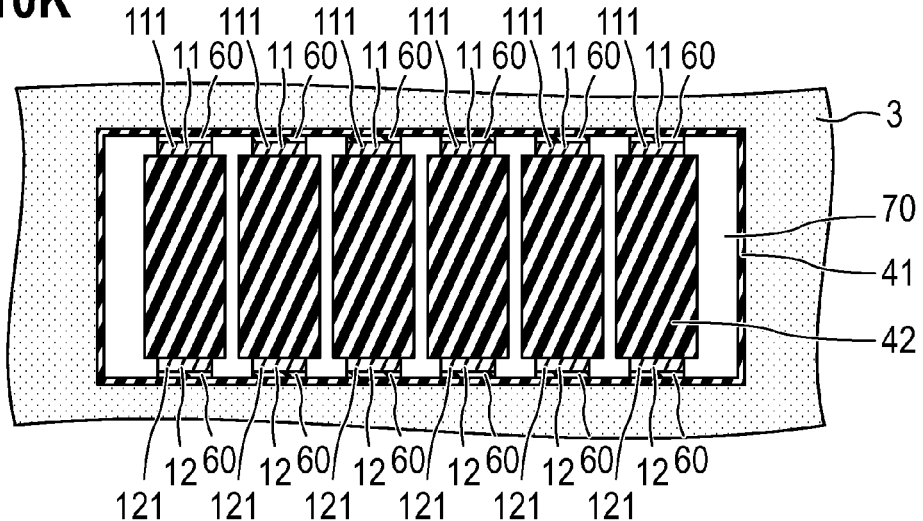

In a subsequent isotropical etching process, for instance a wet etching process, the structured mask material 42 is used as a mask for selectively etching the electrically conductive layer 70 with regard to the barrier layer 60. In embodiments in which no barrier layer 60 is used, the isotropical etching is selective with regard to the dielectric layer 41. In any case, the result of the isotropical etching process is a number of U-shaped electrically conductive sections, each including a two first vertical sections 11, 12, and a first connection section 13 as described above with reference to FIG. 1, see FIGS. 9K and 10K. Alternatively, only one such U-shaped electrically conductive section may be produced by etching away that parts of the electrically conductive layer 70 deposited on opposite sides of the side wall 35w. In case of two or more such U-shaped electrically conductive sections, the sections are electrically insulated from one another.

Figure 9L:
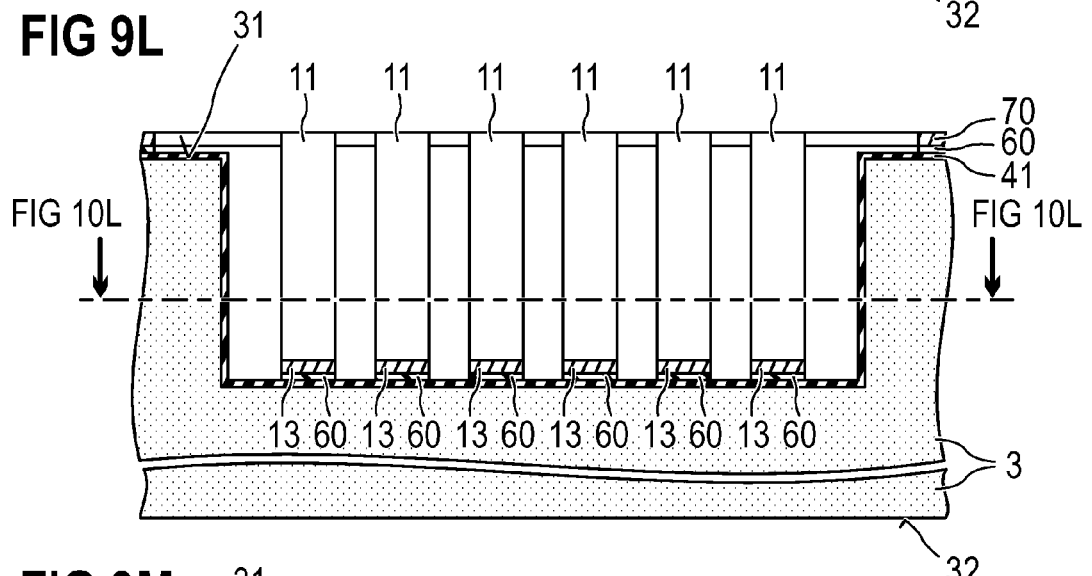
Figure 9M:
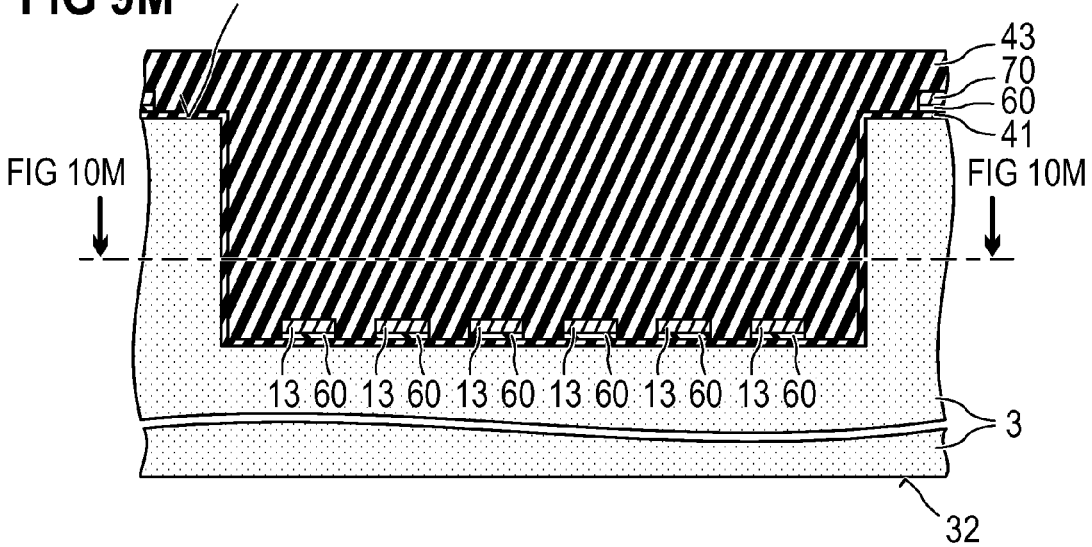
Figure 9N:
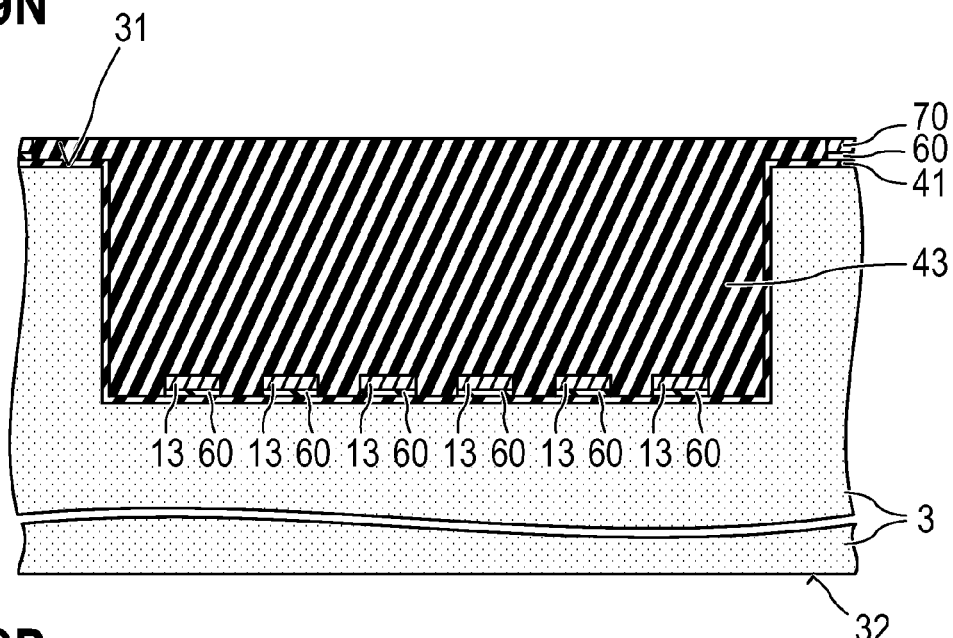
Figure 10L:
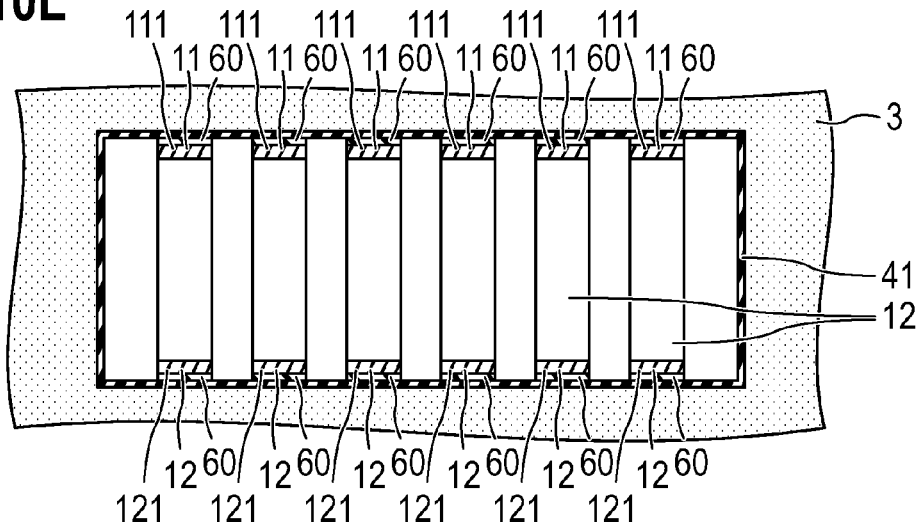
Figure 10M:
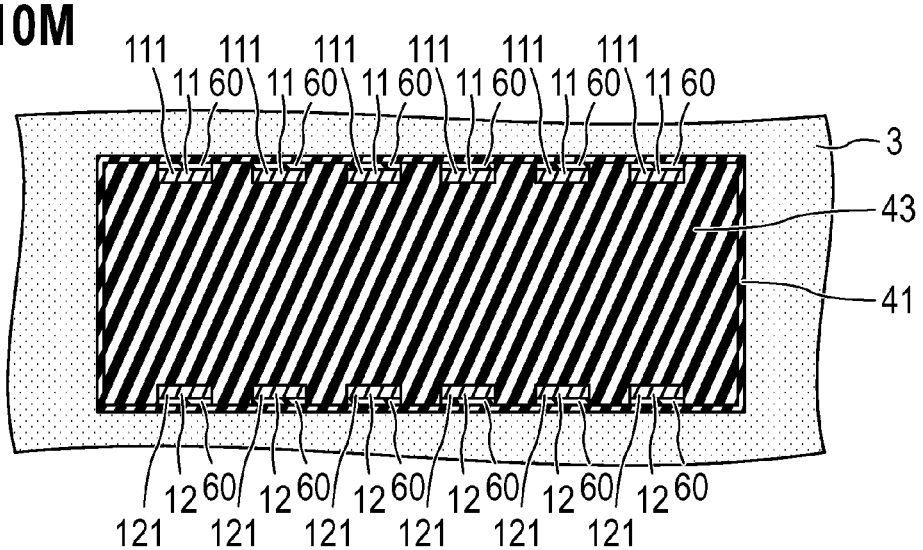
Figure 10N:
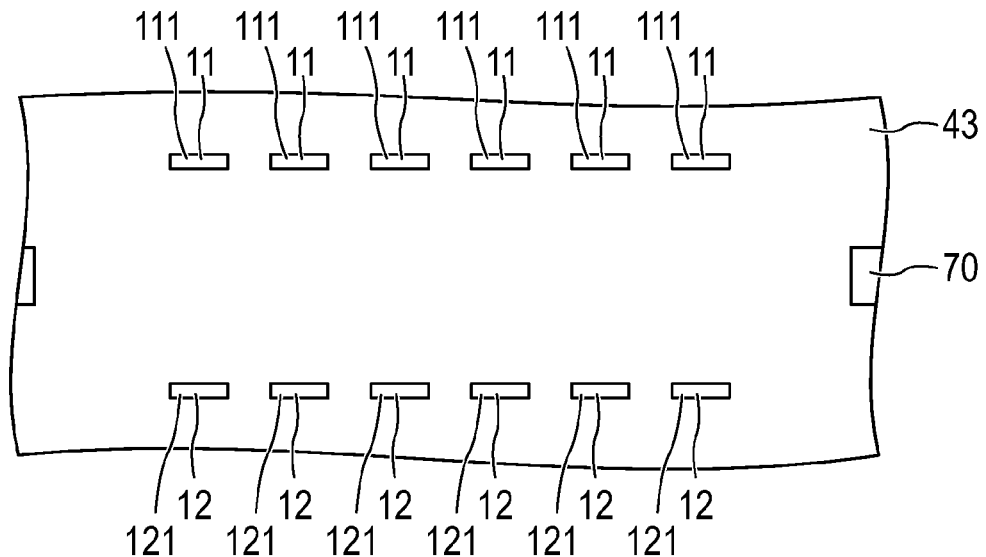

Then, as illustrated in FIGS. 9L and 10L, the structured mask material 42 is removed from the trench and the two first vertical sections 11, 12, and a first connection section 13, that is, the U-shaped electrically conductive sections, are exposed. Following, the trench is again filled or overfilled with a dielectric material 43, see FIGS. 9M and 10M, which is subsequently planarized on its top side such that the top ends 111 and 121 of the first vertical sections 11 and 12, respectively, are exposed, see FIGS. 9N and 10N. Suitable dielectric materials 43 are, e.g., oxides like silicon oxides, or plastics. Oxides may be deposited, for instance, by chemical vapor deposition (CVD).

Figure 9P:
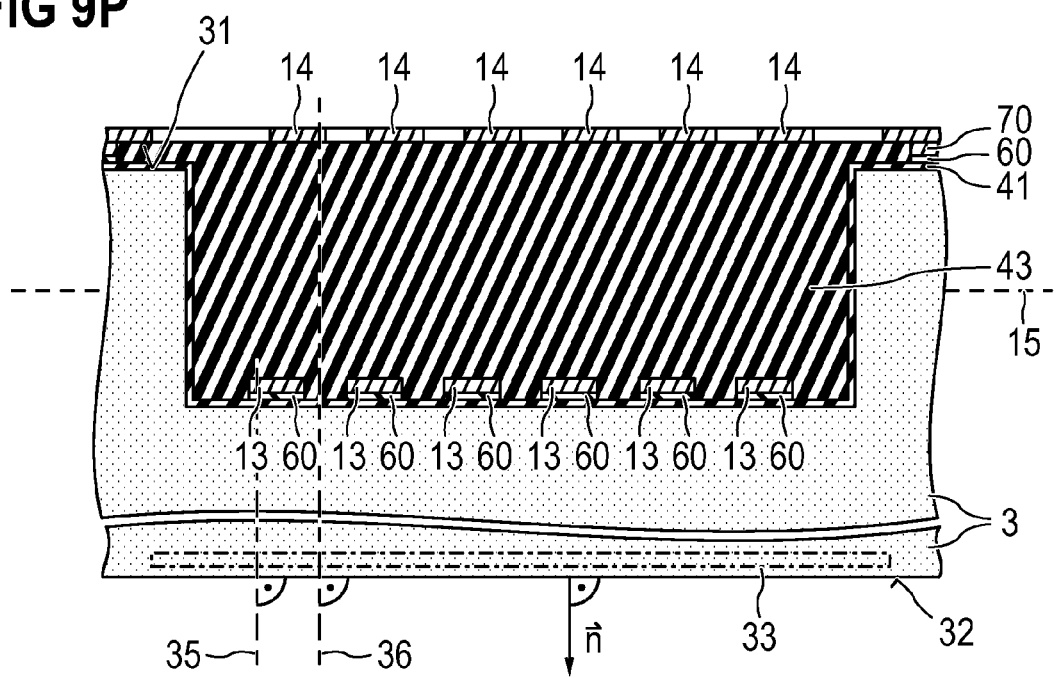
Figure 10P:
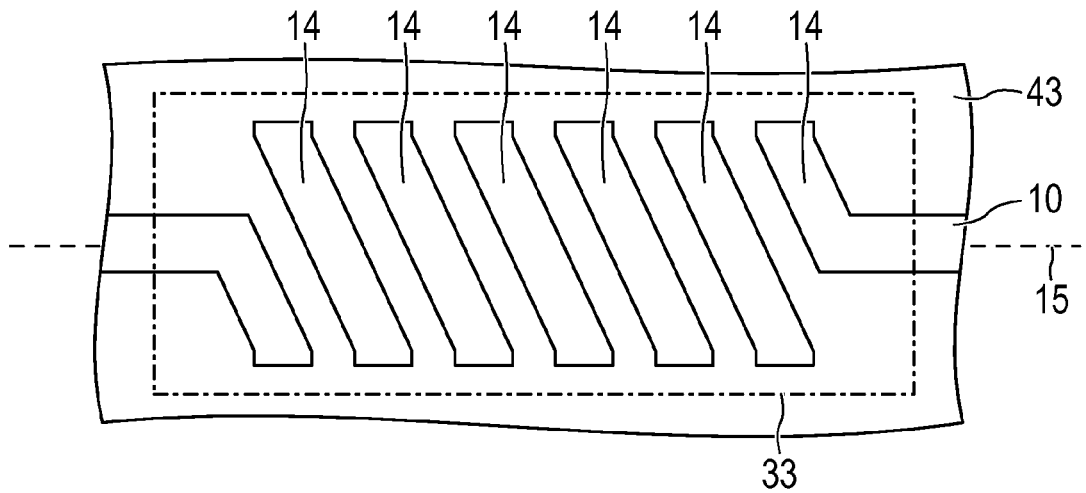

In a further step illustrated in FIGS. 9P and 10P, first conductor paths 14 are produced on the planarized top side of the planarized dielectric material 43 and the top ends 111, 121 such that the conductor paths 14 electrically conductively connect the U-shaped sections in series as explained above with reference to FIG. 2. For instance, suitable dielectric materials 43 include or consist of one or a combination with at least two of the following materials: silicon dioxide (SiO2), a CVD-oxide, an imide, an epoxy.

The conductor paths 14 can be procuded by depositing a continous layer of conductive material, for instance a metal or a doped polycrystalline semiconductor material, on the planarized top side of the planarized dielectric material 43 onto the top ends 111, 121, and by structuring the conductive material so as to obtain the required number of conductor paths 14.

As is also illustrated in FIGS. 9P and 10P, a continuous layer 33 of doped or undoped semiconductor material may be arranged between the first coil 10 and the bottom side 32. Thereby, each straight line 35, 36 that runs perpendicular to the bottom side 32 and that intersects one, more than one or all first windings of the coil 10, also intersects the continuous layer 33.

Referring now to FIGS. 11A to 11E and 12A to 12E, a second method for producing a semiconductor component with a monolithically integrated coil will be explained. In that coil, the first U-shaped electrically conductive sections, i.e. the two first vertical sections 11, 12 and the first connection section 13, include or consist of a silicide. FIG. 12x (x=A . . . E) corresponds to FIG. 11x and is a cross-sectional view if there is a cross-sectional plane marked in FIG. 11x, and a top view otherwise.

In the second method, an arrangement as illustrated in FIGS. 9L and 10L is produced in the same manner as described with reference to FIGS. 9A to 9L and 10A to 10L, wherein the electrically conductive layer 70 includes or consists of polycrystalline silicon. In the subsequent process, the polycrystalline silicon will be used for forming a silicide. In the embodiment illustrated in FIGS. 11A to 11E and 12A to 12E, a barrier layer 60 as described in FIGS. 9A to 9L and 10A to 10L is dispensed with but may optionally be provided. Insofar, the arrangement illustrated in FIGS. 11A and 12A corresponds to the arrangement illustrated in FIGS. 9L and 10L.

Figure 11D:
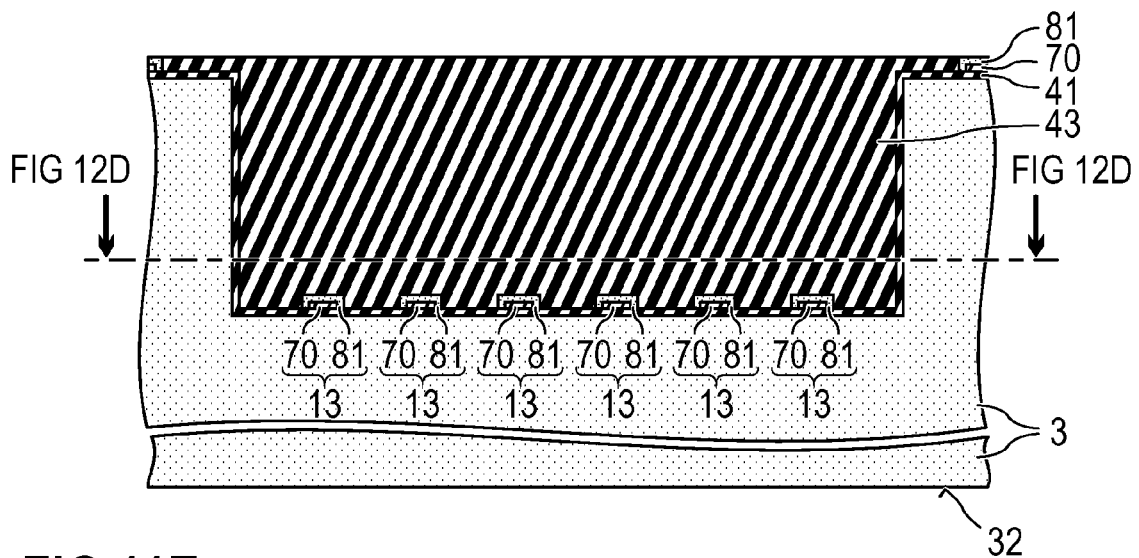
Figure 12A:
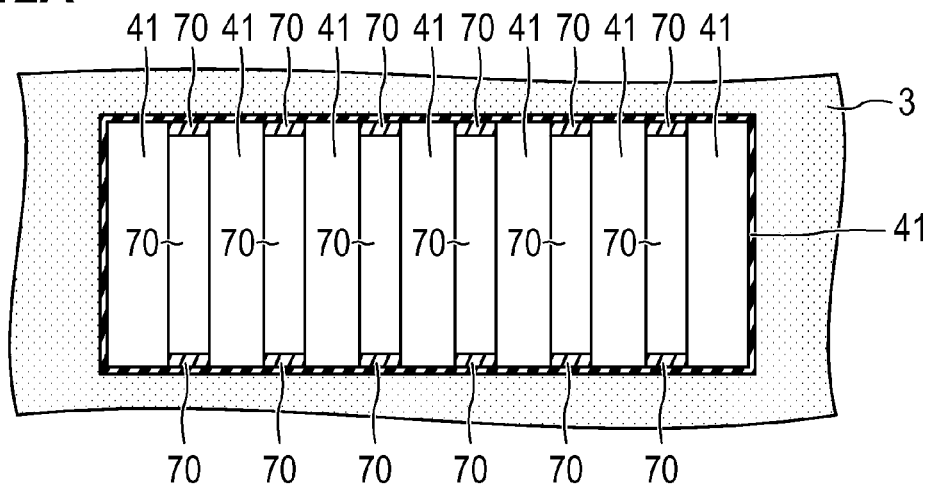
FIGS. 12A to 12E are top views or horizontal cross-sections of the device illustrated in FIGS. 11A to 11E.
Figure 12B:
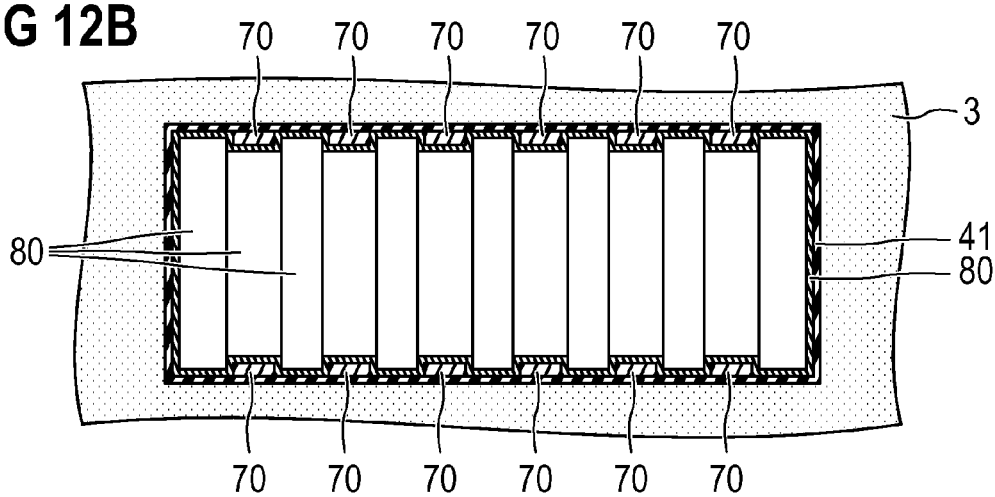

As illustrated in FIGS. 11B and 12B, a metal layer 80 is desposited on the dielectric layer 41 and the structured electrically conductive layer 70 of the arrangement illustrated in FIGS. 11A and 12A. The metal layer 80 includes or consists of a metal that is able to form a silicide with the silicon contained in the electrically conductive layer 70. Suitable silicidable metals are, for instance, titanium (Ti), tantalum (Ta), tungsten (W), cobalt (Co), molybdenum (Mo), platinum (Pt), nickel (Ni) or any combination with two or more of those metals.

Figure 12C:
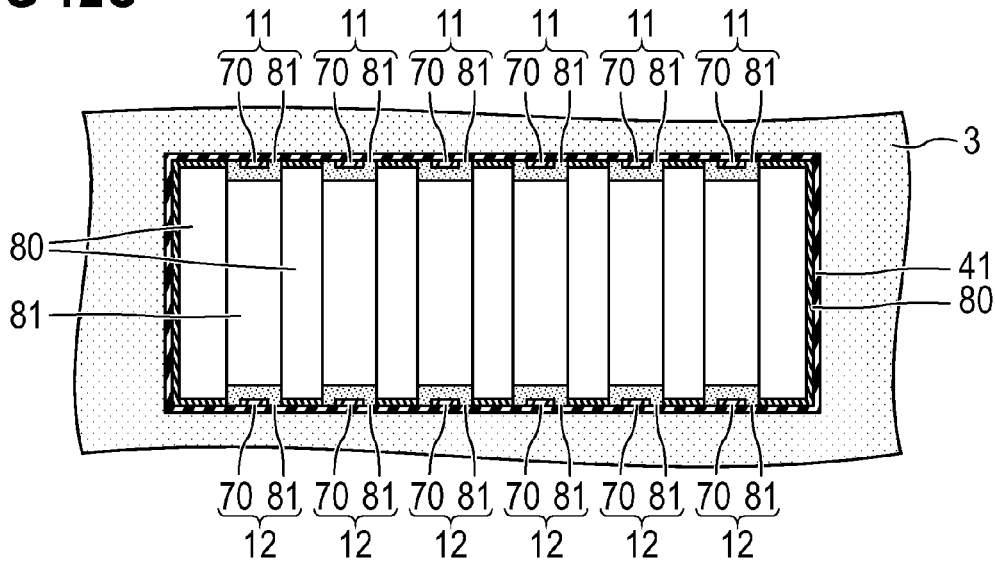

In order to form a silicide from the metal comprised in the metal layer 80 and the silicon or polysilicon comprised in the electrically conductive layer 70, the metal layer 80 and the electrically conductive layer 70 may be tempered at a temperature of at least 200° 0 or of at least 250° C. so as to accelerate a diffusion of the silicidable metal into the electrically conductive layer 70 and, associated therewith, the formation of a silicide from the silicidable metal and the silicon comprised in the electrically conductive layer 70. FIGS. 11C and 12C illustrate the arrangement after the silicidation process. Reference numeral 81 designates the formed silicide. As becomes clear from FIGS. 11C and 12C, the silicide 81 may be self aligned, i.e. a salicide ("self aligned silicide").

As can be seen from FIGS. 11C and 12C, the silicidation process does not necessarily affect the whole electrically conductive layer 70. That is, underneath the silicide 81, sections of the original electrically conductive layer 70 may remain. However, it is also possible that the silicidation process includes the whole electrically conductive layer 70. In this latter case, substantially all silicon comprised in the electrically conductive layer 70 would be used for siliciding the metal of the metal layer 80.

It is to be noted that adjacent to the silicide 81, unsilicided sections of the metal layer 80 remain. In a subsequent isotropic etching process, for instance a wet etching or plasma etching process, the unsilicided sections of the metal layer 80 are removed in order to achieve a number of independent first U-shaped sections as illustrated in FIGS. 11A and 12A. Hence, different first U-shaped sections are electrically insulated from one another. Each first U-shaped section is formed of two first vertical sections 11, 12 and a first connection section 13 as described with reference to FIG. 1. and includes or consists of a section of the formed silicide 81. In other embodiments it is also possible that there is only one first U-shaped section. In any case, the remaining parts of the metal layer 80 are removed from opposite side walls of the trench. Otherwise, the respective parts of the metal layer 80 would short-circuit the adjacent U-shaped section. The etching process for removing the remaining parts of the metal layer 80 may be selective relative to the underlying dielectric layer 41, that is, the etching process does not affect or at least does not substantially affect the dielectric layer 41.

Figure 12D:
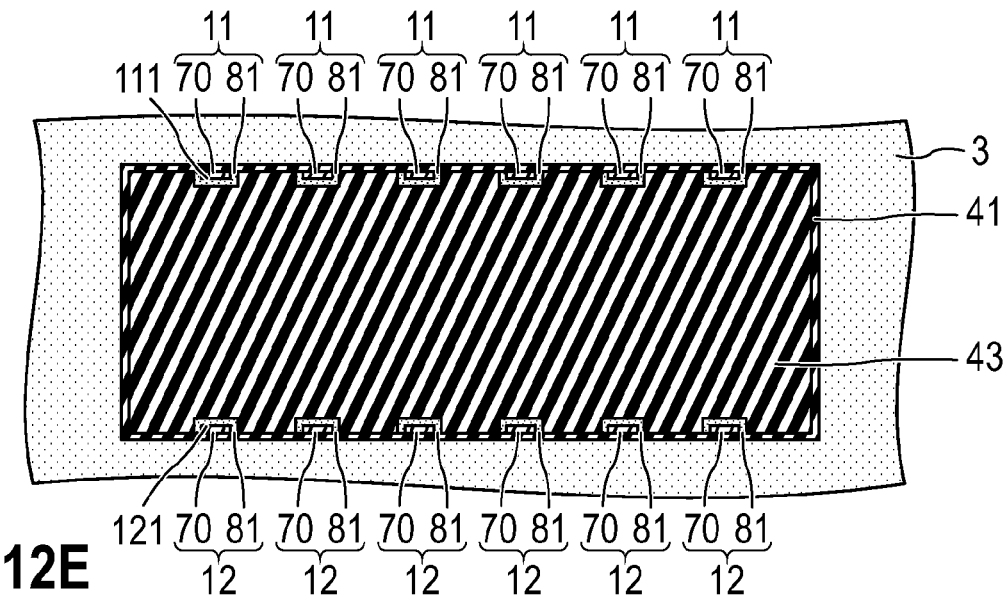

Then, as illustrated in FIGS. 11D and 12D, the trench is again filled or overfilled with a dielectric material 43 which is subsequently planarized on its top side such that the top ends 111 and 121 of the first vertical sections 11 and 12, respectively, are exposed.

Figure 11E:
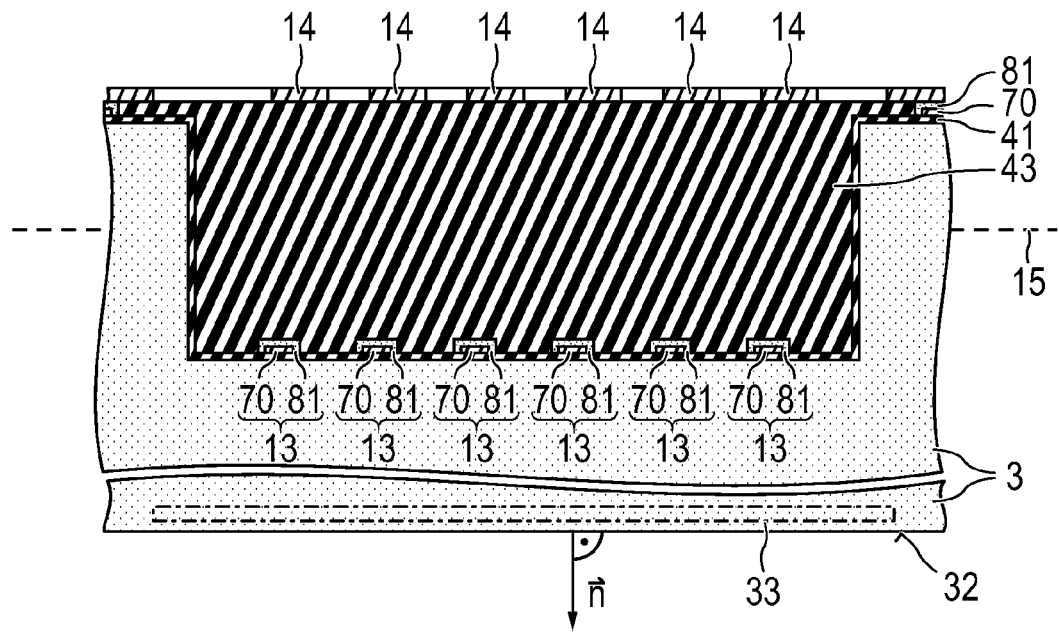
Figure 12E:
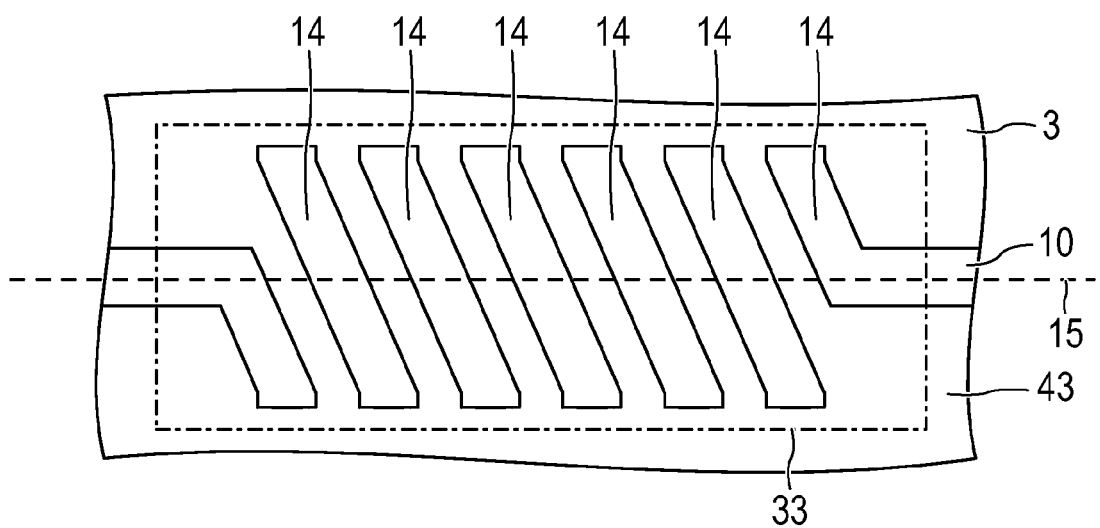

In a further step illustrated in FIGS. 11E and 12E, first conductor paths 14 are produced on the planarized top side of the planarized dielectric material 43 and the top ends 111, 121 such that the conductor paths 14 electrically conductively connect the U-shaped sections in series as explained above with reference to FIG. 2. For instance, suitable dielectric materials 43 include or consist of one or a combination with at least two of the following materials: silicon dioxide (SiO2), a thermal oxide, a CVD oxide, an imide, an epoxy.

The conductor paths 14 can be procuded by depositing a continous layer of conductive material, for instance a metal or a doped polycrystalline semiconductor material, on the planarized top side of the planarized dielectric material 43 and the top ends 111, 121, and by structuring the conductive material so as to obtain the required number of conductor paths 14.

Referring now to FIGS. 13A to 13K and 14A to 14K, a third method for producing a semiconductor component with a monolithically integrated coil will be explained. In that third method, the first U-shaped electrically conductive sections, i.e. the two first vertical sections 11, 12 and the first connection section 13, are formed by electroplating a seed layer. FIG. 14x (x=A . . . K) corresponds to FIG. 13x and is a cross-sectional view if there is a cross-sectional plane marked in FIG. 13x, and a top view otherwise.

In the third method, an arrangement as illustrated in FIGS. 9F and 10F is produced in the same manner as described with reference to FIGS. 9A to 9F and 10A to 10F but without depositing the electrically conductive layer 70 on the barrier layer 60. The respective arrangement is illustrated in FIGS. 13A and 14A.

Figure 13D:
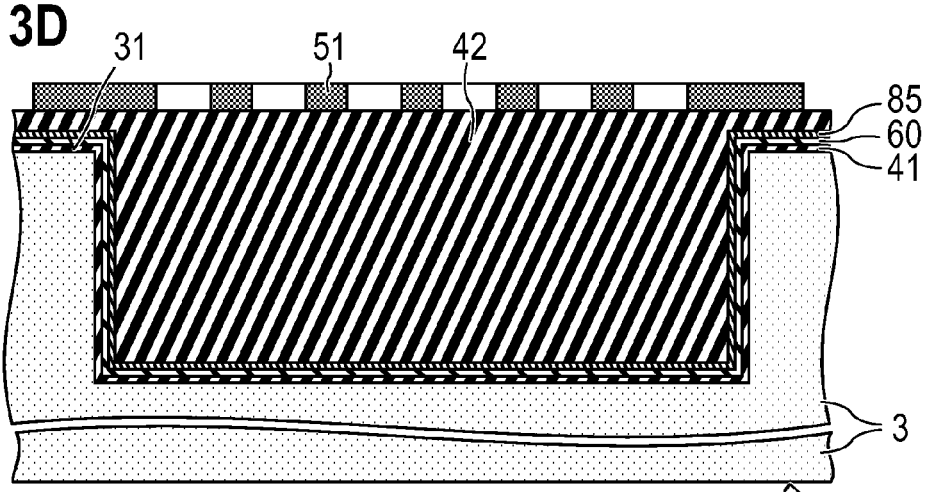
Figure 13E:
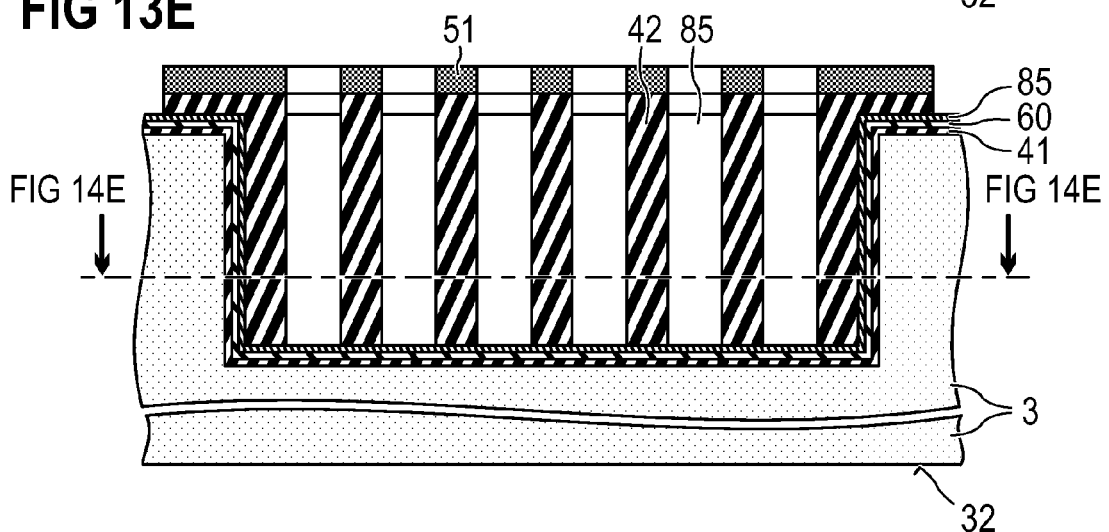
Figure 13F:
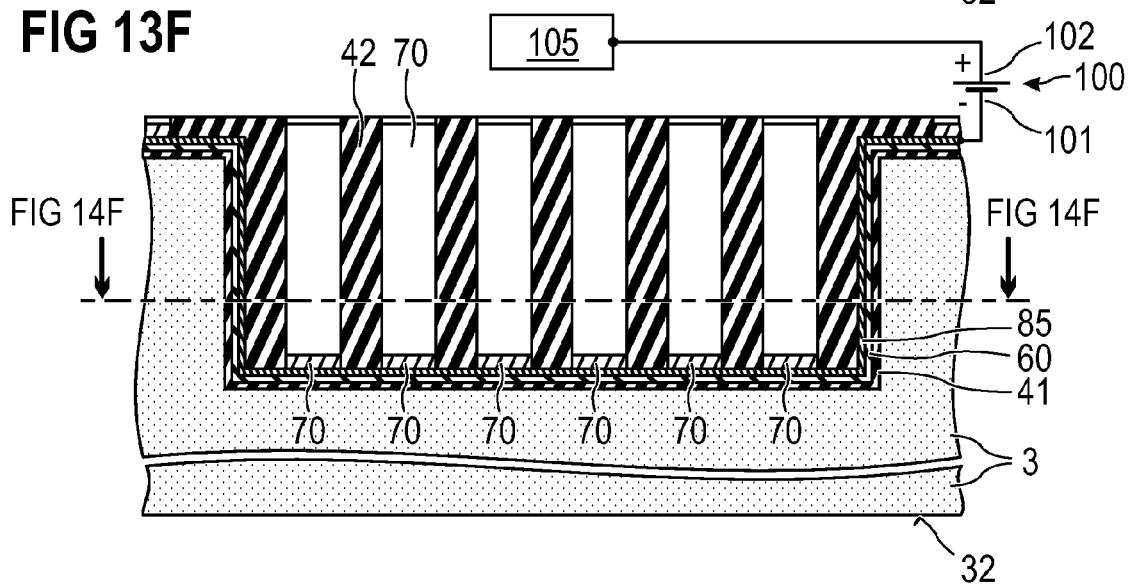
Figure 13G:
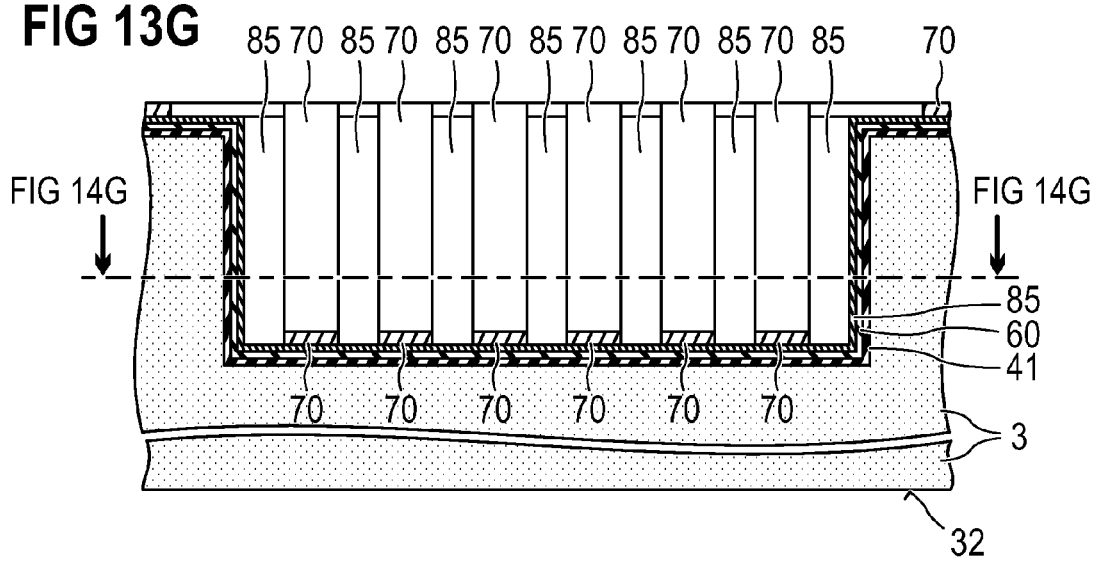
Figure 14A:
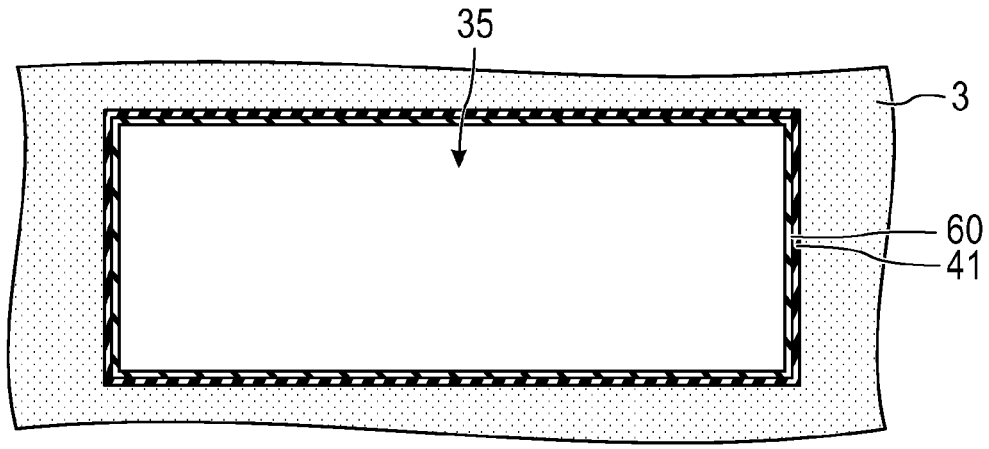
FIGS. 14A to 14H and 14J to 14K are top views or horizontal cross-sections of the device illustrated in FIGS. 13A to 13H and 13J to 13K.
Figure 14B:
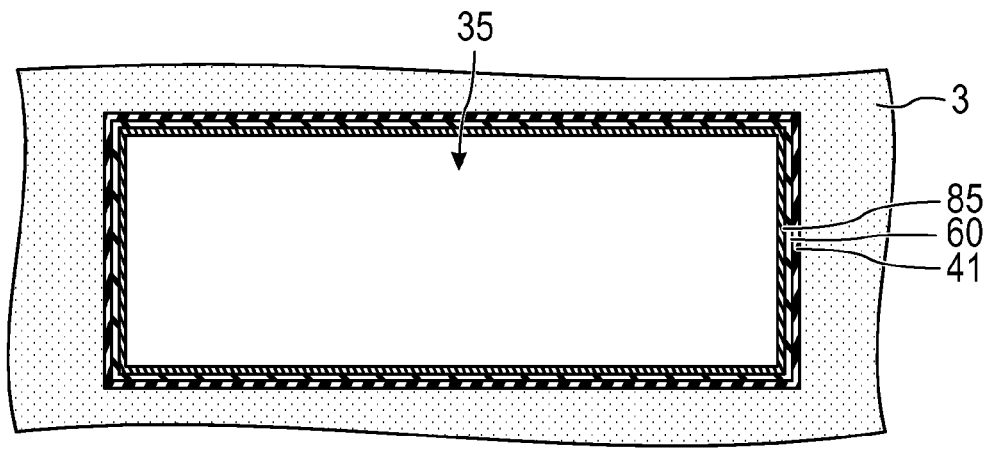

A contiuous diffusion barrier, for instance TiW (titanium tungsten) with a thickness from 20 nm to 500 nm, and a metallic seed layer 85 with a thickness of, for instance, 20 nm to 500 nm, is deposited on the dielectric layer 41, see FIGS. 13B and 14B. For instance, the seed layer 85 may include or consist of one or a combination with at least two of the following metals: chromium (Cr), copper (Cu), nickel (Ni), palladium (Pd).

Figure 14C:
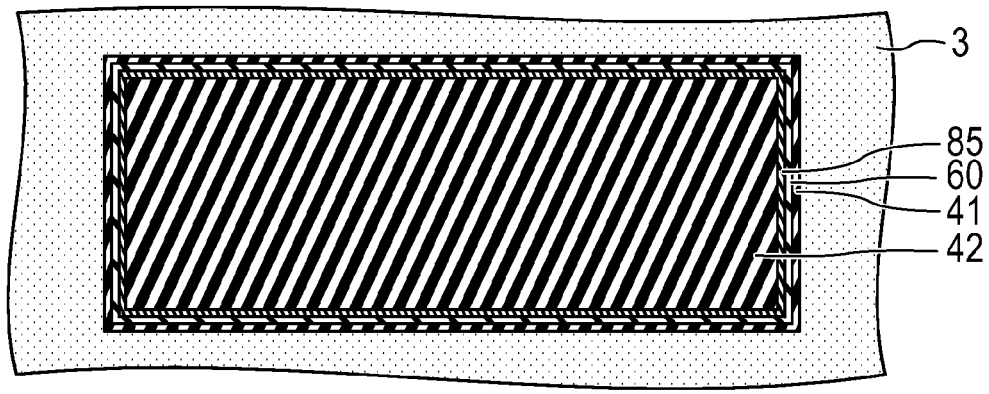
Figure 14D:
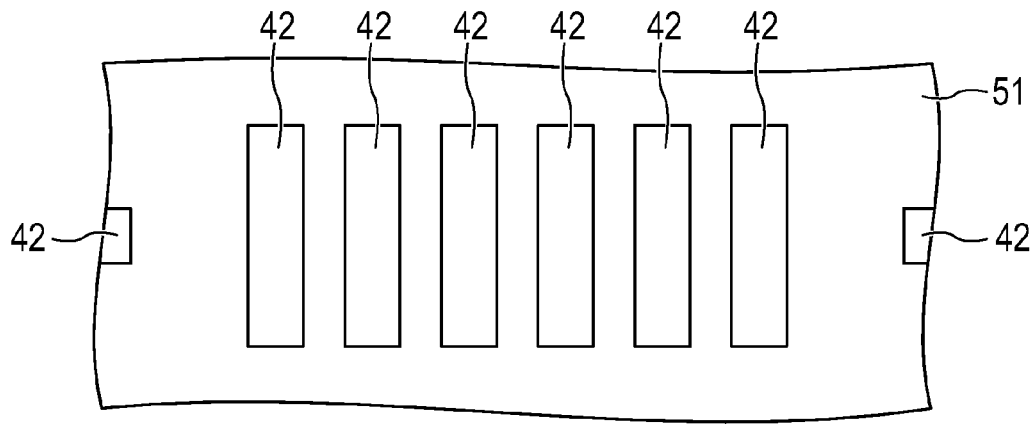
Figure 14E:
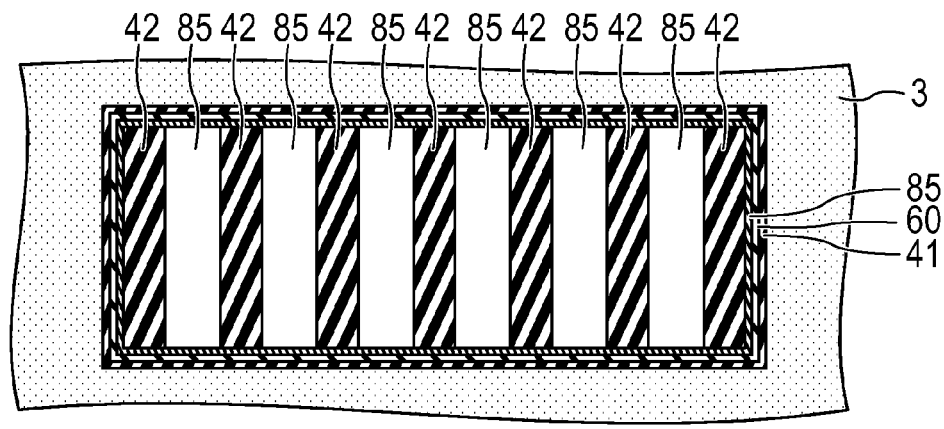
Figure 14F:
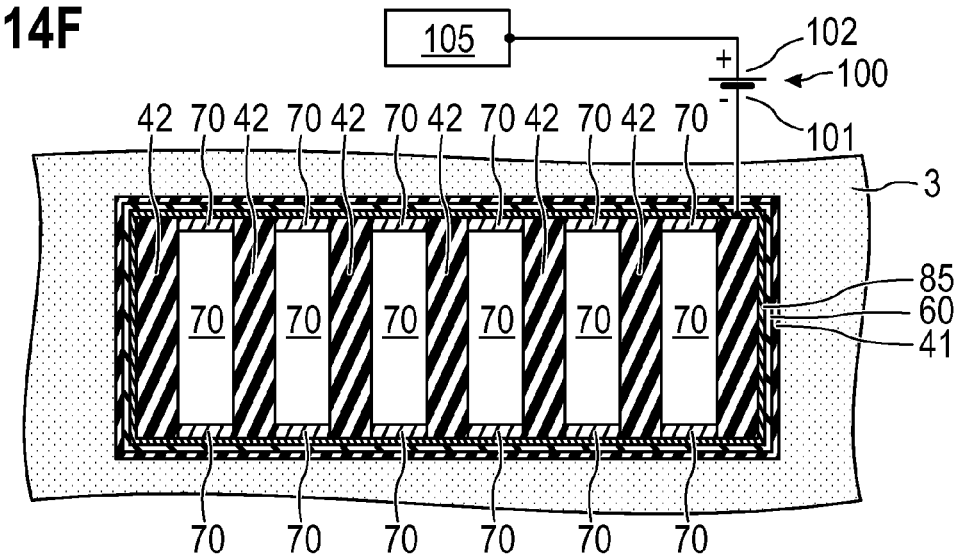
Figure 14G:
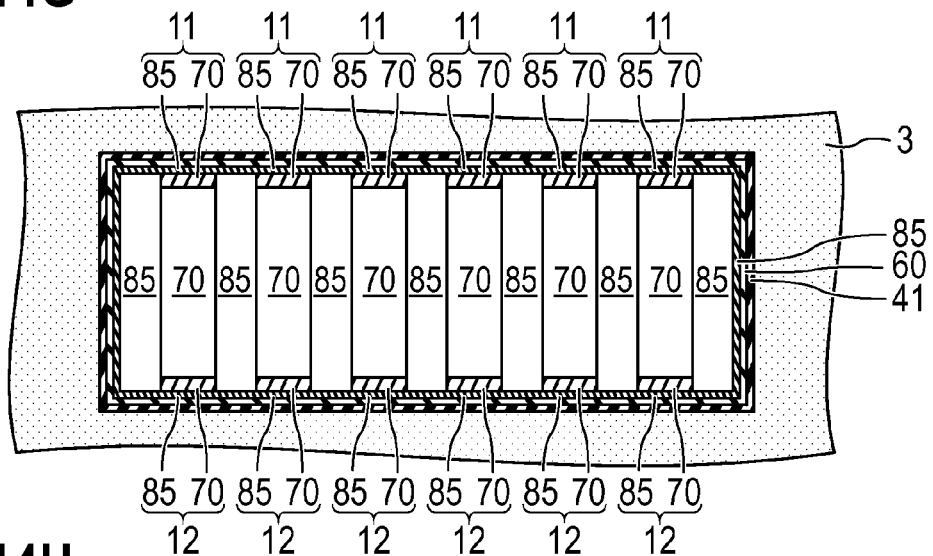

In a subsequent step illustrated in FIGS. 13C and 14C, the remaining trench 35 is completely filled or overfilled with a mask material 42. Then, the top side of the mask material 42 is planarized and, as illustrated in FIGS. 13D and 14D, a photoresist layer 51 is formed on the planarized mask material 42 and photolithographically structured. The structured photoresist layer 51 is then used as a mask for anisotropically etching the mask material 42. Anisotropically etching the mask material 42 is performed selectively with regard to the seed layer 85. That is, no or substantially no material of the seed layer 85 is removed. The result is a structured mask layer, see FIGS. 13E and 14E, which is used as a mask in a subsquent electroplating process illustrated in FIGS. 13F and 14F. Optionally, the structured photoresist layer 51 may be removed.

For electroplating, the arrangement is immersed into a solution which includes ions of the metal with which the seed layer to be electroplated. Electroplating takes place using a DC power supply 100 with a negative pole 101 and a positive pole 102. The negative pole 101 is electrically conductively connected to the continuous seed layer 85, the positive pole to an anode 105. Optionally, the anode 105 may include or consist of the metal to be electroplated on the seed layer 85. The voltage provided by the DC power supply 100 causes the positive charged metal ions to move toward and to coat the seed layer 85 in regions where it is not covered with the mask material 42, thereby forming a structured metalliziation 70 on the continuous seed layer 85. After electroplating is completed, the mask material 42 is removed, see FIGS. 13G and 14G. Then, the continous seed layer 85 including the underlying diffusion barrier layer 60 is structured by overetching of the seed layer 85 and the barrier layer 60 using the structured metalliziation 70 as a mask. That is, a small amount of the structured metalliziation 70 is also etched away.

Figure 13H:
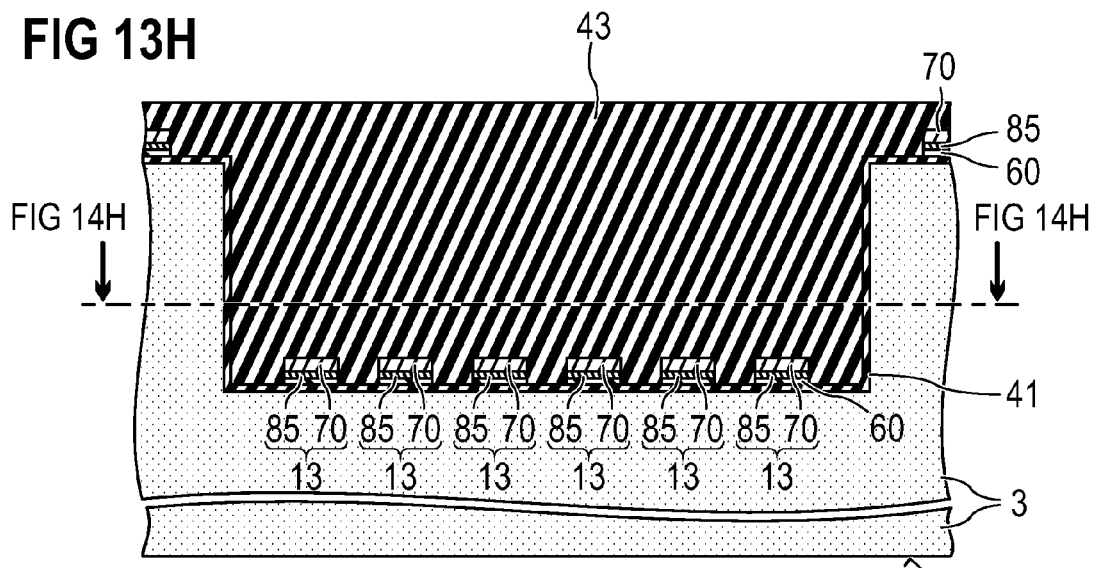
Figure 13J:
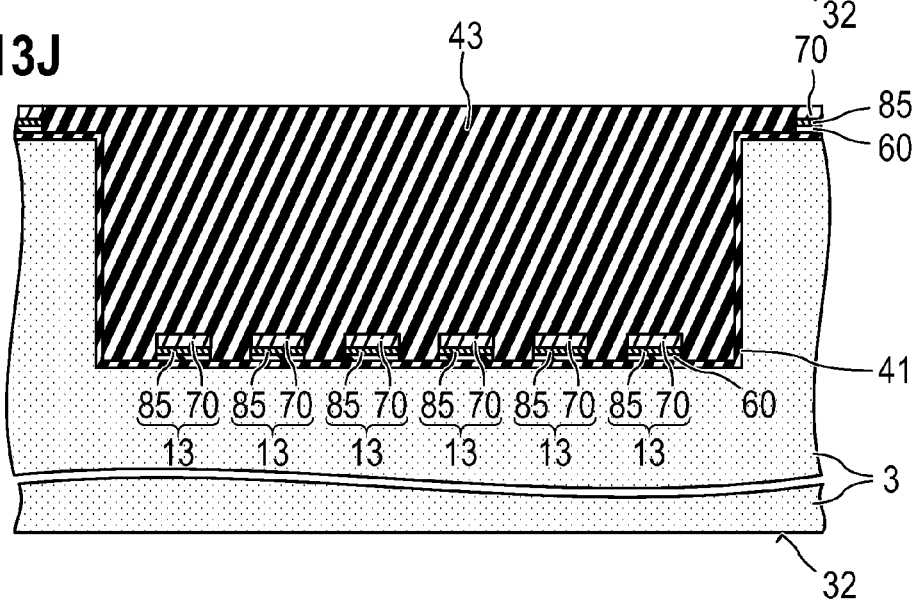
Figure 14H:
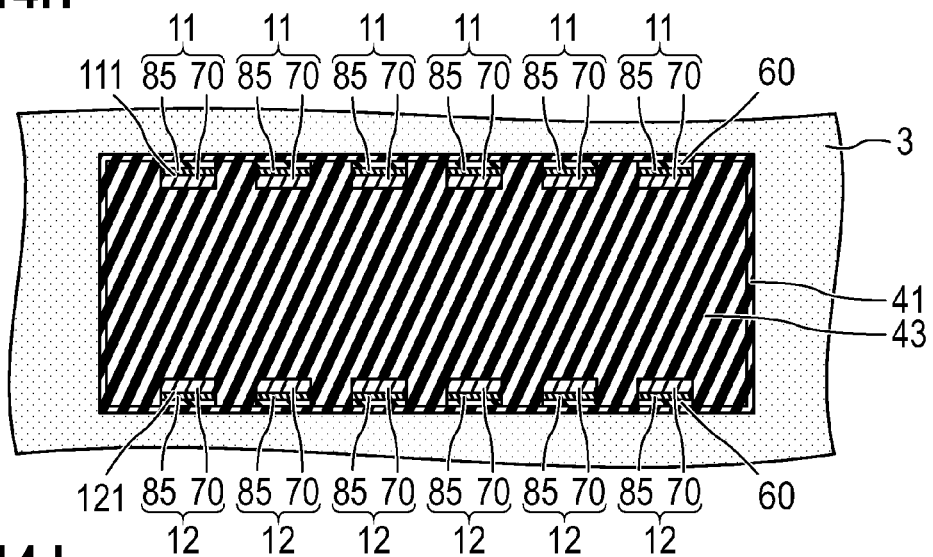
Figure 14J:
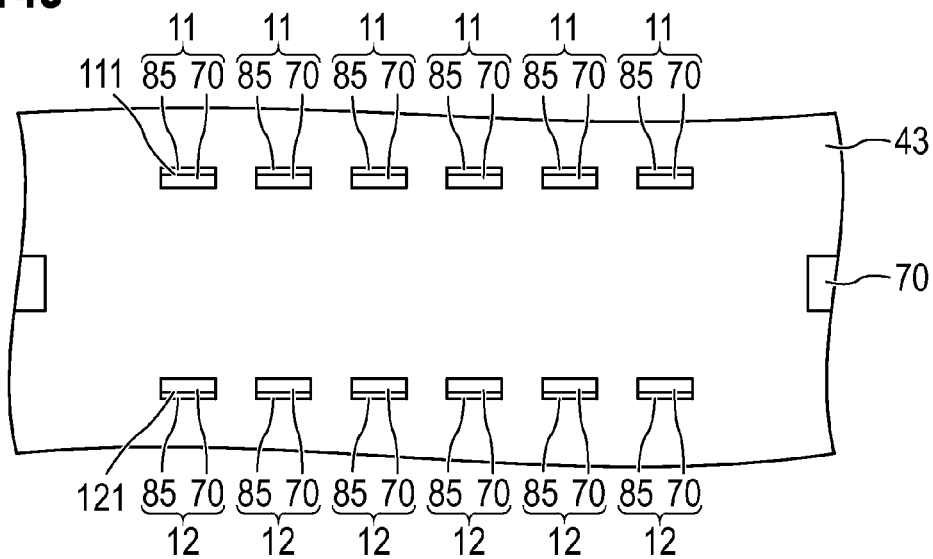

Then, as illustrated in FIGS. 13H and 14H, the trench is again filled or overfilled with a dielectric material 43 which is subsequently planarized on its top side such that the top ends 111 and 121 of the first vertical sections 11 and 12, respectively, are exposed, see FIGS. 13J and 14J.

Figure 14K:
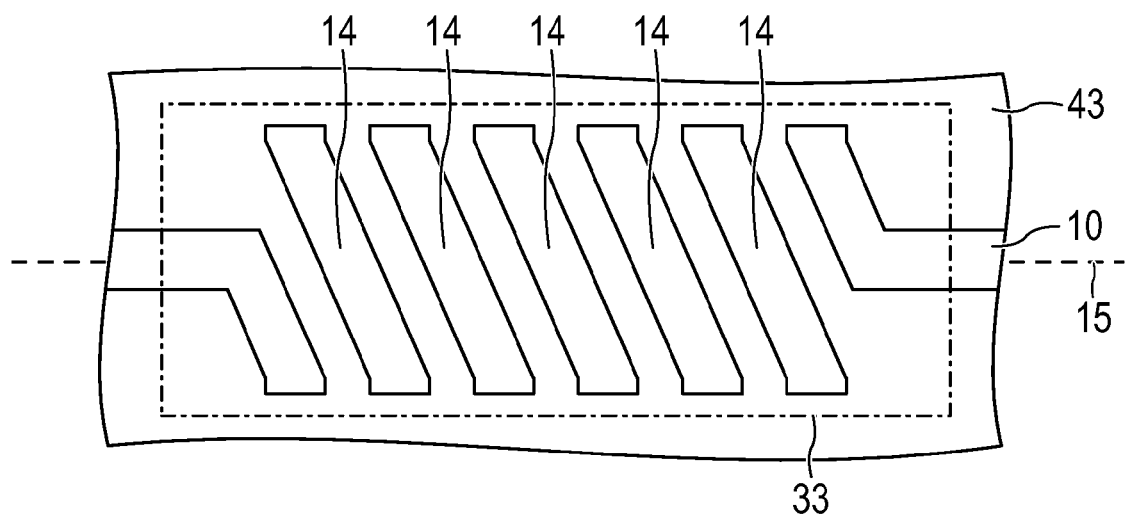

In a further step illustrated in FIGS. 13K and 14K, first conductor paths 14 are produced on the planarized top side of the planarized dielectric material 43 and the top ends 111, 121 such that the conductor paths 14 electrically conductively connect the U-shaped sections in series as explained above with reference to FIG. 2. For instance, suitable dielectric materials 43 include or consist of one or a combination with at least two of the following materials: silicon dioxide (SiO2), a CVD oxide, an epoxy, an imide.

Figure 15A:
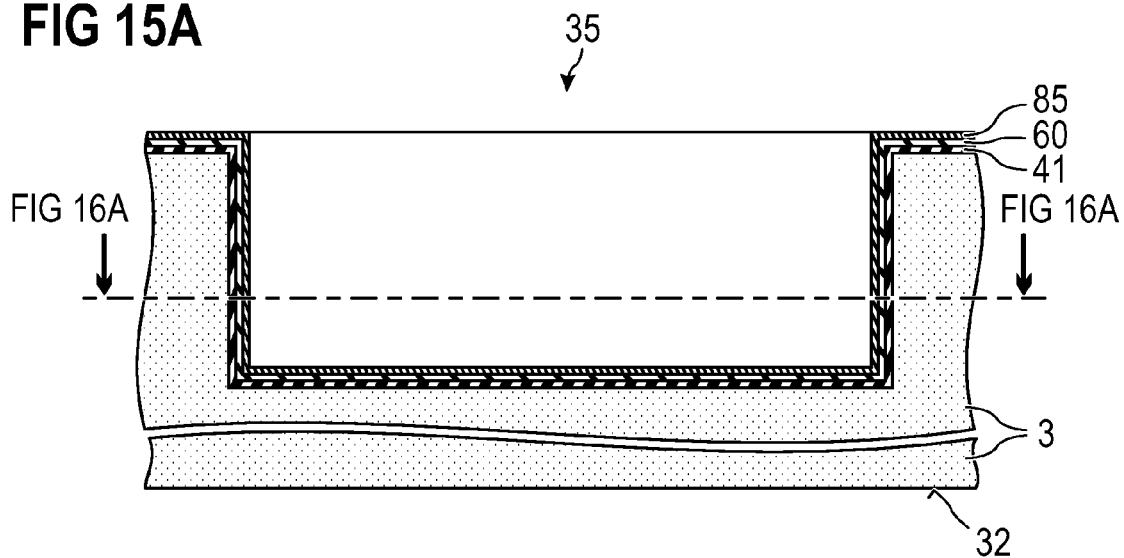

Referring now to FIGS. 15A to 15J and 16A to 16J, a fourth method for producing a semiconductor component with a monolithically integrated coil will be explained. In that fourth method, the first U-shaped electrically conductive sections, i.e. the two first vertical sections 11, 12 and the first connection section 13, are formed by electroless (i.e. non-galvanic) plating of a seed layer. FIG. 16x (x=A . . . J) corresponds to FIG. 15x and is a cross-sectional view if there is a cross-sectional plane marked in FIG. 15x, and a top view otherwise.

In the fourth method, an arrangement as illustrated in FIGS. 13B and 14B is produced in the same manner as described with reference to FIGS. 13A to 13B and 14A to 14F. The respective arrangement is also illustrated in FIGS. 15A and 16A, respectively.

Figure 15B:
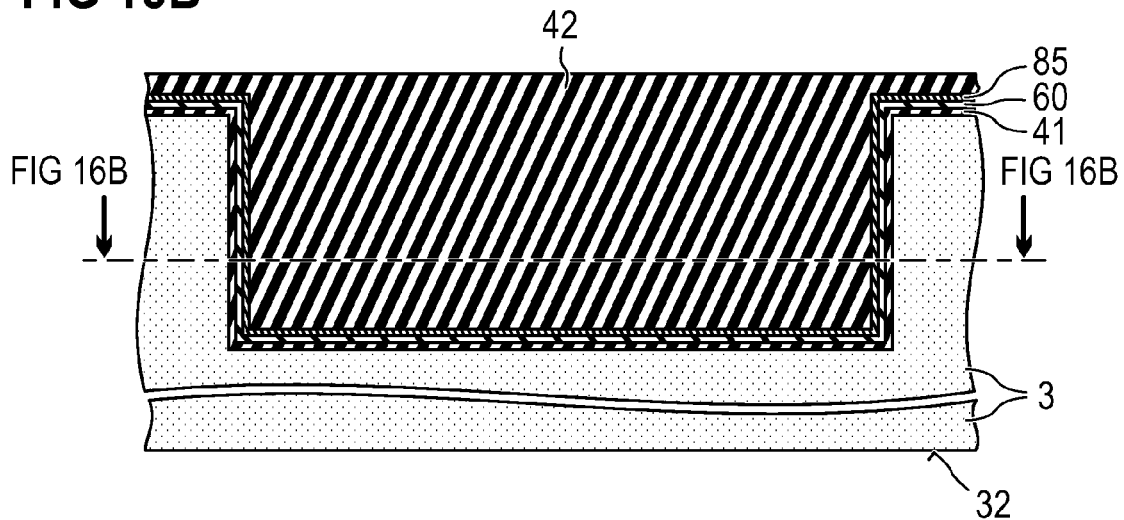
Figure 15C:
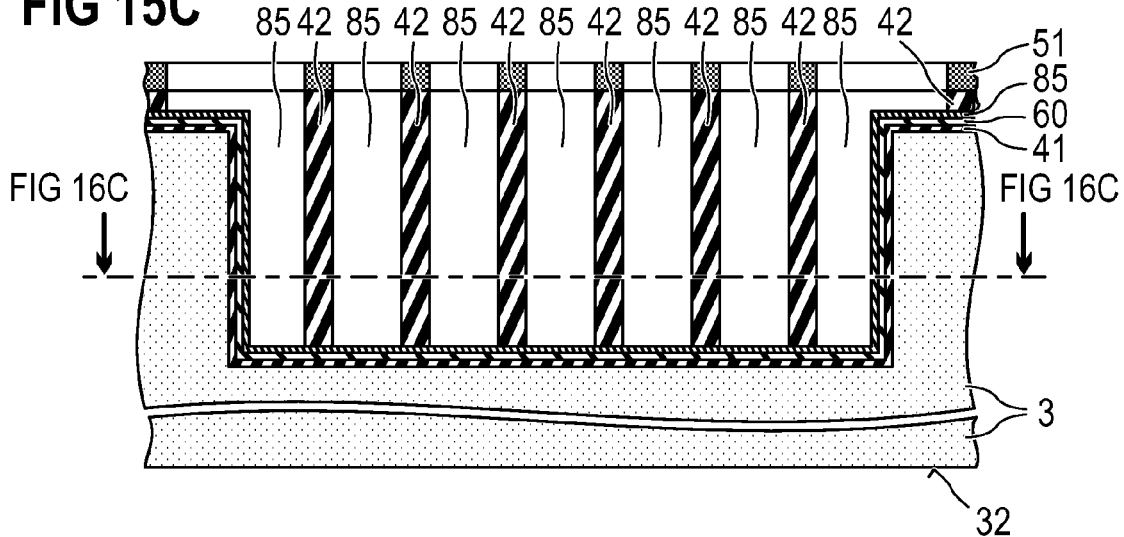
Figure 16A:
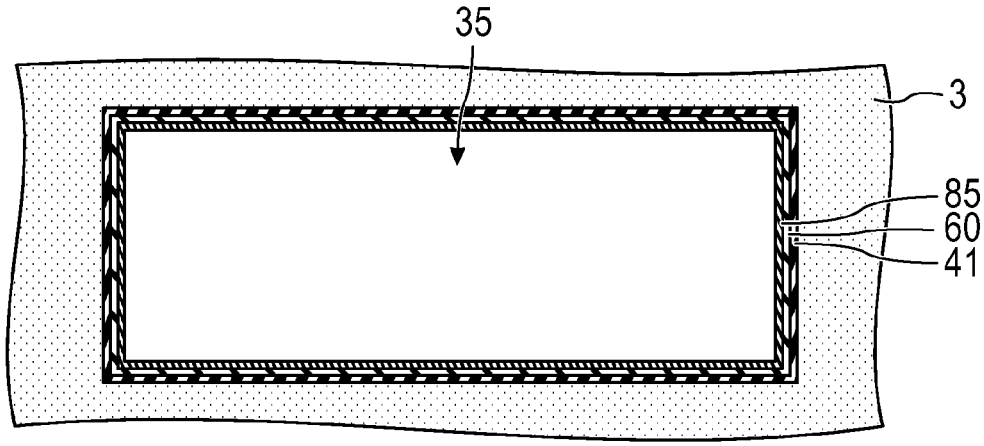
FIGS. 16A to 16H and 16J are top views or horizontal cross-sections of the device illustrated in FIGS. 15A to 15H and 15J.
Figure 16B:
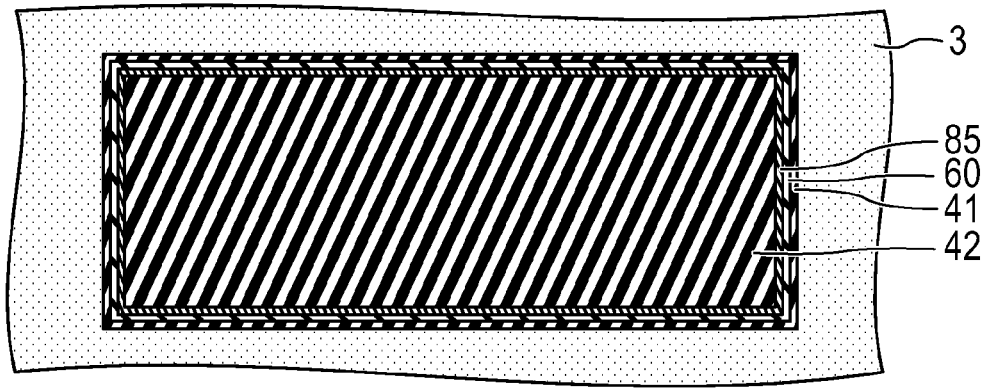
Figure 16C:
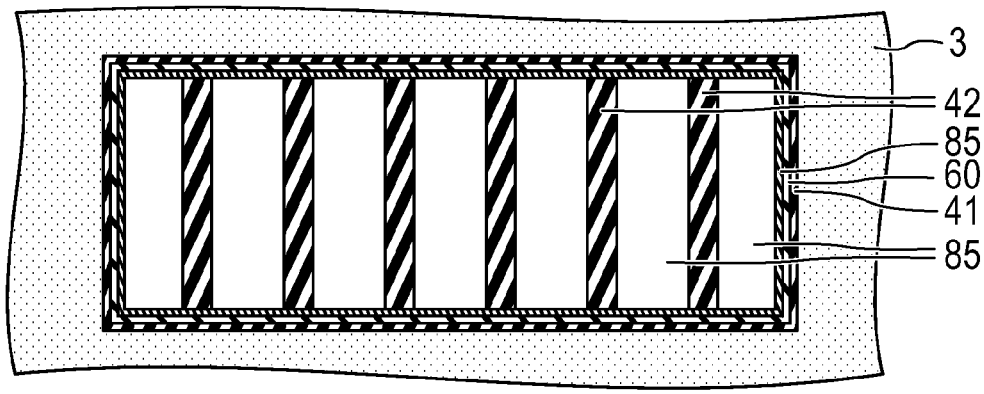
Figure 16D:
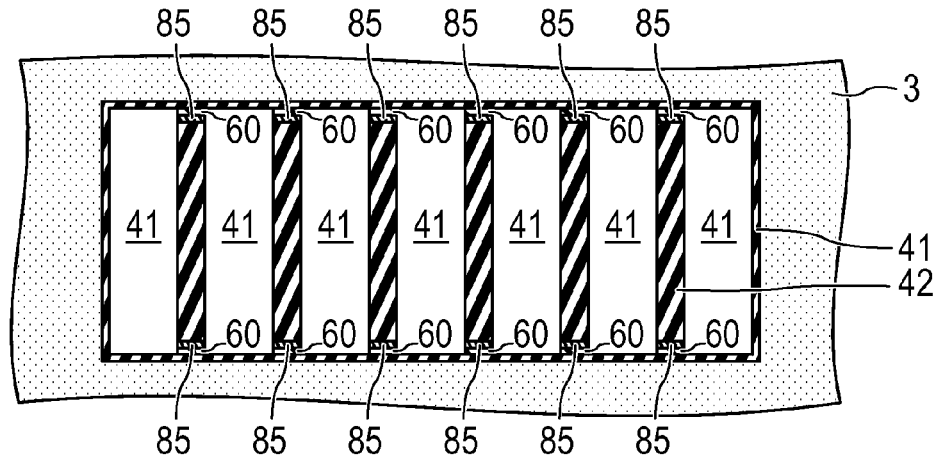

In a subsequent step illustrated in FIGS. 15B and 16B, the remaining trench 35 is completely filled or overfilled with a mask material 42, for instance an oxide, an imide, a photoresist, an isolator, or carbon. Then, the top side of the mask material 42 is planarized and a photoresist layer 51 is formed on the planarized mask material 42 and photolithographically structured. Then, the structured photoresist layer 51 is used as a mask for anisotropically etching the mask material 42, see FIGS. 15C and 16C. Anisotropically etching the mask material 42 is performed selectively with regard to the seed layer 85. That is, no or substantially no material of the seed layer 85 is removed. As a result, a structured mask layer 42 overlays the continuous seed layer 85.

The structured mask layer 42 is used as a mask in a subsquent etching process in which the seed layer 85 and the underlying barrier layer 60 is etched away in regions where it is not covered with the mask material 42 (FIG. 15D). The etching, which may be isotropic or anisotropic, is performed selectively with regard to the barrier layer 60. That is, no or substantially no material of the barrier layer 60 is removed. Optionally, the structured photoresist layer 51 may be removed prior to or during the etching of the seed layer 85.

Figure 16E:
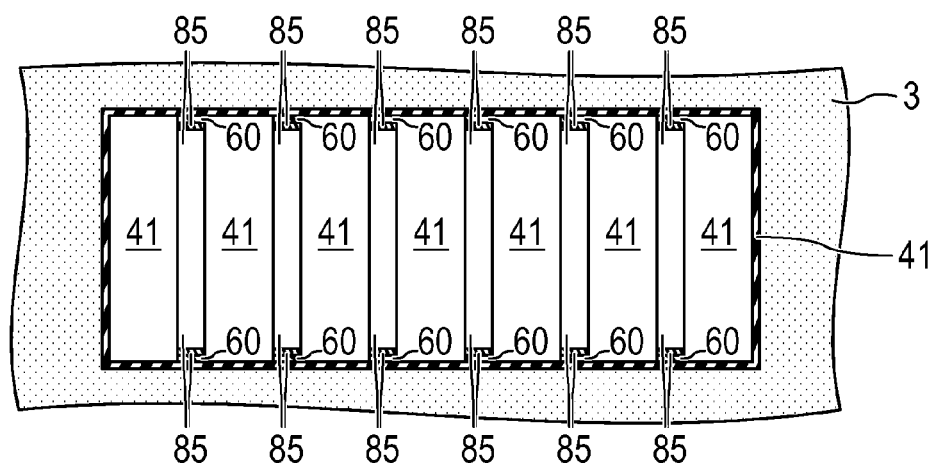
Figure 16F:
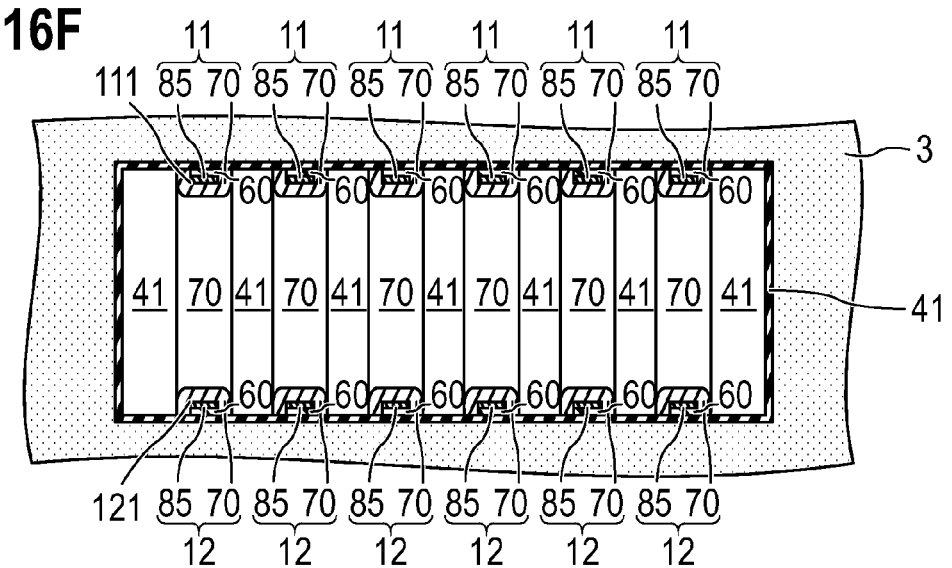

After the etching of the seed layer 85 is completed, the mask material 42 is removed as illustrated in FIGS. 15E and 16E and the structured seed layer 85 is exposed.

In order to accomplish electroless (i.e. non-galvanic) plating of the structured seed layer 85 with a plating metal, the arrangement is immersed into a conventional plating solution that contains the plating metal. During electroless plating, the surface of the structured seed layer 85 but not the surface of the dielectric layer 41 is plated with the plating metal 70. After electroless plating is completed, see FIGS. 15F and 16F, a partly completed coil as described with reference to FIG. 1 is present. The partly completed coil has electrically conductive first U-shaped sections each including two first vertical sections 11, 12, and a first connection section 13. Each first U-shaped section includes a U-shaped section of the structured seed layer 85 and an overlying U-shaped section of the plating metal 70.

Figure 15G:
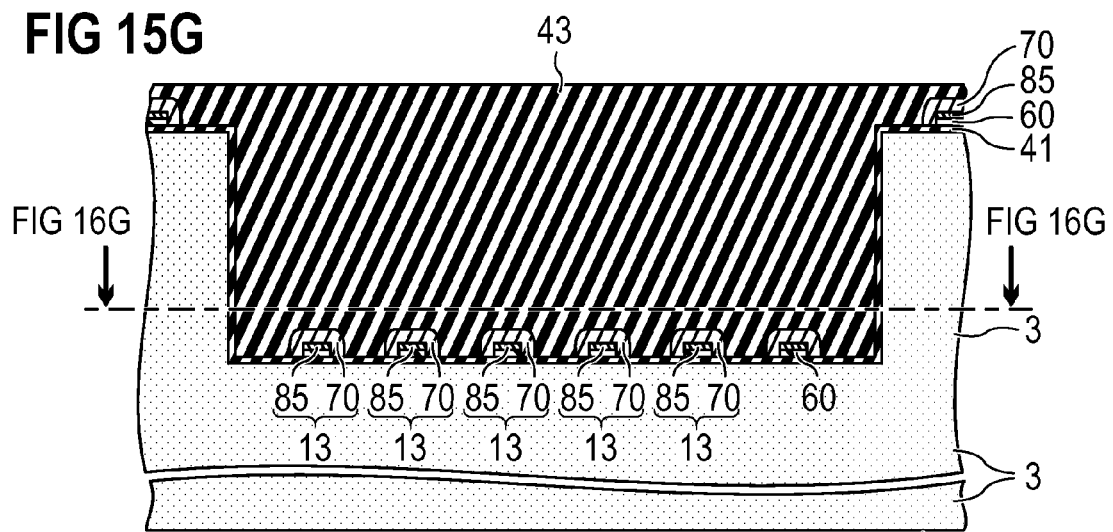
Figure 15H:
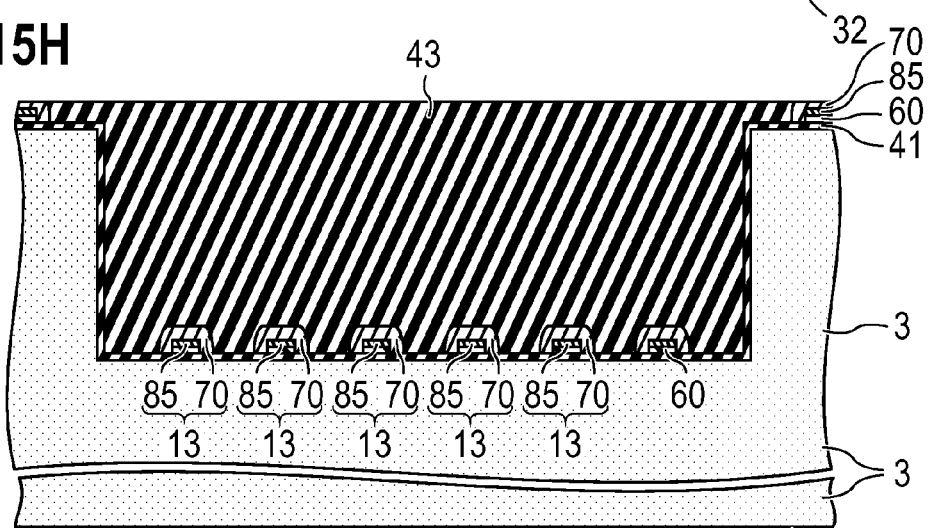
Figure 16G:
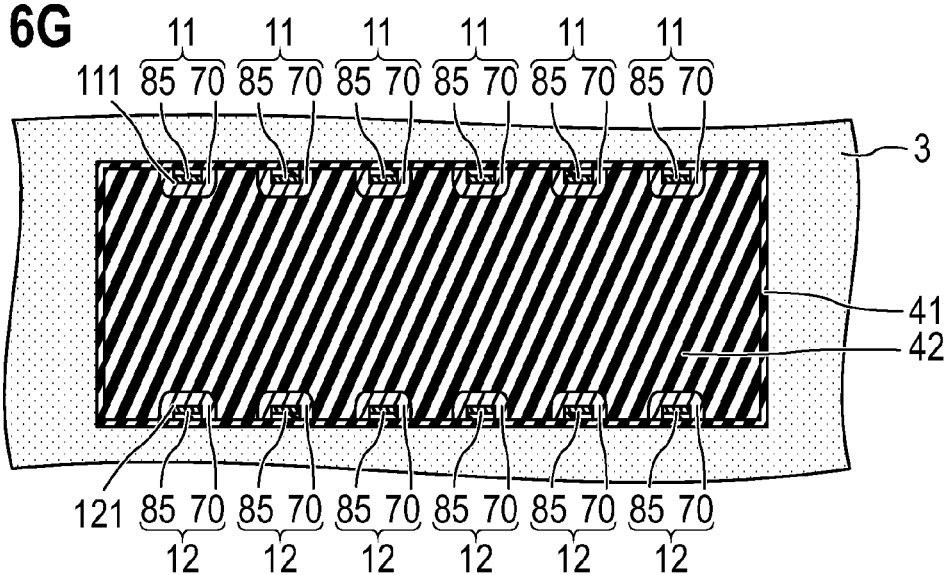
Figure 16H:
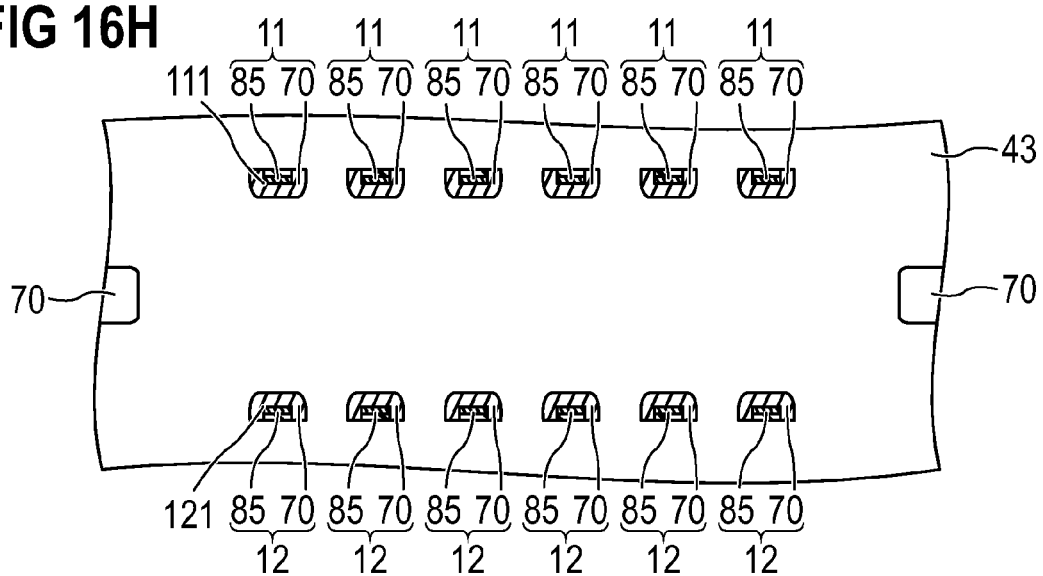

Then, as illustrated in FIGS. 15G and 16G, the trench is again filled or overfilled with a dielectric material 43 which is subsequently planarized on its top side such that the top ends 111 and 121 of the first vertical sections 11 and 12, respectively, are exposed, see FIGS. 15H and 16H.

Figure 15J:
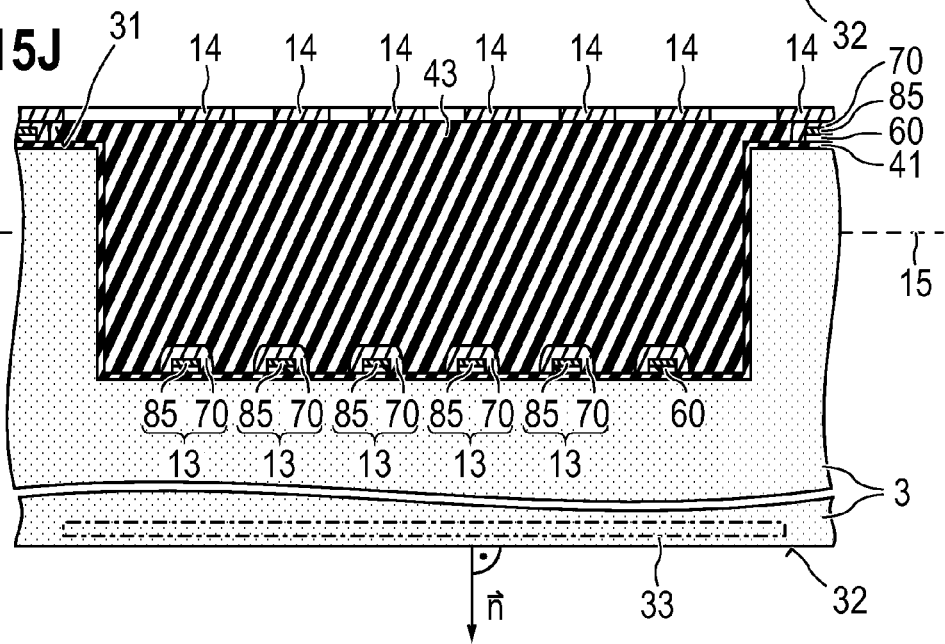
Figure 16J:
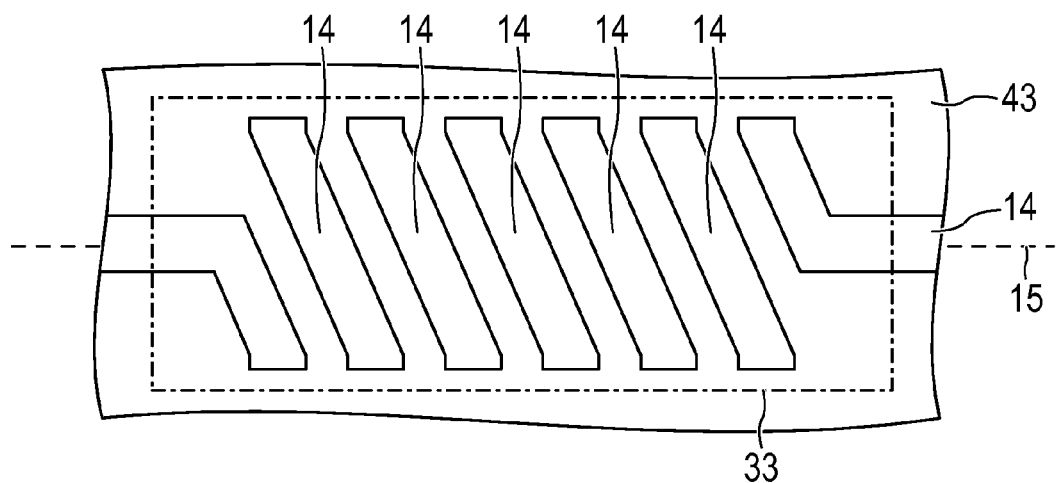

In a further step illustrated in FIGS. 15J and 16J, first conductor paths 14 are produced on the planarized top side of the planarized dielectric material 43 and the top ends 111, 121 such that the conductor paths 14 electrically conductively connect the U-shaped sections in series as explained above with reference to FIG. 2. For instance, suitable dielectric materials 43 include or consist of one or a combination with at least two of the following materials: silicon dioxide (SiO2), a CVD oxide, an epoxy, an imide.

Figure 17A:
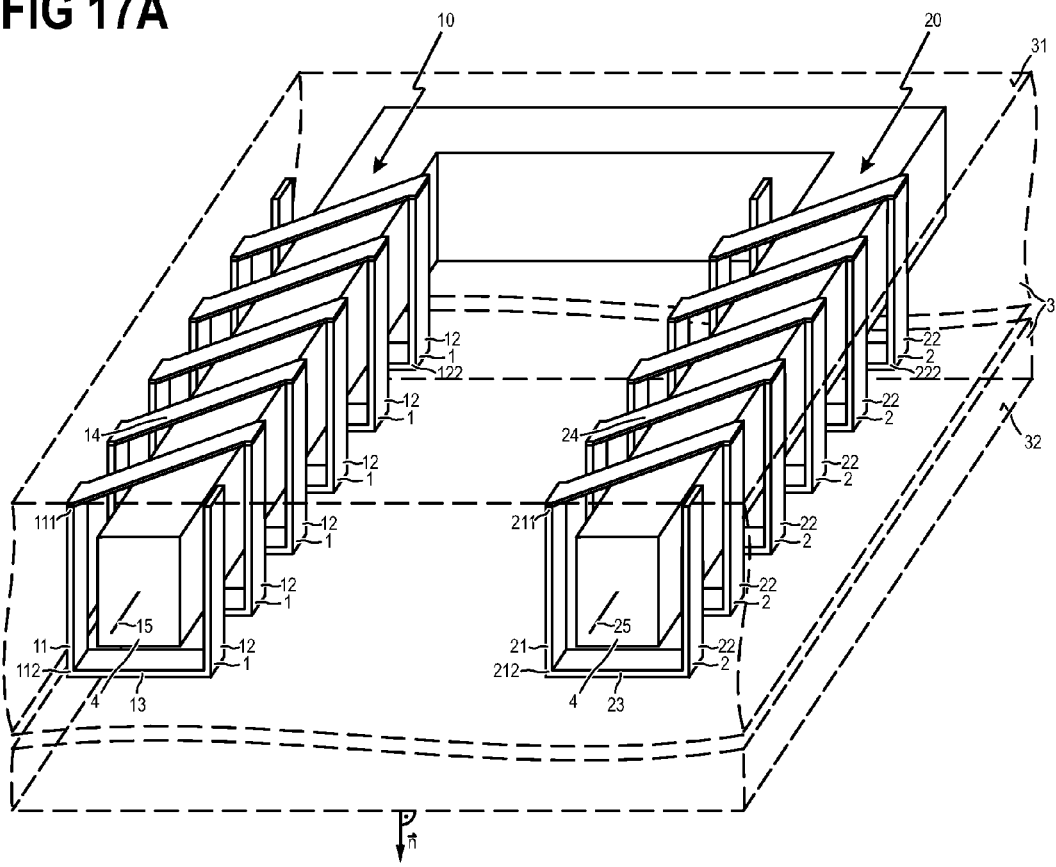
FIG. 17A is a perspective view of a first and second coil which share a common magnetic core.
Figure 17B:
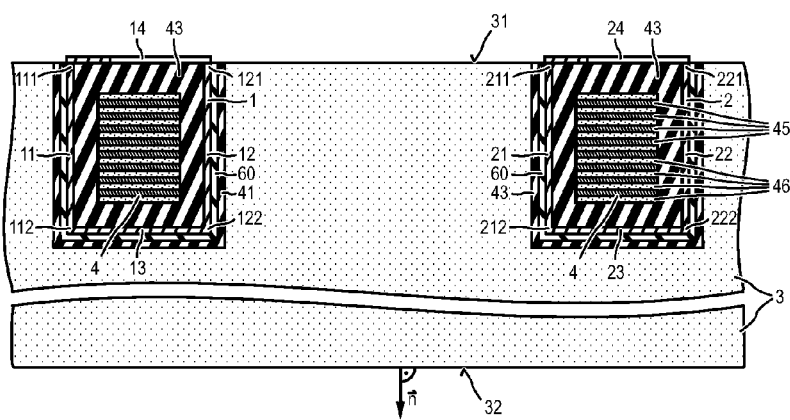
FIG. 17B is a cross-sectional view of the arrangement of FIG. 17A.

Referring now to FIG. 17A, there is illustrated a perspective view of a first coil 10 sharing a common magnetic core 4 with a second coil 20. A cross-sectional view is shown in FIG. 17B. Different from the arrangements of FIGS. 4 and 8, the windings 1 of the first coil 10 and the windings 2 of the second coil 20 do not enclose a common volume. In other words, the first coil 10 and the second coil 20 are arranged adjacent to one another. This allows for the first and second coils 10, 20 to be produced simultaneously, in particular with one of the methods described above.

As describe above, a magnetic core 4 used as a core of a first and/or second coil 10, 20 may be made of a magnetic or ferromagnetic or ferrimagnetic material which is homogeneously distributed over the magnetic core 4. Alternatively, as illustrated in FIG. 17B, a magnetic core 4 may have a layered structure with a number of magnetic or ferromagnetic layers 45 which are electrically insulated from one another by intermediate dielectric or low-ohmic layers 46 in order to avoid or reduce eddy currents. For instance, the ferromagnetic layers 45 may consist of or include nickel (Ni), iron (Fe), or a mixture of nickel (Ni) and iron (Fe), or of a ferro- or ferrimagnetic metal powder, which is embedded in dielectric isolation components.

According to the present invention, a magnetic core 4 having as described in the above embodiments, i.e. having either a layered or a homogeneous structure, may be used as a core of a single coil 10, for instance, if the single coil 10 is used as an inductivity, or as a common core with at least two coils 10, 20. In the latter case, the at least two coils 10, 20 and the magnetic core 4 may form a transformer if two of the coils 10, 20 are electrically insulated from one another. Generally, any arrangement with only one coil 10 or with at least two coils 10, 20 may be used with a magnetic core 4 inserted in the coil(s) 10, 20, or without a magnetic core 4. In the sense of the present invention, a coil 10, 20 is regarded to not include a magnetic core 4 if the interior of the coil 10, 20 has a relative magnetic permeability $\mu_r$ of about 1 and/or of less than 1. If a magnetic core 4 is provided, such a core may include a cavity, which, for instance, may be surrounded by the dielectric 43 (see FIGS. 9M, 9N, 9P, 10M, 10N, 10P, 13H, 13J, 13K, 14H, 14J, 14K, 15G, 15H, 15J, 16G, 16H, 16J).

Figure 18:
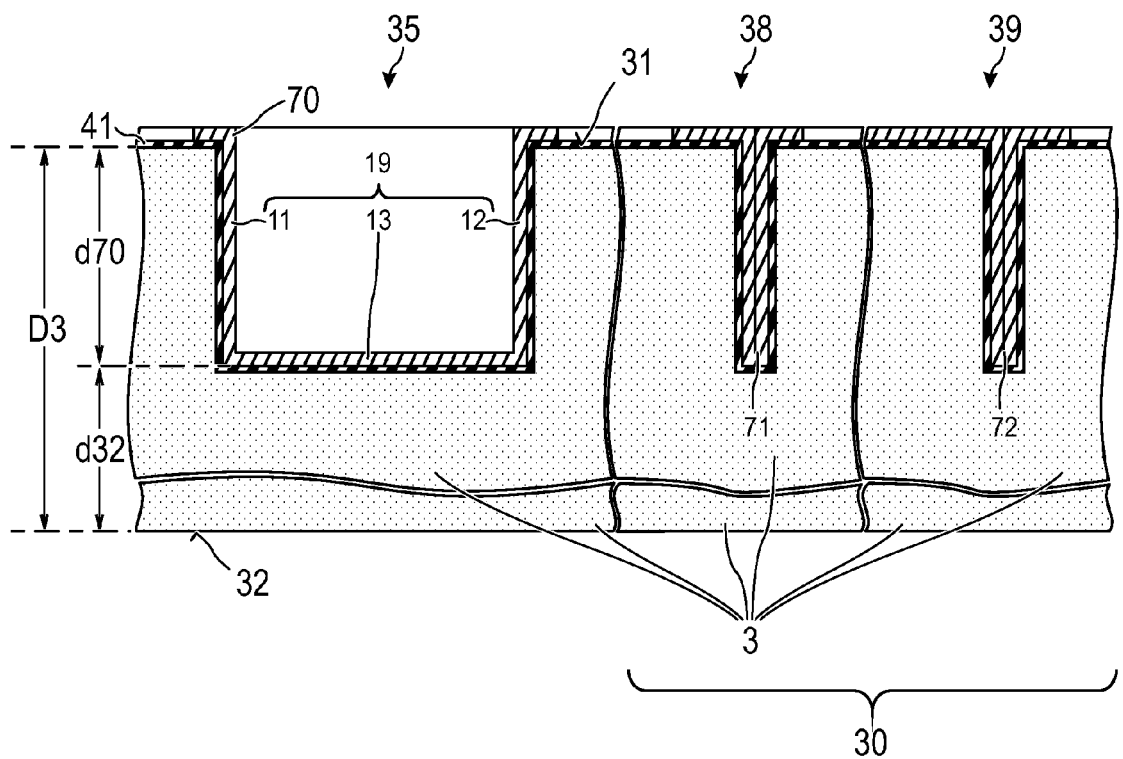
FIG. 18 is a cross-sectional view of a semiconductor body with a monolithically integrated transistor and a monolithically integrated first coil.

The semiconductor body 3 of any of the coils and arrangements described above may, in addition to the at least one coil 10, 20, include one or more electrically active components, for instance a field effect transistor like a MOSFET (metal oxid semiconductor field effect transistor), an IGBT (insulated gate bipolar transistor), a JFET (junction field effect transistor), a TEDFET (trench extended drain field effect transistor), a diode. An example for such an arrangement is illustrated in FIG. 18. The arrangement is not yet completed. A first coil 10 is monolithically integrated with the same semiconductor body 3 as a field effect transistor or an IGBT. The field effect transistor includes a gate electrode 71 arranged in a trench 38 and/or on a surface of the semiconductor body 3, and an optional field electrode or trench capacitor 72 arranged in a trench 39, the last of which may be electrically connected to a source electrode to be produced. Both the gate electrode 71 and the field or capacitor electrode 72 are arranged in an active region 30 of the semiconductor component and are formed from sections of the same electrically conductive layer 70 as the first (in this embodiment U-shaped) sections of the first coil 10. That is, the gate electrode 71, the field electrode 72 and the (in this example U-shaped) sections of the first coil 10 may be produced simultaneously. In addition, a second coil 20 or even more such coils may be monolithically integrated with the semiconductor body 3.

As is also illustrated in FIG. 18, a first coil 10 may be arranged distant from the bottom side 32. For instance, the distance d32 between the first coil 10 and the bottom side 32 may be at least 10 μm. Irrespective therefrom, the difference d70=D3–d32 between the thickness D3 of the semiconductor body 3 and the distance d32 may be, for instance, in the range from 1 μm to 10 μm, and/or at least 5 μm. The thickness D3 of the semiconductor body 3 may be, for instance, at least 20 μm. The thickness D3–d32 is identical to the depth d70 to which the partial windings 19 extend from the top side 31 into the semiconductor body 3. If the coils are positioned at the chip-border, they may extend as deep or deeper than the vertical drift zone of the power transistor or IGBT. Therefore, the difference D3–d32 may be in a range from 5 μm to 20 μm, to 60 μm, to 150 μm or even to 300 μm.

Figure 19A:
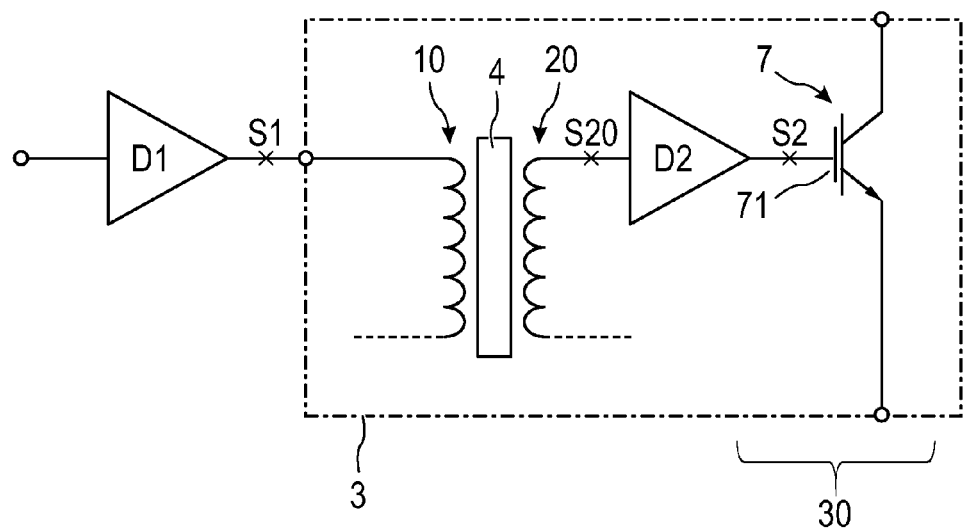
FIG. 19A is a circuit diagram of a first embodiment of a transformer and a controllable semiconductor component monolithically integrated with the same semiconductor body.

According to a further example illustrated in FIG. 19A, a transformer that includes first and second coils 10, 20 monolithically integrated with the same semiconductor body 3 as a controllable semiconductor switch 7 may be used to galvanically decouple a control signal for controlling the controllable semiconductor switch 7. To this, first and second coils 10, 20 form a transformer. The first coil 10 is dielectrically insulated from the second coil 20. The output of a first driver circuit D1 is electrically connected to the first coil 10. Hence, an output signal S1 provided by the first driver circuit D1 causes a signal S2 in the second coil 20 which is electrically connected to the input of a second driver circuit D2. The second driver circuit D2 may also be monolithically integrated with the semiconductor body 3. An output of the second driver circuit D2 is electrically connected to the gate electrode 71 of the controllable semiconductor switch 7. At its output, the second driver circuit D2 provides a signal S2 which depends on the signals S1 and S2. For instance, the signals S1, S2 and S2 may be used to continuously toggle the controllable semiconductor switch between an electrically conductive ON-state and an electrically blocking OFF-state. Such a device may be used, for instance, in inverters, rectifiers or any other power converter.

Optionally, as also illustrated in FIG. 19A, the transformer may include a core 4. Alternatively, the transformer may be coreless. Compared with a transformer that includes a magnetic core 4, a higher toggle frequency of the semiconductor switch 7 can be achieved using coreless transformer.

Figure 19B:
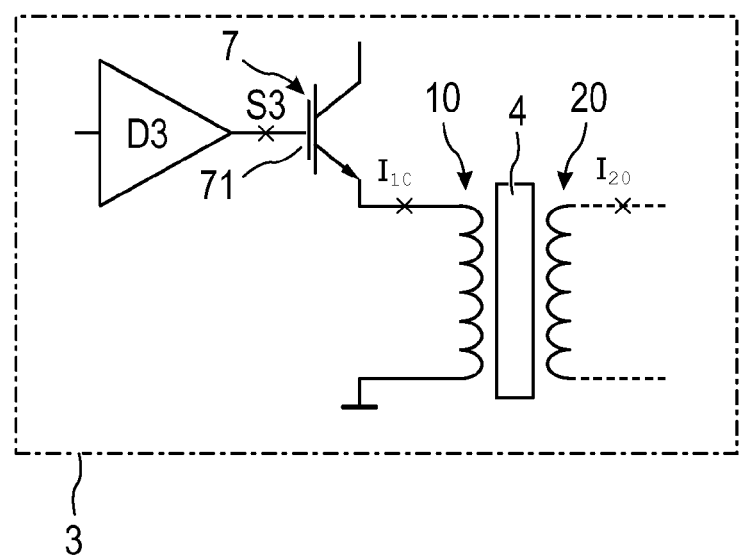
FIG. 19B is a circuit diagram of a second embodiment of a transformer and a controllable semiconductor component monolithically integrated with the same semiconductor body.

According to still a further example illustrated in FIG. 19B, a transformer that includes first and second coils 10, 20 monolithically integrated with the same semiconductor body 3 as a controllable semiconductor switch 7 may be used to galvanically decouple an output signal generated from the controllable semiconductor switch 7. Again, first and second coils 10, 20 form a transformer. The first coil 10 is dielectrically insulated from the second coil 20. The first coil 10 is electrically connected to the controllable semiconductor switch 7. An electric current $I_{10}$ through the first coil 10 can be modulated by the controllable semiconductor switch 7. Optionally, a driver circuit D3 may be used for modulating the controllable semiconductor switch 7. The driver circuit D3 may be monolithically integrated with the semiconductor body 3 or, alternatively, provided in a component separate from the semiconductor body 3. At its output, the driver circuit D3 provides a signal S3. For example, the signal S3 may be used to continuously toggle the controllable semiconductor switch 7 between an electrically conductive ON-state and an electrically blocking OFF-state.

If a further electronic component is electrically connected to the second coil 20, the further electronic component may be controlled by an electric current $I_{20}$ through the second coil 20, which electric current $I_{20}$ is caused by the electric current $I_{10}$ through the first coil 10. The further electronic component, which is galvanically decoupled from the controllable semiconductor switch 7 by the transformer, may be monolithically integrated with the semiconductor body 3 or be provided as a separate device.

Optionally, as also illustrated in FIG. 19B, the transformer may include a core 4. Alternatively, the transformer may be coreless.

In principle, instead or in addition to the controllable semiconductor switch 7, any other active semiconductor device may also be monolithically integrated in the semiconductor body 3 together with a coil 10, or together with a transformer having coils 10 and 20.

Figure 20:
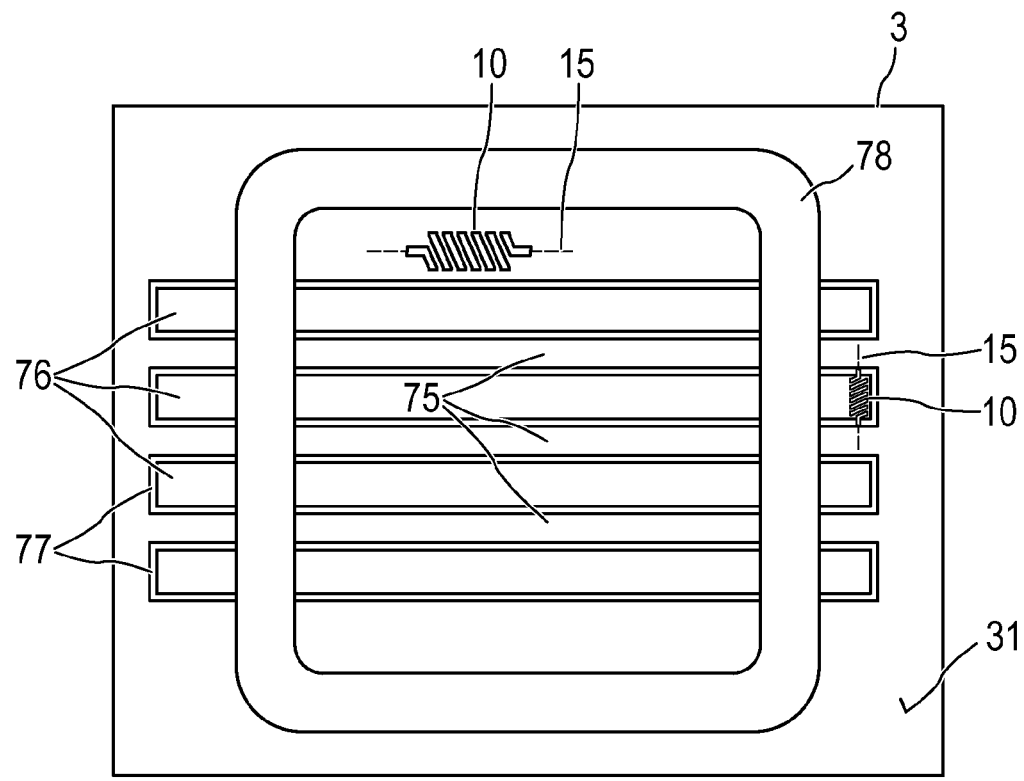
FIG. 20 shows a semiconductor component with an integrated sensing coil for detecting the electromagnetic induction of an electric current through the semiconductor component.

Referring now to FIG. 20, there is schematically illustrated a TEDFET. The structure and the functional principle of a TEDFET may be the same as of the TEDFET described in WO 2007/012490 A2. This document is incorporated by reference in the present application.

The TEDFET of FIG. 20 includes a semiconductor body 3 and has a drift zone 75 and drift control zones 76. Between each of the drift control zones 76 and the drift zone 75, a thin dielectric layer 77 is arranged. Further, a ring-shaped edge termination structure 78 surrounds an active region of the TEDFET. The edge termination structure 78 may have any conventional structure like field rings, field plates, a VLD-structure (VLD=variation in lateral doping), etc.

The TEDFET is a vertical semiconductor component, that is, the flow direction of the electric current through the drift zone 75 runs substantially perpendicular to the top and bottom sides 31, 32. Hence, a magnetic field caused by the electric current occurs in particular in the border area of the active region.

As the strength of the magnetic field is a measure for the strength of the electric current through the drift zone 75, detecting of the electromagnetic induction in an integrated sensing coil the axis of which is parallel to the magnetic field vector allows for the determination of the temporally change rate of the electric current. To this, a first coil 10 as described in the examples above may be used as a sensing coil. In FIG. 20, two of many possible ways and positions for arranging a sensing coil 10 monolithically in the semiconductor body 3 are illustrated.

A first possible position for arranging a first (sensing) coil 20 is inside the edge termination 78, for instance between an outermost drift control zone 76 and the edge termination 78. The coil axis 15 may run parallel to the top and bottom sides 31 and 32.

A second possible position is inside or outside the edge termination 78, for instance within an arbitrary one of the drift control zones 76. Here, the coil axis 15 may run parallel to the top and bottom sides 31 and 32, too.

In the previous embodiments, the first coils 10 and the second coils 20 were described to have electrically conductive first U-shaped partial windings 19. However, the invention may be realized with any other shape. Generally, a partial winding 19 is only required to have two top ends 111, 121. In each partial winding 19, the distance between the partial winding 19 and the bottom side 32 is smaller than the distances between each of its top ends 111, 121 and the bottom side 32. Regardless of the shapes of the partial windings 19 of a coil 10, 20, the coils 10, 20 may be produced with any of the methods described above and may be used either with or without a magnetic core and in the same applications as described above.

Figure 21:
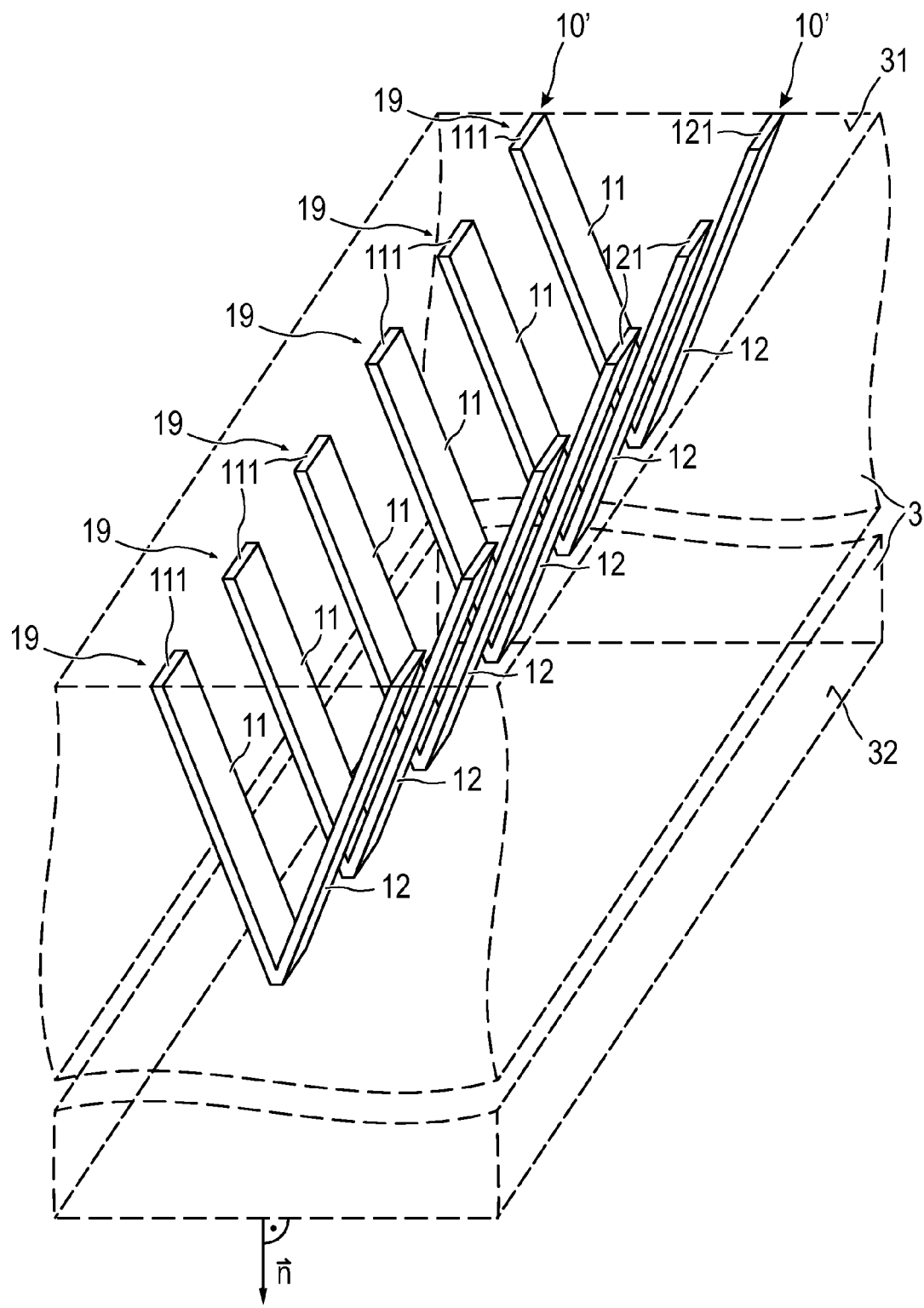
FIG. 21 is a perspective view of a number of staggered partial windings.
Figure 22:
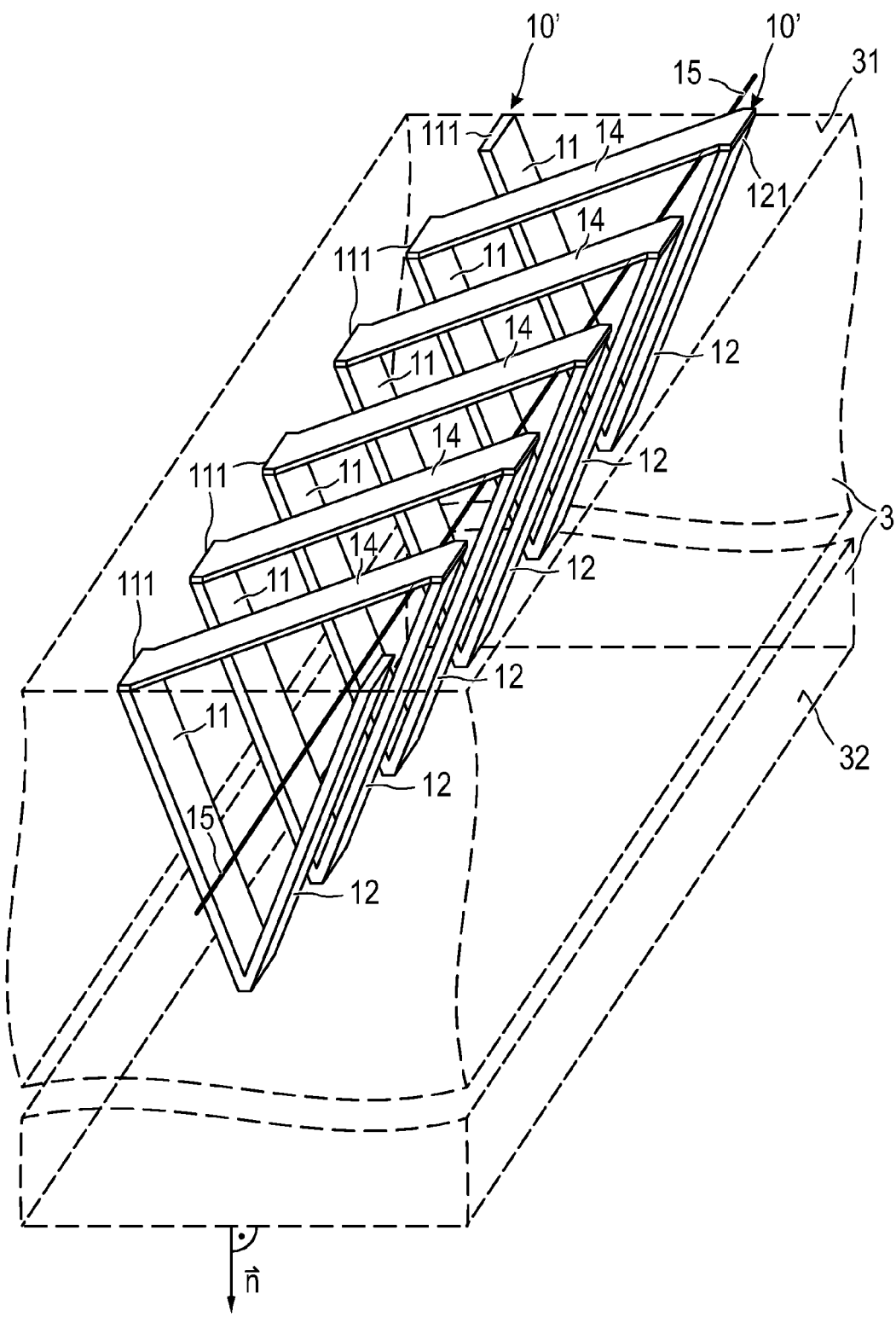
FIG. 22 is a perspective view of a first coil that has a triangular cross-section.
Figure 23:
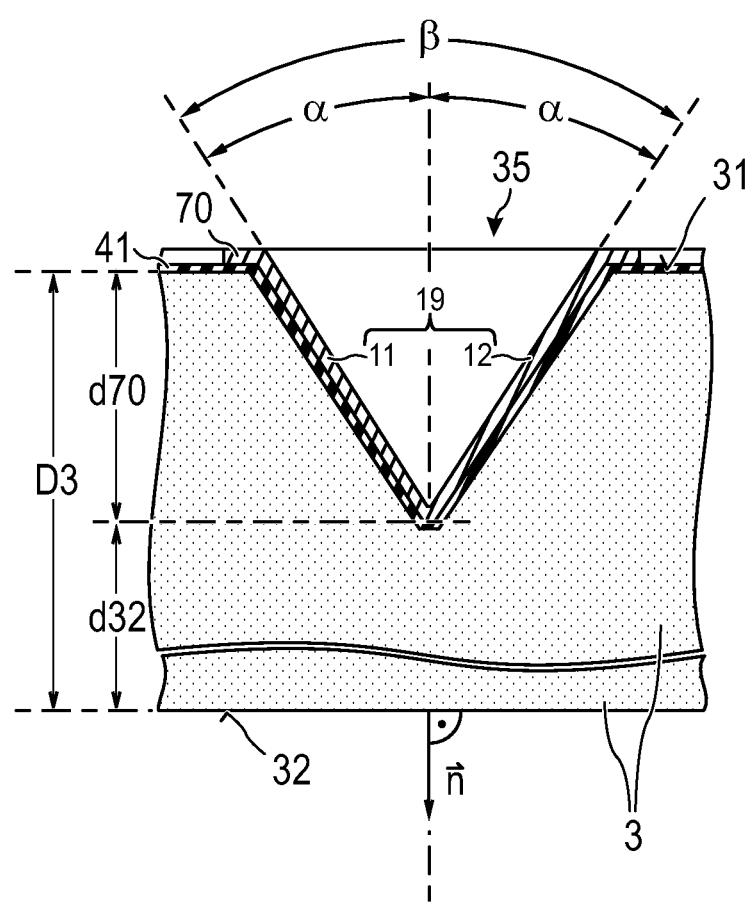
FIG. 23 is a cross-sectional view of the first coil of FIG. 22 during its production.

A further embodiment of a first coil 10 is illustrated in FIG. 21. That embodiment corresponds to the embodiment of FIG. 1 with the sole difference that there is substantially no connection section 13. That is, the sections 11 and 12 are directly connected to one another at their bottom-most ends. The completed coil 10 is illustrated in FIG. 22 which corresponds to FIG. 2. According to the cross-sectional view of FIG. 23, the sections 11 and 12 may include an angle $\beta$. Optionally, each of the sections 11 and 12 may be inclined by an angle $\alpha$ to the normal direction n of the bottom side 32. The trench 35 for producing such a coil 10 may have a triangular cross section. Such a trench 35 may advantageously be directly achieved by wet etching the semiconductor body 3 with a suitable etchant, for instance KOH (potassium hydroxide) if the semiconductor body 3 is based on silicon. In case of a coil 10 having a triangular cross-section, the angle $\beta$ may be, for instance, in the range from $-120°$ to $+120°$. In the case of KOH etching of the 100 planes in Si, the angle $\alpha$ is for example 54.7°.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor component comprising:
   a semiconductor body comprising a top side and a bottom side, the top side and the bottom side being sides of the semiconductor body with the largest areas; and
   a first coil that
   is monolithically integrated with the semiconductor body;
   comprises N first windings wherein N≥1;
   is arranged distant from the bottom side; and
   comprises a first coil axis that extends in a direction different from a surface normal of the bottom side.
2. The semiconductor component as claimed in claim 1 wherein the first coil axis runs parallel to the bottom side.
3. The semiconductor component as claimed in claim 1 wherein a continuous layer of semiconductor material is arranged between the first coil and the bottom side and wherein each straight line that runs perpendicular to the bottom side and that intersects a first winding also intersects the continuous layer.

4. The semiconductor component as claimed in claim 1 wherein
the semiconductor body comprises a first trench comprising a continuous surface that comprises doped or undoped semiconductor material; and
the first coil is at least partly arranged in the first trench.

5. The semiconductor component as claimed in claim 1 wherein
the first coil comprises at least two first windings,
wherein at least two of the first windings comprise the same shape and size.

6. The semiconductor component as claimed in claim 1 wherein each of the first windings comprises a partial winding.

7. The semiconductor component as claimed in claim 6 wherein
each of the partial windings comprises two first vertical sections and a first connection section that electrically connects the first vertical sections, wherein the two first vertical sections each extend from the first connection section toward the top side; and
the two first vertical sections comprise, in each case, an orientation non-parallel relative to the bottom side.

8. The semiconductor component as claimed in claim 6 wherein each of the partial windings comprises two first sections that include an angle between −120° and +120°.

9. The semiconductor component as claimed in claim 6 wherein each of the partial windings comprises one of the following materials:
undoped polycrystalline semiconductor material; doped polycrystalline semiconductor material; a silicide; a metal; a combination of a silicide, and a doped or undoped semiconductor material.

10. The semiconductor component as claimed in claim 1 wherein:
the first coil comprises two first windings;
each of the first windings comprises two first vertical sections and a first connection section that electrically connects the first vertical sections;
the two first vertical sections extend from the first connection section toward the top side; and
a first conductor path is arranged on the top side and electrically conductively connects the first windings.

11. The semiconductor component as claimed in claim 10 wherein the first conductor path is arranged on the top side.

12. The semiconductor component as claimed in claim 10 wherein the first conductor path consists of or comprises one of the following materials:
undoped polycrystalline semiconductor material; doped polycrystalline semiconductor material; a silicide; a metal; a combination of a silicide and a doped or undoped semiconductor material.

13. The semiconductor component as claimed in claim 1 comprising a first dielectric that electrically insulates the first coil from the semiconductor body.

14. The semiconductor component as claimed in claim 1 comprising a magnetic core that is arranged inside the first coil.

15. The semiconductor component as claimed in claim 1 comprising a second coil that is monolithically integrated with the semiconductor body that comprises K second windings, wherein K≥1, said second coil being galvanically insulated from the first coil.

16. The semiconductor component as claimed in claim 15 comprising a magnetic core that is arranged inside both the first coil and the second coil.

17. The semiconductor component as claimed in claim 15 wherein the second coil is arranged outside and adjacent to the first coil.

18. The semiconductor component as claimed in claim 15 wherein the first coil surrounds a first interior zone and the second coil surrounds a second interior zone that overlaps the first interior zone.

19. The semiconductor component as claimed in claim 1 comprising an active semiconductor region, wherein the first coil forms a detector that is able to detect the electromagnetic induction of a magnetic field caused by an electric current through the active semiconductor region.

20. The semiconductor component as claimed in claim 1 comprising a controllable semiconductor device monolithically integrated with the semiconductor body the controllable semiconductor device comprising a control electrode; a signal path formed between the first coil and the control electrode for transmitting an electrical signal from the first coil to the control electrode.

21. The semiconductor component as claimed in claim 1 wherein the first coil extends, in a direction perpendicular to the bottom side, at least 5 μm into the semiconductor body.

22. A method for producing a semiconductor component with a coil that is monolithically integrated with a semiconductor body, the method comprising:
providing a semiconductor body with a top side and with a bottom side;
producing a first trench that extends from the top side into the semiconductor body;
producing, simultaneously an electrically conductive first partial winding arranged on a surface of the first trench and comprising two top ends, and an electrically conductive second partial winding arranged on the surface of the first trench and comprising two top ends, wherein the first partial winding is electrically insulated from the second partial winding and
producing a conductor path on the top side, the conductor path electrically conductively connecting one of the first ends of the first partial winding and one of the first ends of the second partial winding.

23. The method as claimed in claim 22 comprising:
producing the first and second partial windings by depositing a conductive material on the surface of the first trench; and
structuring the conductive material thereby obtaining the first and second partial windings.

24. The method as claimed in claim 22 comprising:
producing the first and second partial windings by
depositing a seed layer on the surface of the first trench;
forming a structured mask layer comprising openings on the seed layer;
electroplating the seed layer;
removing the structured mask layer;
removing the seed layer in sections where the seed layer is not electroplated, thereby obtaining the the first and second partial windings;
filling the first trench at least partly with a dielectric; and
depositing the first conductor path on the dielectric.

25. The method as claimed in claim 22 comprising:
producing the first and second partial windings by
producing a structured seed layer on the surface of the first trench, the structured seed layer comprising sections that are arranged distant from one another;

electroless plating the sections of the seed layer, thereby obtaining the first and second partial windings, wherein the first and second partial windings are electrically insulated from one another; and filling the first trench at least partly with a dielectric; depositing the first conductor path on the dielectric.

26. The method as claimed in claim 22 comprising:

producing a structured layer of doped or undoped polycrystalline silicon on the electrically isolated or not isolated surface of the first trench, the structured layer comprising sections that are arranged distant from one another;

depositing a metal layer over the structured layer of the doped or undoped polycrystalline silicon;

annealing the metal layer and the structured layer of the doped or undoped polycrystalline silicon, thereby forming:

a silicide from the silicon and from a metal of the metal layer; and the first and second partial windings;

removing the remaining non-silicided metal layer at least partly such that the first and second partial windings are electrically insulated from one another;

filling the first trench at least partly with a dielectric; and depositing the first conductor path on the dielectric.

27. The method as claimed in claim 22 comprising:

producing a controllable semiconductor device monolithically integrated with the semiconductor body, the controllable semiconductor device comprising a control electrode arranged in a second trench or on the top side, wherein at least a part of the control electrode, at least a part of the first partial winding and at least a part of the second partial winding is formed during a common deposition process of an electrically conductive material.

* * * * *

UNITED STATES PATENT AND TRADEMARK OFFICE
CERTIFICATE OF CORRECTION

PATENT NO.        : 8,742,539 B2                                    Page 1 of 1
APPLICATION NO.   : 13/560626
DATED             : June 3, 2014
INVENTOR(S)       : J. Weyers et al.

It is certified that error appears in the above-identified patent and that said Letters Patent is hereby corrected as shown below:

Title Page, References Cited, U.S. Patent Documents (column 2, line 10) of the printed patent, "6,800,533 B1 10/2004 Tan et al" should be --6,800,533 B1 10/2004 Yeo et al--.

Signed and Sealed this
Twenty-third Day of September, 2014

Michelle K. Lee
*Deputy Director of the United States Patent and Trademark Office*